United States Patent
Lee et al.

(10) Patent No.: US 12,467,124 B2
(45) Date of Patent: Nov. 11, 2025

(54) DISPLAY APPARATUS MANUFACTURING APPARATUS AND METHOD

(71) Applicant: Samsung Display Co., Ltd., Yongin-si (KR)

(72) Inventors: Kyungjun Lee, Yongin-si (KR); Hwajung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 17/448,173

(22) Filed: Sep. 20, 2021

(65) Prior Publication Data

US 2022/0173363 A1 Jun. 2, 2022

(30) Foreign Application Priority Data

Dec. 2, 2020 (KR) ........................ 10-2020-0166926

(51) Int. Cl.
| | |
|---|---|
| *H01L 51/56* | (2006.01) |
| *C23C 14/04* | (2006.01) |
| *C23C 14/12* | (2006.01) |
| *C23C 14/24* | (2006.01) |
| *H01L 27/32* | (2006.01) |

(Continued)

(52) U.S. Cl.
CPC ............ *H10K 71/00* (2023.02); *C23C 14/042* (2013.01); *C23C 14/12* (2013.01); *C23C 14/24* (2013.01); *H10K 59/35* (2023.02); *H10K 71/164* (2023.02); *H10K 71/166* (2023.02); *H01L 23/544* (2013.01); *H01L 2223/5442* (2013.01); *H01L 2223/54426* (2013.01); *H01L 2223/54453* (2013.01); *H01L 2223/54493* (2013.01); *H10K 50/15* (2023.02); *H10K 50/156* (2023.02);

(Continued)

(58) Field of Classification Search
CPC .................................................... C23C 14/042
See application file for complete search history.

(56) References Cited

U.S. PATENT DOCUMENTS

| | | | |
|---|---|---|---|
| 9,365,923 B2 | 6/2016 | Ochi et al. | |
| 9,406,841 B2 | 8/2016 | Yamagishi et al. | |

(Continued)

FOREIGN PATENT DOCUMENTS

| | | |
|---|---|---|
| CN | 104160783 A | 11/2014 |
| CN | 104968827 A | 10/2015 |

(Continued)

OTHER PUBLICATIONS

Machine translation, Choi, Korean Pat. Pub. No. KR20170098563A, translation date: Jul. 1, 2023, Espacenet, all pages. (Year: 2023).*

(Continued)

*Primary Examiner* — Victoria K. Hall
(74) *Attorney, Agent, or Firm* — Womble Bond Dickinson (US) LLP

(57) ABSTRACT

Provided is a display apparatus manufacturing apparatus and method. A mask assembly includes a mask frame having an opening area, a first mask sheet arranged to cover a first opening area of the opening area and having a first opening portion, and a second mask sheet arranged to cover a second opening area of the opening area and having a second opening portion, wherein the first opening portion is different in size than the second opening portion.

19 Claims, 39 Drawing Sheets

(51) Int. Cl.
*H10K 59/35* (2023.01)
*H10K 71/00* (2023.01)
*H10K 71/16* (2023.01)
*H01L 23/544* (2006.01)
*H10K 50/15* (2023.01)
*H10K 50/17* (2023.01)
*H10K 59/12* (2023.01)
*H10K 102/00* (2023.01)

(52) U.S. Cl.
CPC ......... *H10K 50/17* (2023.02); *H10K 59/1201* (2023.02); *H10K 2102/351* (2023.02)

(56) References Cited

U.S. PATENT DOCUMENTS

| | | | | |
|---|---|---|---|---|
| 10,424,735 B2* | 9/2019 | Lee | ............ | C23C 14/568 |
| 10,533,245 B2* | 1/2020 | Chang | ............ | B23K 26/0661 |
| 11,538,994 B2* | 12/2022 | Ha | ............ | C23C 14/042 |
| 11,631,723 B2* | 4/2023 | Moon | ............ | H10K 71/164 |
| | | | | 257/88 |
| 2014/0374781 A1* | 12/2014 | Yamagishi | ............ | H01L 33/08 |
| | | | | 257/89 |
| 2015/0040826 A1* | 2/2015 | Jung | ............ | G03F 7/12 |
| | | | | 118/504 |
| 2015/0361546 A1* | 12/2015 | Ochi | ............ | H10K 71/164 |
| | | | | 118/721 |
| 2017/0117475 A1* | 4/2017 | Kim | ............ | C23C 14/12 |
| 2017/0133592 A1* | 5/2017 | Baek | ............ | H10K 71/00 |
| 2019/0203338 A1* | 7/2019 | Kawasaki | ............ | H10K 50/11 |
| 2020/0083451 A1* | 3/2020 | Ha | ............ | C23C 14/042 |
| 2020/0102636 A1* | 4/2020 | Lee | ............ | C23C 14/042 |
| 2020/0123644 A1* | 4/2020 | Lee | ............ | C23C 14/044 |
| 2020/0176681 A1* | 6/2020 | Ha | ............ | C23C 14/24 |
| 2020/0181754 A1* | 6/2020 | Ye | ............ | C23C 14/042 |
| 2021/0028248 A1* | 1/2021 | Kim | ............ | C23C 14/042 |
| 2021/0391541 A1* | 12/2021 | Kim | ............ | C23C 14/042 |
| 2022/0002859 A1* | 1/2022 | Luo | ............ | H10K 71/166 |
| 2022/0018011 A1* | 1/2022 | Ko | ............ | C23C 14/042 |
| 2022/0045145 A1* | 2/2022 | Lee | ............ | H10K 71/00 |
| 2022/0052127 A1* | 2/2022 | Park | ............ | H10K 59/121 |
| 2022/0165951 A1* | 5/2022 | Seo | ............ | G03F 7/0015 |
| 2022/0199905 A1* | 6/2022 | Lee | ............ | H10K 59/12 |
| 2022/0216412 A1* | 7/2022 | Zhang | ............ | H10K 71/166 |

FOREIGN PATENT DOCUMENTS

| | | | | | |
|---|---|---|---|---|---|
| CN | 111088474 | A | * | 5/2020 | ........ C23C 14/042 |
| CN | 111235524 | A | | 6/2020 | |
| CN | 112662992 | A | * | 4/2021 | ........ C23C 14/042 |
| KR | 10-2013-0043538 | A | | 4/2013 | |
| KR | 2014-0141571 | A | | 12/2014 | |
| KR | 2015-0106445 | A | | 9/2015 | |
| KR | 1020150106504 | A | * | 9/2015 | ........ C23C 14/042 |
| KR | 1020170098563 | A | * | 8/2017 | ........ A61N 5/0616 |
| KR | 10-1792659 | B1 | | 11/2017 | |
| KR | 10-2020-0030712 | A | | 3/2020 | |
| KR | 10-2020-0044261 | A | | 4/2020 | |
| KR | 10-2083947 | B1 | | 4/2020 | |
| KR | 2020-0065142 | A | | 6/2020 | |

OTHER PUBLICATIONS

Machine translation, Kim, Korean Pat. Pub. No. KR20150106504A, translation date: Sep. 10, 2023, Espacenet, all pages. (Year: 2023).*
Machine translation, Zhang, Chinese Pat. Pub. No. CN111088474A, translation date: Mar. 15, 2024, Espacent, all pages. (Year: 2024).*
Machine translation, Sugimoto, Chinese Pat. Pub. No. CN112662992A, translation date: Feb. 26, 2024, Espacenet, all pages. (Year: 2024).*
First Office Action, The State Intellectual Property Office of People's Republic of China, Chinese Pat. App. No. 202111412444.2, Apr. 29, 2025, all pages. (Year: 2025).*
First Search, The State Intellectual Property Office of People's Republic of China, Chinese Pat. App. No. 202111412444.2, Apr. 29, 2025, all pages. (Year: 2025).*
Machine translation, Lee, Korean Pat. Pub. No. KR20130043538A, translation date: Sep. 13, 2025, Espacenet, all pages. (Year: 2025).*
Korean Intellectual Property Office, Notification for Reason for Refusal (English translation), Korean Application No. 10-2020-0166926, Jul. 24, 2025, all pages. (Year: 2025).*
Korean Intellectual Property Office, Notification for Reason for Refusal (Korean language), Korean Application No. 10-2020-0166926, Jul. 24, 2025, all pages. (Year: 2025).*

* cited by examiner

DISPLAY APPARATUS MANUFACTURING APPARATUS AND METHOD

CROSS-REFERENCE TO RELATED APPLICATION

This application claims priority to and the benefit of Korean Patent Application No. 10-2020-0166926, filed on Dec. 2, 2020, the entire content of which is hereby incorporated by reference.

BACKGROUND

1. Field

One or more embodiments relate to an apparatus and method, and more particularly, to a display apparatus manufacturing apparatus and method.

2. Description of the Related Art

Electronic apparatuses based on (e.g., having) mobility have been widely utilized (e.g., used). Recently, in addition to small electronic apparatuses such as mobile phones, tablet personal computers (PCs) have been widely utilized (e.g., used) as mobile electronic apparatuses.

Such mobile electronic apparatuses include a display apparatus to provide visual information such as images and/or videos to a user in order to support various suitable functions. Recently, as other components for driving a display apparatus have been miniaturized, the proportion of an electronic apparatus occupied by a display unit has increased gradually and a structure capable of being bent from a flat state to have a certain angle has also been developed.

Also, such a display apparatus may be utilized (e.g., used) in the beauty market and/or the medical market. In this case, the display apparatus may emit one type (e.g., color) of light to the outside.

In the case of display apparatuses implementing various suitable functions as described above, a manufacturing process may be complicated and a manufacturing time may increase because they are manufactured by utilizing (e.g., using) different methods and apparatuses depending on their types (e.g., kinds).

SUMMARY

In general, a display apparatus having a purpose should be separately manufactured because it has a different structure than a display apparatus having another purpose. In this case, a lot of substrates may be required in a manufacturing process. Also, a manufacturing apparatus should be separately manufactured in order to manufacture a display apparatus suitable for a purpose. One or more embodiments include a display apparatus manufacturing apparatus and method capable of simultaneously or concurrently manufacturing display apparatuses having various suitable purposes.

Additional aspects will be set forth in part in the description which follows and, in part, will be apparent from the description, or may be learned by practice of the presented embodiments.

According to one or more embodiments, a mask assembly includes a mask frame having an opening area, a first mask sheet arranged to cover a first opening area of the opening area and having a first opening portion, and a second mask sheet arranged to cover a second opening area of the opening area and having a second opening portion, wherein the first opening portion is different in size than the second opening portion.

In the present embodiments, the mask assembly may include a stick arranged at the mask frame to divide the second opening area into a plurality (e.g., at least two) third opening areas.

In the present embodiments, the stick may include a first stick extending in a first direction and a second stick extending in a second direction and coupled (e.g., connected) to the first stick.

In present embodiments, the second stick may include a plurality of second sticks, and one of the plurality of second sticks may be different than another of the plurality of second sticks.

In present embodiments, the second stick may include a plurality of second sticks, and the plurality of second sticks may be arranged to be symmetrical (e.g., reflectively symmetrical) to each other with respect to one of the plurality of second sticks.

In present embodiments, the first stick may include a coupling unit into which a coupling member coupling with an end of the second stick is inserted.

In present embodiments, the mask frame may include a frame coupling unit into which a coupling member coupling with an end of the stick is inserted.

In present embodiments, a cross-sectional shape of the stick normal (e.g., perpendicular) to a lengthwise direction of the stick may be triangular.

According to one or more embodiments, a mask assembly includes a mask frame having an opening area, a first mask sheet arranged to cover a first opening area of the opening area and having a first opening portion, and a second mask sheet arranged to cover a second opening area of the opening area.

According to one or more embodiments, a mask assembly includes a mask frame having an opening area, and a plurality of mask sheets arranged to cover the opening area and having a first opening portion and a second opening portion, wherein the first opening portion is different in size than the second opening portion.

In present embodiments, the first opening portions of adjacent mask sheets of the plurality of mask sheets may be arranged at same portions of the adjacent mask sheets.

In present embodiments, the first opening portions of adjacent mask sheets of the plurality of mask sheets may be arranged at different portions of the adjacent mask sheets.

According to one or more embodiments, a display apparatus manufacturing apparatus includes a mask assembly, and a deposition source arranged to face the mask assembly to supply a deposition material to a display substrate.

According to one or more embodiments, a display apparatus manufacturing method includes arranging a display substrate and a mask assembly; aligning the display substrate and the mask assembly; and depositing a deposition material through a first opening portion of the mask assembly onto a first plane area arranged in a first area of the display substrate and through a second opening portion of the mask assembly onto a second plane area arranged in a second area of the display substrate, or depositing the deposition material onto (e.g., only onto) the first area and not the second area, wherein the first plane area is different in area than the second plane area.

In present embodiments, the display apparatus manufacturing method may further include depositing the deposition material onto the display substrate after moving one selected from the display substrate and the mask assembly in one direction with respect to the other of the display substrate and the mask assembly.

In the present embodiments, the display apparatus manufacturing method may further include blocking the deposition material from being deposited onto the second area when the deposition material is deposited onto the first area.

In the present embodiments, the display apparatus manufacturing method may further include forming an emission layer to emit at least two colors, in the first area and forming an emission layer to emit a single color, in the second area.

In present embodiments, the mask assembly may include a mask frame and a mask sheet arranged at the mask frame.

In the present embodiments, the mask sheet may include a plurality of mask sheets, and the one of the plurality of mask sheets having the first opening portion may be arranged to be adjacent to the one of the plurality of mask sheets having the second opening portion.

In present embodiments, the first opening portion and the second opening portion may be arranged at (e.g., in) a same mask sheet.

In present embodiments, the mask assembly may further include a stick arranged at the mask frame to divide an opening area of the mask frame into a plurality of (e.g., at least two) opening areas.

In the present embodiments, the stick may include a first stick extending in a first direction and a second stick extending in a second direction and coupled (e.g., connected) to the first stick.

In present embodiments, a cross-sectional shape of the stick normal (e.g., perpendicular) to a lengthwise direction of the stick may be triangular.

Other aspects and features other than those described above will become apparent from the accompanying drawings, the appended claims, and the detailed description of the disclosure.

These general and particular aspects may be implemented by utilizing (e.g., using) systems, methods, computer programs, or any combinations of systems, methods, and computer programs.

BRIEF DESCRIPTION OF THE DRAWINGS

The above and other aspects and features of certain embodiments will be more apparent from the following description taken in conjunction with the accompanying drawings, in which.

DETAILED DESCRIPTION

Figure 1:
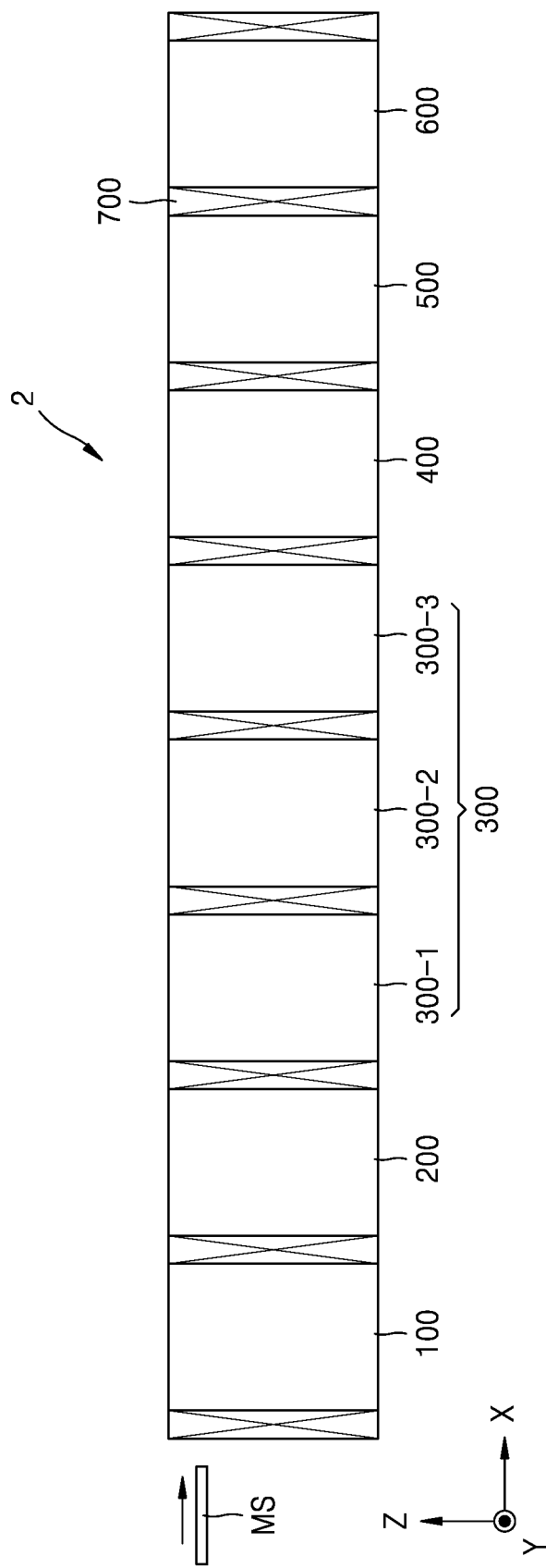
FIG. 1 is a plan view illustrating a display apparatus manufacturing apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the use of the term "may," when describing embodiments of the present disclosure, refers to "one or more embodiments of the present disclosure." As used herein, the terms "substantially," "about," "approximately," and similar terms are used as terms of approximation and not as terms of degree, and are intended to account for the inherent deviations in measured or calculated values that would be recognized by those of ordinary skill in the art.

The disclosure may include various suitable embodiments and modifications, and certain embodiments thereof are illustrated in the drawings and will be described herein in more detail. The aspects and features of the disclosure and the accomplishing methods thereof will become apparent from the embodiments described below in more detail with reference to the accompanying drawings. However, the disclosure is not limited to the embodiments described below and may be embodied in various suitable modes.

Hereinafter, embodiments will be described in more detail with reference to the accompanying drawings, and in the following description, like reference numerals will denote like elements and redundant descriptions thereof may not be provided for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings may be exaggeratedly illustrated for convenience of description, the disclosure is not limited thereto.

Also, herein, the X axis, the Y axis, and the Z axis are not limited to three axes of the rectangular coordinate system and may be interpreted in a broader sense. For example, the X axis, the Y axis, and the Z axis may be perpendicular to one another or may represent different directions that are not perpendicular to one another.

When a certain embodiment may be implemented differently, a particular or described process order may be performed differently from the described order. For example, two consecutively described processes may be performed substantially at the same time or may be performed in an order opposite to the described order.

FIG. 1 is a plan view illustrating a display apparatus manufacturing apparatus according to an embodiment.

Referring to FIG. 1, a display apparatus manufacturing apparatus 2 may include a loading unit 100, a first deposition unit 200, a second deposition unit 300, a third deposition unit 400, an unloading unit 600, and an opening/closing unit 700.

The loading unit 100 may transfer a process substrate MS to the first deposition unit 200 after the process substrate MS enters from the outside. In this case, a robot arm and/or the like may be arranged inside and/or outside the loading unit 100 to move the process substrate MS.

The first deposition unit 200 may form a lower auxiliary layer described below, over the process substrate MS supplied to the loading unit 100. In this case, the first deposition unit 200 may form the lower auxiliary layer in (e.g., having) different patterns at at least two portions of the process substrate MS.

The second deposition unit 300 may include a (2-1)th deposition unit 300-1, a (2-2)th deposition unit 300-2, and a (2-3)th deposition unit 300-3. In this case, the (2-1)th deposition unit 300-1, the (2-2)th deposition unit 300-2, and the (2-3)th deposition unit 300-3 may form different organic emission layers respectively. For example, one selected from the (2-1)th deposition unit 300-1, the (2-2)th deposition unit 300-2, and the (2-3)th deposition unit 300-3 may form an organic emission layer to emit one selected from red, green, and blue colors, over the process substrate MS. Another selected from the (2-1)th deposition unit 300-1, the (2-2)th deposition unit 300-2, and the (2-3)th deposition unit 300-3 may form an organic emission layer to emit another selected from red, green, and blue colors, over the process substrate MS. The other (e.g., the remaining one) selected from the (2-1)th deposition unit 300-1, the (2-2)th deposition unit 300-2, and the (2-3)th deposition unit 300-3 may form an organic emission layer to emit the other (e.g., the remaining one) selected from red, green, and blue colors, over the process substrate MS. In the above case, the organic emission layers formed by the (2-1)th deposition unit 300-1, the (2-2)th deposition unit 300-2, and the (2-3)th deposition unit 300-3 may be arranged at different portions of the process substrate MS, respectively. Hereinafter, for convenience of description, a more detailed description will be mainly given of a case where the (2-1)th deposition unit 300-1 forms an organic emission layer to emit a red color, over the process substrate MS, the (2-2)th deposition unit 300-2 forms an organic emission layer to emit a green color, over the process substrate MS, and the (2-3)th deposition unit 300-3 forms an organic emission layer to emit a blue color, over the process substrate MS.

The third deposition unit 400 may form an upper auxiliary layer over the organic emission layer. The third deposition unit 400 may receive the process substrate MS from the second deposition unit 300.

The unloading unit 600 may temporarily store the process substrate MS after completion of the deposition by the third deposition unit 400 and then carry the process substrate MS to the outside of the unloading unit 600. In this case, a robot arm and/or the like may be arranged inside and/or outside the unloading unit 600.

The opening/closing unit 700 may be arranged between the loading unit 100 and the first deposition unit 200, between the respective deposition units (e.g., the first deposition unit, the (2-1)th deposition unit 300-1, the (2-2)th deposition unit 300-2, the (2-3)th deposition unit 300-3, and the third deposition unit 400), and between the third deposition unit 400 and the unloading unit 600 described above. In this case, the opening/closing unit 700 may include a gate valve. In this case, the opening/closing unit 700 may selectively open or close between the loading unit 100 and the first deposition unit 200, between the respective deposition units, and between the third deposition unit 400 and the unloading unit 600.

In the display apparatus manufacturing apparatus 2 described above, each of the loading unit 100, the respective deposition units, and the unloading unit 600 may be provided with a pressure adjuster capable of adjusting the internal pressure of each of the loading unit 100, the respective deposition units, and the unloading unit 600, respectively. Also, the first deposition unit 200 may be provided as a plurality of first deposition units 200, and the second deposition unit 300 may be provided as a plurality of second deposition units 300. In some embodiments, the third deposition unit 400 may be provided as a plurality of third deposition units 400. In this case, the lower auxiliary layer may be formed as a plurality of layers, and each lower auxiliary layer may be formed by a corresponding first deposition unit 200. Also, the upper auxiliary layer may be formed as a plurality of layers, and each upper auxiliary layer may be formed by a corresponding third deposition unit 400. However, hereinafter, for convenience of description, a more detailed description will be mainly given of a case where only one first deposition unit 200 and only one second deposition unit 300 are provided.

Moreover, the display apparatus manufacturing apparatus 2 may further include a fourth deposition unit 500 arranged between the third deposition unit 400 and the unloading unit 600. In this case, the fourth deposition unit 500 may form an opposite electrode on (e.g., over) the upper auxiliary layer. In other embodiments, the fourth deposition unit 500 may be coupled (e.g., connected) to the unloading unit 600 to receive the process substrate MS carried out from the unloading unit 600, to form an opposite electrode over the process substrate MS. Hereinafter, for convenience of description, a more detailed description will be given mainly of a case where the fourth deposition unit 500 is coupled (e.g., connected) to the third deposition unit 400.

Also, the display apparatus manufacturing apparatus 2 may further include a fifth deposition unit coupled (e.g., connected) to the fourth deposition unit 500 to form a protection layer over the opposite electrode. In this case, the fifth deposition unit may be arranged between the fourth deposition unit 500 and the unloading unit 600. In other embodiments, the fifth deposition unit may be coupled (e.g., connected) to the unloading unit 600 to form a protection layer over the process substrate MS carried out from the unloading unit 600. Hereinafter, for convenience of description, a more detailed description will be mainly given of a case where the fifth deposition unit is arranged outside the unloading unit 600 and is coupled (e.g., connected) to the unloading unit 600.

The display apparatus manufacturing apparatus 2 described above may further include a shuttle for moving the process substrate MS through the loading unit 100, each deposition unit, and the unloading unit 600.

In this case, the shuttle may include an electrostatic chuck or an adhesive chuck for fixing the process substrate MS (e.g., fixing the process substrate MS to the shuttle). Also, the shuttle may move by being arranged contactlessly over a rail having a magnetic levitation structure. The rail may be arranged at the loading unit 100, each deposition unit, and the unloading unit 600 to guide the movement of the shuttle.

Moreover, as for the operation of the display apparatus manufacturing apparatus 2 described above, when the process substrate MS is supplied from the outside of the loading unit 100 to the loading unit 100, the loading unit 100 may fix the process substrate MS to the shuttle.

Thereafter, the shuttle may move the process substrate MS from the loading unit 100 to the first deposition unit 200, and the first deposition unit 200 may form a lower auxiliary layer. Also, the second deposition unit 300 may form an organic emission layer over the lower auxiliary layer. In this case, the (2-1)th deposition unit 300-1, the (2-2)th deposition unit 300-2, and the (2-3)th deposition unit 300-3 may form different organic emission layers. In this case, organic emission layers of three colors may be formed at a portion of the process substrate MS to be apart from each other (e.g., spaced apart from each other in a plan view), and organic emission layers of one color may be formed at another portion of the process substrate MS to be apart from each other (e.g., spaced apart from each other in a plan view). For example, pixels to emit three colors may be formed at a portion of the process substrate MS, whereas pixels to emit only one color may be formed at a portion of the process substrate MS. For example, the pixels to emit only one color and the pixels to emit three colors may be formed at different portions on the process substrate. This will be described below in more detail.

When the organic emission layer is formed as described above, an upper auxiliary layer may be formed over the organic emission layer. In this case, when the deposition is completed in the (2-3)th deposition unit 300-3, the process substrate MS may be transferred to the third deposition unit 400.

When the upper auxiliary layer is formed, the shuttle may transfer the process substrate MS from the third deposition unit 400 to the fourth deposition unit 500 to form an opposite electrode. Also, after the opposite electrode is formed, the shuttle may transfer the process substrate MS from the fourth deposition unit 500 to the unloading unit 600. The process substrate MS carried out from the unloading unit 600 may be transferred to the fifth deposition unit, and the fifth deposition unit may form a protection layer over the opposite electrode. Thereafter, an inorganic layer and an organic layer may be stacked over the protection layer to form a thin film encapsulation layer.

In the above case, at least one selected from the lower auxiliary layer, the organic emission layer, and the upper auxiliary layer may be formed in a different shape in one area of the process substrate MS than in other areas of the process substrate MS. For example, the display apparatus manufacturing apparatus 2 may perform the deposition such that the area of the plane shape (planar shape) of at least one selected from the lower auxiliary layer, the organic emission layer, and the upper auxiliary layer may be different in one area of the process substrate MS than in other areas of the process substrate MS.

Thus, the display apparatus manufacturing apparatus 2 may form various suitable types (e.g., kinds) of display apparatuses on the process substrate MS by depositing a deposition material in different patterns on the process substrate MS.

Figure 2:
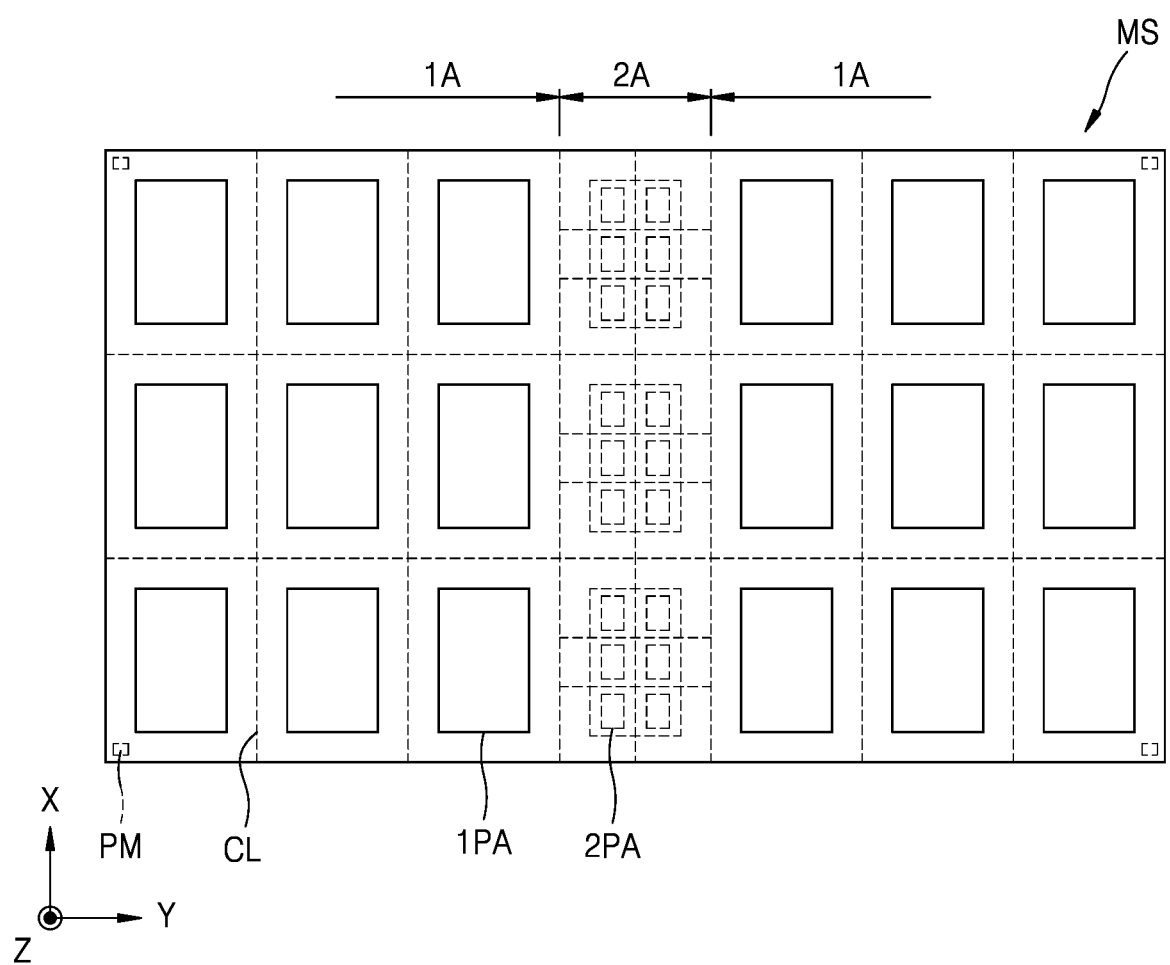
FIG. 2 is a plan view illustrating a process substrate utilized in FIG. 1.

FIG. 2 is a plan view illustrating a process substrate utilized (e.g., used) in FIG. 1.

Referring to FIG. 2, the process substrate MS may be utilized (e.g., used) to manufacture various suitable types (e.g., kinds) of display apparatuses over a substrate. In this case, the process substrate MS may include a first area 1A and a second area 2A. Pixels to emit light of different colors may be arranged in the first area 1A, and pixels (e.g., only pixels) to emit light of one color (e.g., only one color) may be arranged in the second area 2A. In this case, at least one first plane area 1PA may be arranged in the first area 1A, and at least one second plane area 2PA may be arranged in the second area 2A. One first plane area 1PA described above may form one display apparatus later. Also, one second plane area 2PA may form one display apparatus later. For example, the display apparatus manufacturing apparatus 2 may be used to form a plurality of joined display apparatuses at (e.g., on) the process substrate MS, and the plurality of joined display apparatuses may then be separated into a plurality of individual (e.g., separated) display apparatuses. In the above case, a cutting line CL for separating the display apparatuses formed later from each other may be arranged between the first plane area 1PA and the second plane area 2PA adjacent to each other. Also, when a plurality of first plane areas 1PA are provided, a cutting line CL may also be arranged between the first plane areas 1PA adjacent to each other. Also, when a plurality of second plane areas 2PA are provided, a cutting line CL may be arranged between the second plane areas 2PA adjacent to each other.

In the above case, after or during the display apparatus manufacturing process, the process substrate MS may be divided into at least two (e.g., two portions) by the cutting line CL.

In each first plane area 1PA described above, a plurality of pixels may be arranged apart (e.g., spaced apart in a plan view) from each other. Also, in each second plane area 2PA, a plurality of pixels may be arranged apart (e.g., spaced apart in a plan view) from each other. In this case, as described above, pixels respectively emitting three colors are arranged apart from each other in each first plane area 1PA, and pixels emitting the same color may be arranged apart from each other in each second plane area 2PA.

Figure 3:
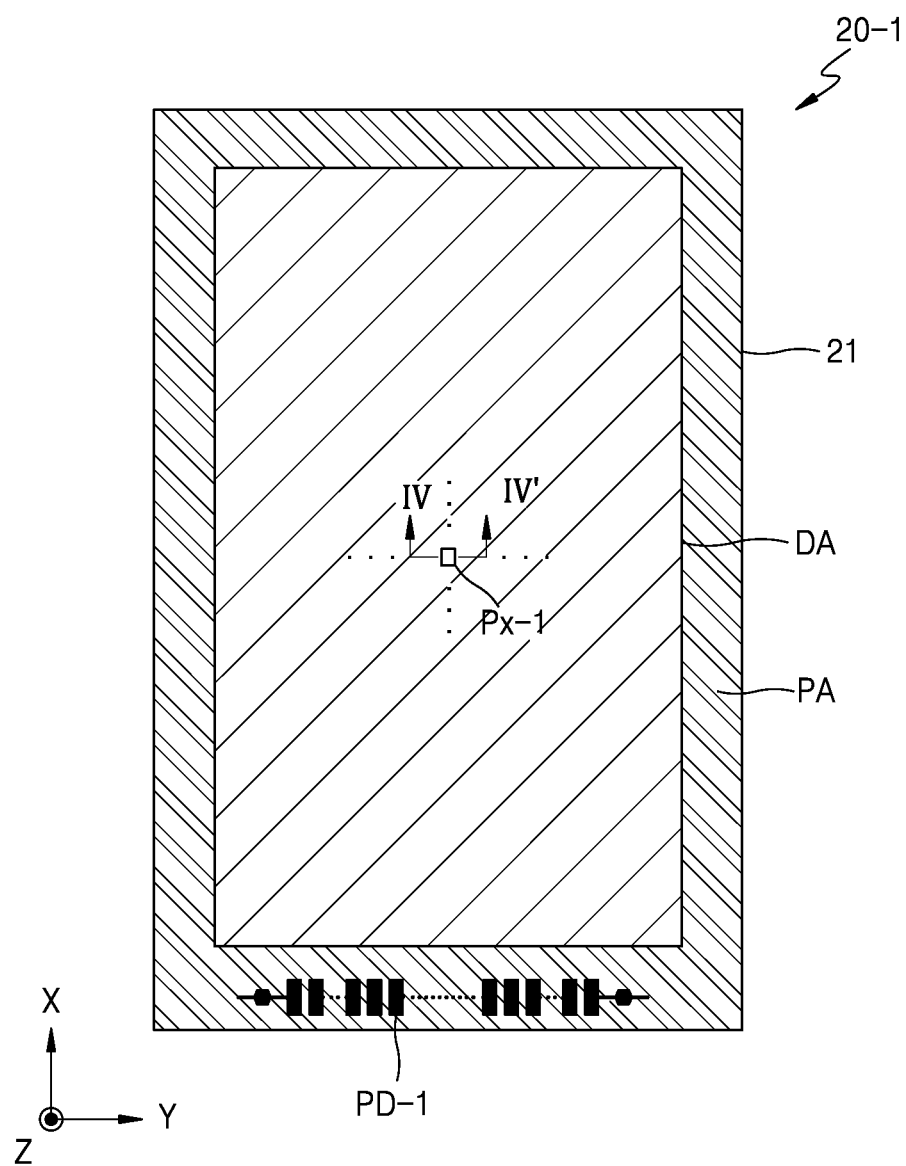
FIG. 3 is a plan view illustrating a display apparatus according to an embodiment.
Figure 4:
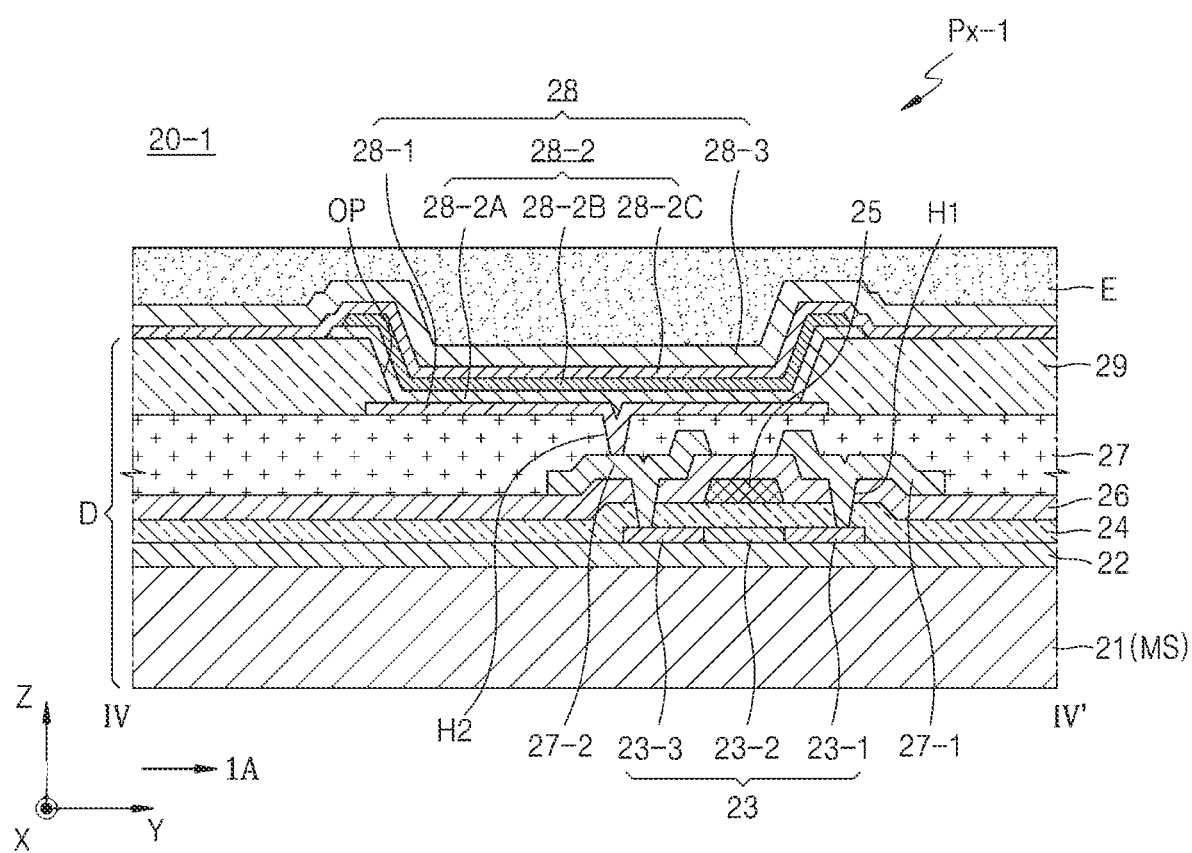
FIG. 4 is a cross-sectional view illustrating a cross-section of a pixel of FIG. 3.

FIG. 3 is a plan view illustrating a display apparatus according to an embodiment. FIG. 4 is a cross-sectional view illustrating a cross-section of a pixel of FIG. 3.

Referring to FIGS. 3 and 4, a display apparatus 20-1 may have (e.g., be defined by) a display area DA over a substrate 21 and a peripheral area PA around (e.g., surrounding) the display area DA. A light emitting unit may be arranged in the display area DA, and a power line and/or the like may be arranged in the peripheral area PA, which may be an area that does not emit light. Also, a pad unit PD-1 may be arranged in the peripheral area PA.

In this case, the display area DA may have various suitable shapes. For example, the display area DA may have a substantially rectangular, square, or circular shape. In addition, the display area DA may have atypical shapes other than a substantially rectangular, square, polygonal, or circular shape. However, hereinafter, for convenience of description, a more detailed description will be given mainly of a case where the display area DA has a rectangular shape.

The display apparatus 20-1 may include a display substrate D and an encapsulation member. In this case, the display substrate D may include a substrate 21, a thin film transistor TFT, a passivation layer 27, and a pixel electrode 28-1. In other embodiments, the display substrate D may include some of a substrate 21, a thin film transistor TFT, a passivation layer 27, a pixel electrode 28-1, and an intermediate layer 28-2.

The substrate 21 may include (e.g., be) a plastic material and/or may include (e.g., be) a metal material such as stainless use steel (SUS) and/or titanium (Ti). Also, the substrate 21 may include (e.g., be) a polymer resin such as polyether sulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 may have a single-layer or multiple-layer structure of the above materials and may further include an inorganic layer in the case of having a multiple-layer structure. Hereinafter, for convenience of description, a more detailed description will be given mainly of a case where the substrate 21 includes (e.g., is) polyimide.

A thin film transistor TFT may be formed over the substrate 21, a passivation layer 27 may be formed to cover the thin film transistor TFT, and an organic light emitting device 28 may be formed over the passivation layer 27.

A buffer layer 22 including (e.g., being) an organic compound and/or an inorganic compound may be further formed on an upper surface of the substrate 21 and may include $SiO_x$ ($x \geq 1$) or $SiN_x$ ($x \geq 1$).

An active layer 23 arranged in a certain pattern may be formed over the buffer layer 22, and then the active layer 23 may be buried by a gate insulating layer 24. For example, the gate insulating layer 24 may be on the active layer 23 and may cover the active layer 23. The active layer 23 may include a source area 23-1 and a drain area 23-3 and may further include a channel area 23-2 therebetween.

The active layer 23 may be formed to include (e.g., be) various suitable materials. For example, the active layer 23 may include (e.g., be) an inorganic semiconductor material such as amorphous silicon and/or crystalline silicon. As another example, the active layer 23 may include an oxide semiconductor. As another example, the active layer 23 may include (e.g., be) an organic semiconductor material. Hereinafter, for convenience of description, a more detailed description will be given mainly of a case where the active layer 23 includes (e.g., is formed from) amorphous silicon.

The active layer 23 may be formed by forming an amorphous silicon layer over the buffer layer 22, crystallizing the amorphous silicon layer into a polycrystalline silicon layer, and patterning the polycrystalline silicon layer. In the active layer 23, the source area 23-1 and the drain area 23-3 may be doped with impurities according to the type (e.g., kind) of a TFT, such as a driving TFT or a switching TFT.

A gate electrode 25 corresponding to (e.g., overlapping in a plan view) the active layer 23 and an interlayer insulating layer 26 covering (e.g., burying) the gate electrode 25 may be formed on an upper surface of the gate insulating layer 24.

Also, a contact hole H1 may be formed in the interlayer insulating layer 26 and the gate insulating layer 24, and then a source electrode 27-1 and a drain electrode 27-2 may be formed over the interlayer insulating layer 26 to respectively contact the source area 23-1 and the drain area 23-3. For example, the source electrode 27-1 and the drain electrode 27-2 may respectively contact the source area 23-1 and the drain area 23-3 through the contact holes H1.

A passivation layer 27 may be formed over the thin film transistor TFT formed as such, and a pixel electrode 28-1 of an organic light emitting device (OLED) 28 may be formed over the passivation layer 27. The pixel electrode 28-1 may contact the drain electrode 27-2 of the TFT through a via hole H2 formed in the passivation layer 27. The passivation layer 27 may be formed of an inorganic material and/or an organic material as a single layer or as two or more layers, and the passivation layer 27 may be formed as a planarization layer to have an upper surface that is flat regardless of the curvature of a lower layer thereunder or may be formed to have a curvature along the curvature of a layer thereunder.

Also, the passivation layer 27 may be formed of a transparent insulator to achieve a resonance effect.

After the pixel electrode 28-1 is formed over the passivation layer 27, a pixel definition layer 29 may be formed of an organic material and/or an inorganic material to cover the pixel electrode 28-1 and the passivation layer 27 and the pixel definition layer 29 may be opened to expose the pixel electrode 28-1. For example, the pixel definition layer 29 may cover a side of the pixel electrode 28-1, and the pixel definition layer 29 may expose a portion (e.g., center portion) of the pixel electrode 28-1.

Also, an intermediate layer 28-2 and an opposite electrode 28-3 may be formed over at least the pixel electrode 28-1. In other embodiments, the opposite electrode 28-3 may be formed over the entire surface of the display substrate D. In this case, the opposite electrode 28-3 may be formed over the intermediate layer 28-2 and the pixel definition layer 29. Hereinafter, for convenience of description, a more detailed description will be given mainly of a case where the opposite electrode 28-3 is formed over the intermediate layer 28-2 and the pixel definition layer 29.

The pixel electrode 28-1 may function as an anode electrode and the opposite electrode 28-3 may function as a cathode electrode, or the polarities of the pixel electrode 28-1 and the opposite electrode 28-3 may be reversed.

The pixel electrode 28-1 and the opposite electrode 28-3 may be insulated from each other by the intermediate layer 28-2, and light may be emitted from an organic emission layer by applying voltages of different polarities to the intermediate layer 28-2.

The intermediate layer 28-2 may include an organic emission layer 28-2B. As another example, the intermediate layer 28-2 may include an organic emission layer and may further include a lower auxiliary layer 28-2A including at least one selected from a hole injection layer (HIL) and a hole transport layer, and an upper auxiliary layer 28-2C including at least one selected from an electron transport layer and an electron injection layer.

The intermediate layer 28-2 described above may be provided as a plurality of intermediate layers 28-2, and the plurality of intermediate layers 28-2 may form the display area DA. In this case, the plurality of intermediate layers 28-2 may be arranged apart (e.g., spaced apart in a plan view) from each other in the display area DA. The intermediate layer 28-2 may emit various suitable colors depending on the organic emission layer included therein. Hereinafter, for convenience of description, a more detailed description will be given mainly of a case where the intermediate layer 28-2 includes (e.g., is) an organic emission layer.

Moreover, one unit pixel group may include a plurality of pixels Px-1. The plurality of pixels Px-1 may emit light of various suitable colors. In an embodiment, one pixel Px-1 may be defined as an area emitting light having one color. In other embodiments, one pixel Px-1 may be defined as a portion of the pixel electrode 28-1 exposed to the outside through an opening area OP of the pixel definition layer 29. In this case, adjusting the size of one pixel Px-1 may be achieved by adjusting the area of the portion of the pixel electrode 28-1 exposed to the outside by adjusting the size of the opening area OP of the pixel definition layer 29 in the plan view. However, hereinafter, for convenience of description, a more detailed description will be given mainly of a case where one pixel Px-1 is an area to emit light having one color.

The pixel group described above may include pixels Px-1 respectively to emit red, green, and blue lights. In other embodiments, the pixel group may include pixels Px-1 respectively to emit red, green, blue, and white lights. In other embodiments, the pixel group may include pixels Px-1 respectively to emit red, yellow, and blue lights. In this case, the pixel group is not limited thereto and may include any case including pixels Px-1 to emit different colors. However, hereinafter, for convenience of description, a more detailed description will be given mainly of a case where the pixel group includes pixels respectively to emit red, green, and blue lights.

The pixel Px-1 described above may emit various suitable colors depending on the organic emission layer of the intermediate layer 28-2 arranged in the pixel Px-1.

Moreover, an encapsulation member may be arranged over the opposite electrode 28-3 to seal the organic light emitting device 28. In this case, the encapsulation member may be formed in various suitable shapes. For example, the encapsulation member may include an encapsulation substrate facing (e.g., overlapping) a substrate and a sealing member arranged between the encapsulation substrate and the substrate. In other embodiments, the encapsulation member may include a thin film encapsulation layer E arranged over the opposite electrode 28-3. Hereinafter, for convenience of description, a more detailed description will be given mainly of a case where the encapsulation member includes a thin film encapsulation layer E.

The thin film encapsulation layer E may include a plurality of inorganic layers or may include an inorganic layer and an organic layer.

The organic layer of the thin film encapsulation layer E may include (e.g., be) a polymer and may include (e.g., be) polyethyleneterephthalate, polyethylenenaphthalate, polycarbonate, polyimide, polyethylenesulfonate, polyoxymethylene, polyarylate, hexamethyldisiloxane, acrylic resin (e.g., polymethylmethacrylate and/or polyacrylic acid), or any combination thereof.

The inorganic layer of the thin film encapsulation layer E may include a single layer or a stacked layer including (e.g., being) a metal oxide and/or a metal nitride. For example, the inorganic layer may include (e.g., be) $SiN_x$, $Al_2O_3$, $SiO_2$, and/or $TiO_2$.

The top layer of the thin film encapsulation layer E exposed to the outside may be formed as an inorganic layer to prevent or block moisture penetration into the organic light emitting device.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer sequentially (e.g., sequentially stacked) from the top of the organic light emitting device OLED.

As another example, the thin film encapsulation layer E may include a first inorganic layer, a first organic layer, a second inorganic layer, a second organic layer, and a third inorganic layer sequentially (e.g., sequentially stacked) from the top of the organic light emitting device OLED.

As another example, the thin film encapsulation layer E may include a first inorganic layer, a first organic layer, a second inorganic layer, a second organic layer, a third inorganic layer, a third organic layer, and a fourth inorganic layer sequentially (e.g., sequentially stacked) from the top of the organic light emitting device OLED.

A metal halide layer including (e.g., being) LiF may be additionally included between the organic light emitting device OLED and the first inorganic layer. For example, the metal halide layer may be between the opposite electrode 28-3 of the organic light emitting device 28 and the bottommost inorganic layer of the thin film encapsulation layer E. The metal halide layer may prevent the organic light emitting device OLED from being damaged, or may reduce the occurrence and/or extent of such damage, when the first inorganic layer is formed by sputtering.

The first organic layer may have a smaller area than the second inorganic layer, and the second organic layer may also have a smaller area than the third inorganic layer.

When a plurality of inorganic layers are provided as above, the inorganic layers may be deposited to directly contact each other in an edge area of the display apparatus 20-1 and the organic layer may not be exposed to the outside. For example, the inorganic layers may encapsulate the organic layers.

Also, the display apparatus 20-1 may implement a precise image through each pixel Px-1.

Hereinafter, an organic light emitting display apparatus will be described as an example of the display apparatus 20-1 according to an embodiment; however, the display apparatus of the disclosure is not limited thereto. In other embodiments, various suitable types (e.g., kinds) of display apparatuses such as inorganic EL displays (inorganic light emitting displays) and quantum dot light emitting displays may be utilized (e.g., used).

Figure 5:
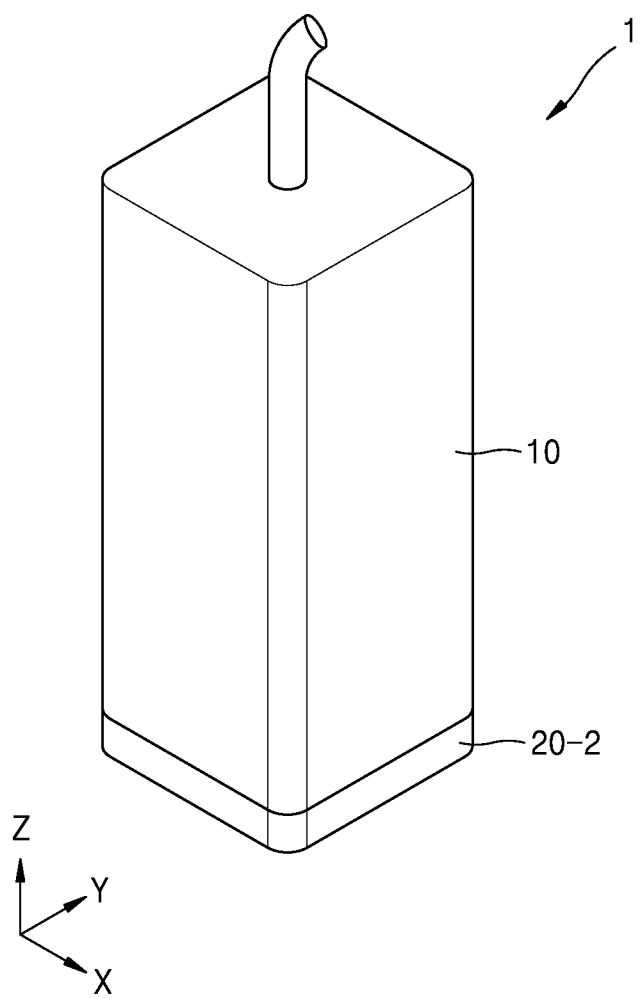
FIG. 5 is a perspective view illustrating a light irradiation apparatus according to an embodiment.

FIG. 5 is a perspective view illustrating a light irradiation apparatus according to an embodiment.

Referring to FIG. 5, a light irradiation apparatus 1 may include a body unit 10 and a display apparatus 20-2. The body unit 10 may include an internal space formed therein, and various suitable devices may be arranged in the internal space of the body unit 10. For example, a control unit for controlling the display apparatus 20-2, a power supply unit coupled (e.g., connected) to the control unit, and the like may be arranged inside the body unit 10. In this case, the power supply unit may be of various suitable types (e.g., kinds). For example, the power supply unit may include a primary battery that may be fastened to the body unit 10 and may be replaceable. In other embodiments, the power supply unit may include a battery such as a secondary battery that is rechargeable and arranged at the body unit 10. In other embodiments, the power supply unit may include a device that is coupled (e.g., connected) to the outside by a cable. In the above case, when the power supply unit includes a primary battery or a battery (e.g., a secondary battery), the light irradiation apparatus 1 may be portable. The body unit 10 described above may be separately coupled (e.g., connected) to the outside through a cable or the like. The cable may be detachably coupled (e.g., connected) to the body unit 10. In this case, various suitable information may be input from the outside through the cable. In other embodiments, the body unit 10 may include a wireless communication module therein. In this case, the light irradiation apparatus 1 may be coupled (e.g., connected) to an external device through wireless communication to exchange information with the external device.

The display apparatus 20-2 may be coupled (e.g., connected) to the body unit 10. In this case, the display apparatus 20-2 may emit light to the outside of the body unit 10. In this case, the display apparatus 20-2 may emit light having at least two wavelengths. For example, the display apparatus 20-2 may emit at least two lights having the same color and different wavelengths. For example, the display apparatus 20-2 may emit at least two lights having a red color and different wavelengths. In other embodiments, the display apparatus 20-2 may emit at least two lights having a blue color and different wavelengths. In other embodiments, the display apparatus 20-2 may emit at least two lights having a green color and different wavelengths. In other embodiments, the display apparatus 20-2 may emit at least two lights having a white color and different wavelengths. In this case, the display apparatus 20-2 may include a plurality of pixels, and the plurality of pixels may emit light of the same color.

Hereinafter, the display apparatus 20-2 will be described in more detail.

Figure 6:
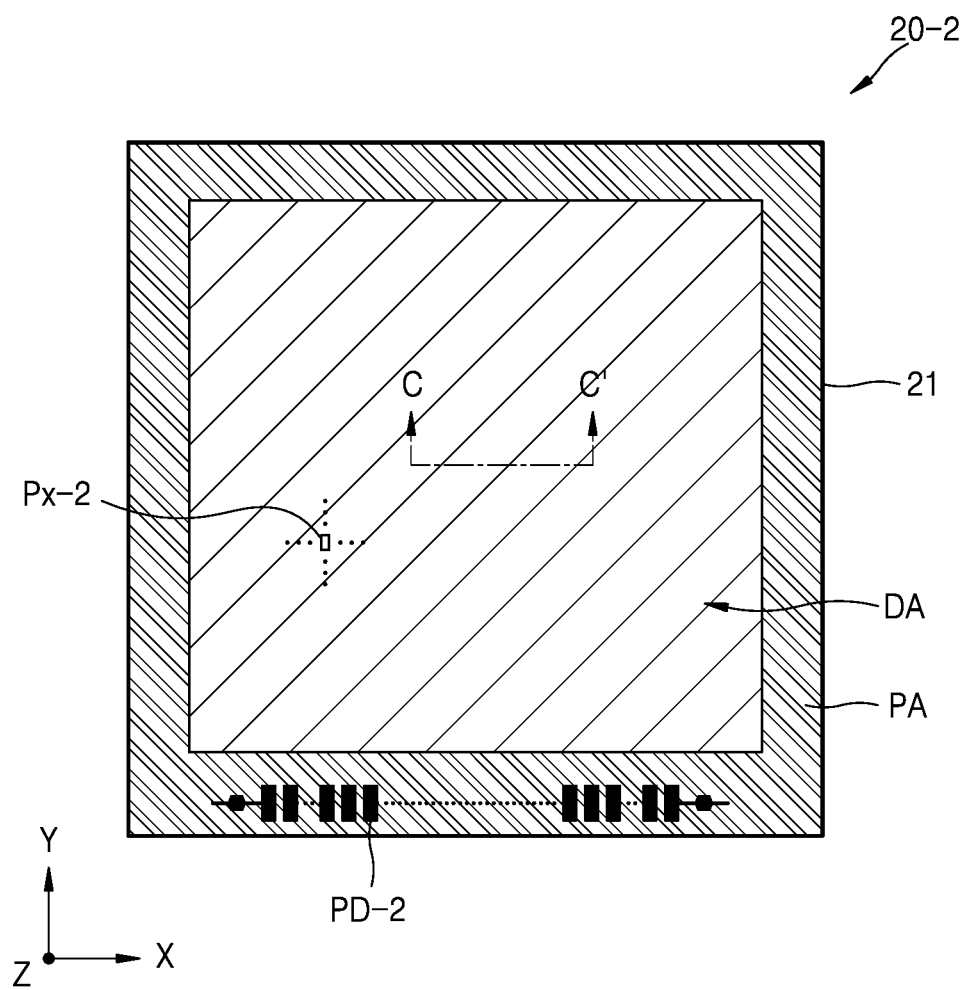
FIG. 6 is a plan view illustrating a display apparatus illustrated in FIG. 5.
Figure 7:
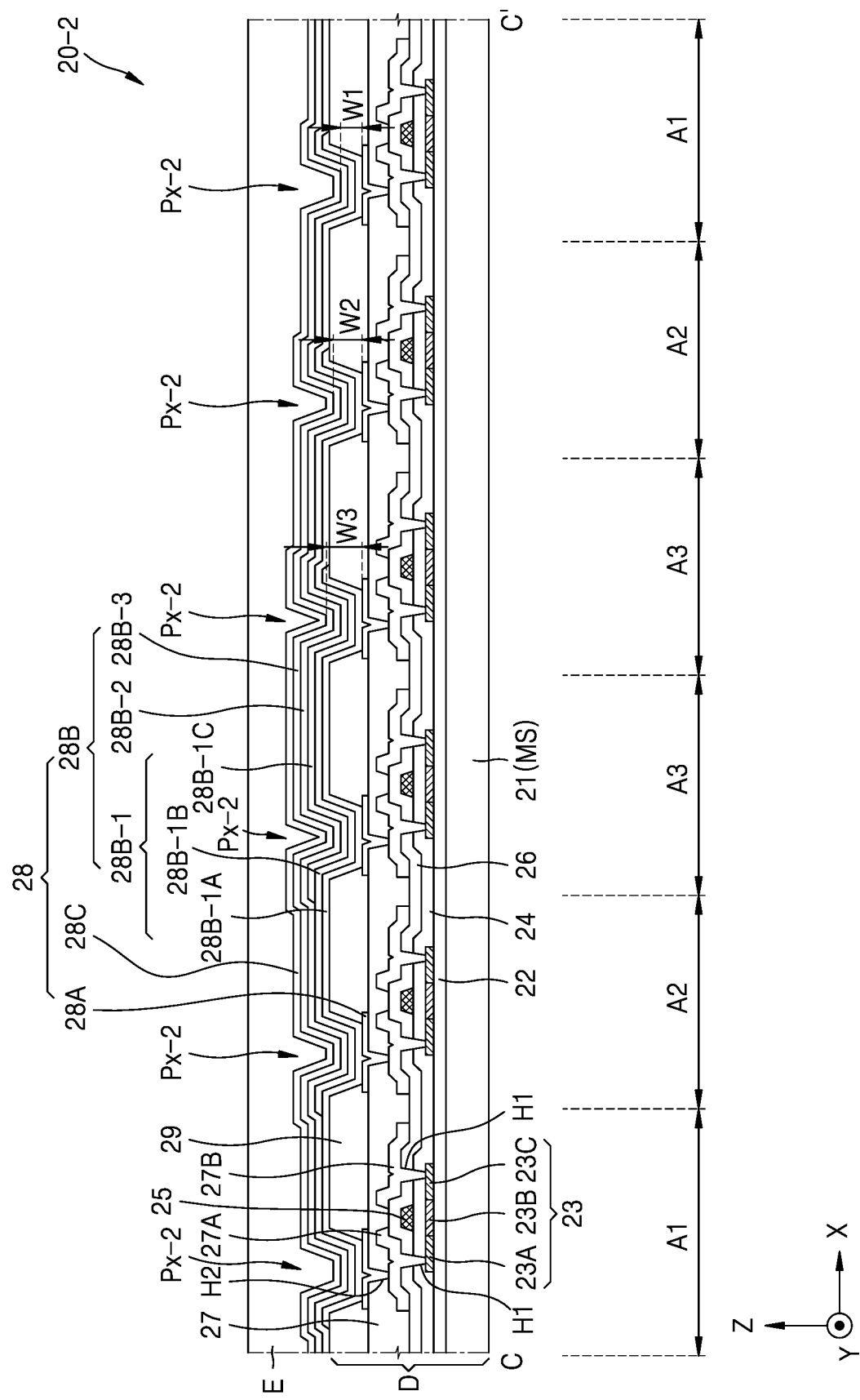
FIG. 7 is a cross-sectional view of the display apparatus taken along line C-C' of FIG. 6.

FIG. 6 is a plan view illustrating a display apparatus illustrated in FIG. 5. FIG. 7 is a cross-sectional view of the display apparatus taken along line C-C' of FIG. 6.

Referring to FIGS. 6 and 7, the display apparatus 20-2 may include a plurality of pixels Px-2. The pixel Px-2 may include one pixel electrode 28A and may emit one light. In this case, each pixel Px-2 may emit light of the same color. The pixel Px-2 may be defined as an area to emit one light. For example, the pixel Px-2 may be defined as an open area of a pixel definition layer 29. In this case, the pixel Px-2 may emit one selected from white, red, yellow, green, and blue colors. In this case, all of the plurality of pixels Px-2 may emit light of the same color.

The display apparatus 20-2 may have (e.g., be defined by) an emission area DA over a substrate 21 and a peripheral area PA around (e.g., surrounding) the emission area DA. The pixel Px-2 may be arranged in the emission area DA, and a power line may be arranged in the peripheral area PA. Also, a pad unit PD-2 may be arranged in the peripheral area PA. In this case, the peripheral area PA may be an area in which the pixel Px-2 is not arranged and may be an area that is not to emit light to the outside.

The display apparatus 20-2 may include a display substrate D and a sealing member arranged over the display substrate D. In this case, the sealing member may include a sealing unit arranged at (e.g., on) the display substrate D, and an encapsulation substrate coupled (e.g., connected) to the sealing unit and arranged to face (e.g., overlap) the substrate 21. In other embodiments, the sealing member may include a thin film encapsulation layer E covering at least a portion of the display substrate D. Hereinafter, for convenience of description, a more detailed description will be given mainly of a case where the sealing member includes a thin film encapsulation layer E.

The display substrate D may include a substrate 21, a thin film transistor TFT arranged over the substrate 21, and an organic light emitting device (OLED) 28.

The substrate 21 may include (e.g., be) glass and/or polymer resin. The polymer resin may include (e.g., be) polymer resin such as polyether sulfone, polyacrylate, polyetherimide, polyethylene naphthalate, polyethylene terephthalate, polyphenylene sulfide, polyarylate, polyimide, polycarbonate, and/or cellulose acetate propionate. The substrate 21 including (e.g., being) the polymer resin may be flexible, rollable, and/or bendable. The substrate 21 may have a multilayer structure including an inorganic layer and a layer including (e.g., being) the above polymer resin.

A thin film transistor TFT may be formed over the substrate 21, a passivation layer 27 may be formed to cover the thin film transistor TFT, and an organic light emitting device 28 may be formed over the passivation layer 27.

A buffer layer 22 including (e.g., being) an organic compound and/or an inorganic compound may be further formed on the upper surface of the substrate 21 and may include $SiO_x$ ($x \geq 1$) and/or $SiN_x$ ($x \geq 1$). In some embodiments, the buffer layer 22 may include silicon oxynitride $SiO_xN_y$ ($x \geq 1$; $y \geq 1$).

An active layer 23 arranged in a certain pattern may be formed over the buffer layer 22, and then the active layer 23 may be buried by a gate insulating layer 24. The active layer 23 may include a source area 23A and a drain area 23C and may further include a channel area 23B between the source area 23A and the drain area 23C.

The active layer 23 may be formed to include (e.g., be) various suitable materials. For example, the active layer 23 may include (e.g., be) an inorganic semiconductor material such as amorphous silicon and/or crystalline silicon. As another example, the active layer 23 may include (e.g., be) an oxide semiconductor. As another example, the active layer 23 may include (e.g., be) an organic semiconductor material. Hereinafter, for convenience of description, a more detailed description will be given mainly of a case where the active layer 23 includes (e.g., is formed from) amorphous silicon.

The active layer 23 may be formed by forming an amorphous silicon layer over the buffer layer 22, crystallizing the amorphous silicon layer into a polycrystalline silicon layer, and patterning the polycrystalline silicon layer.

In the active layer 23, the source area 23A and the drain area 23C may be doped with impurities according to the type (e.g., kind) of a TFT such as a driving TFT or a switching TFT.

A gate electrode 25 corresponding to (e.g., overlapping) the active layer 23 and an interlayer insulating layer 26 burying the gate electrode 25 may be formed on the upper surface of the gate insulating layer 24.

Also, a contact hole H1 may be formed in the interlayer insulating layer 26 and the gate insulating layer 24, and then a source electrode 27A and a drain electrode 27B may be formed over the interlayer insulating layer 26 to respectively contact the source area 23A and the drain area 23C.

A passivation layer 27 may be formed over the thin film transistor formed as such, and a pixel electrode 28A of an organic light emitting device (OLED) 28 may be formed over the passivation layer 27. The pixel electrode 28A may contact the source electrode 27A of the TFT through a via hole H2 formed in the passivation layer 27. The passivation layer 27 may be formed of an inorganic material and/or an organic material as a single layer or as two or more layers, and may be formed as a planarization layer to have an upper surface that is flat regardless of the curvature of a lower layer thereunder or may be formed to have a curvature along the curvature of a layer thereunder. In some embodiments, the curvature of the upper surface of the passivation layer 27 may correspond to the curvature of a lower layer of the passivation layer 27. Also, the passivation layer 27 may be formed of a transparent insulator to achieve a resonance effect.

After the pixel electrode 28A is formed over the passivation layer 27, a pixel definition layer 29 may be formed of an organic material and/or an inorganic material to cover the pixel electrode 28A and the passivation layer 27, and the pixel definition layer 29 may be opened to expose the pixel electrode 28A.

Also, an intermediate layer 28B and an opposite electrode 28C may be formed over the pixel electrode 28A. In other embodiments, the opposite electrode 28C may be formed over the entire surface of the display substrate D. In this case, the opposite electrode 28C may be formed over the intermediate layer 28B and the pixel definition layer 29. Hereinafter, for convenience of description, a more detailed description will be given mainly of a case where the opposite electrode 28C is formed over the intermediate layer 28B and the pixel definition layer 29.

The pixel electrode 28A may function as an anode electrode and the opposite electrode 28C may function as a cathode electrode, or the polarities of the pixel electrode 28A and the opposite electrode 28C may be reversed.

The pixel electrode 28A and the opposite electrode 28C may be insulated from each other by the intermediate layer 28B, and light may be emitted from an organic emission layer by applying voltages of different polarities to the intermediate layer 28B.

The intermediate layer 28B may include an organic emission layer 28B-2. As another example, the intermediate layer 28B may include at least one selected from an organic emission layer 28B-2, a lower auxiliary layer 28B-1, and an upper auxiliary layer 28B-3. In this case, the lower auxiliary layer 28B-1 may include at least one selected from a hole injection layer (HIL) and a hole transport layer (HTL). Also, the upper auxiliary layer 28B-3 may include at least one selected from an electron transport layer (ETL) and an electron injection layer (EIL). In the above case, the upper auxiliary layer 28B-3 may be arranged between the organic emission layer 28B-2 and the opposite electrode 28C, and the lower auxiliary layer 28B-1 may be arranged between the organic emission layer 28B-2 and the pixel electrode 28A.

Some of the plurality of pixels Px-2 may form one pixel group, and, in some embodiments, at least three pixels Px-2 may be included in the pixel group. Hereinafter, for convenience of description, a more detailed description will be given mainly of a case where one pixel group includes six pixels Px-2.

The thicknesses of intermediate layers 28B of six pixels Px-2 included in one pixel group described above may be different from each other. For example, six pixels Px-2 included in one pixel group described above may be arranged in a line in one direction. For example, six pixels Px-2 may include three pairs of pixels Px-2. In this case, each pair of pixels Px-2 may have the same thickness. For example, the intermediate layer 28B of the pixel Px-2 arranged in a first area A1 that is the outermost in one pixel group may have a first thickness W1. Also, the intermediate layer 28B arranged in a third area A3 that is a central area of one pixel group may have a third thickness W3. The intermediate layer 28B arranged between the first area A1 and the third area A3 of one pixel group may have a second thickness W2. In the above case, the first thickness W1 may be different from the second thickness W2, and the second thickness W2 may be different from the third thickness W3. For example, among the first thickness W1, the second thickness W2, and the third thickness W3, the first thickness W1 may be the smallest, and the third thickness W3 may be the greatest.

As above, when the thicknesses of the intermediate layers 28B arranged in the pixels Px-2 are different from each other, the pixels Px-2 having different thicknesses may emit light having different wavelengths. For example, as the thickness of the intermediate layer 28B of each pixel Px-2 increases, light having a longer wavelength may be generated. For example, with reference to FIG. 7, the wavelength of light emitted from the first area A1 may be the shortest, and the wavelength of light emitted from the third area A3 may be the longest. The wavelength of light emitted from the second area A2 may be longer than the wavelength of light emitted from the first area A1 and may be shorter than the wavelength of light emitted from the third area A3.

In the above case, in one pixel group, the first area A1, the second area A2, and the third area A3 may be repeated. For example, in a portion of the pixel group, the first area A1, the second area A2, and the third area A3 may be sequentially arranged in a first direction (e.g., the X axis direction in FIG. 7), and in another portion of the pixel group, the third area A3, the second area A2, and the first area A1 may be sequentially arranged in the first direction. In this case, two third areas A3 may be adjacent to each other, two third areas A3 may be arranged between two second areas A2, and two second areas A2 and two third areas A3 may be arranged between two first areas A1. In this case, one pixel group may be arranged between two third areas A3, and both sides thereof may be symmetrical to each other with respect to a center line of two third areas A3 (e.g., a straight line arranged in the Z axis direction in FIG. 7). In some embodiments, one pixel group may include the two first areas A1, the two second areas A2, and the two third areas A3, and a center of the one pixel group may correspond to the center line. In the above case, the thickness of the intermediate layer 28B of the pixel Px-2 arranged in each area may decrease sequentially away from the center line of the two third areas A3. For example, the thickness of the intermediate layer 28B may decrease away from the third area A3 toward the first area A1. In this case, the thickness of the intermediate layer 28B may be equal to the distance between the pixel electrode 28A and the opposite electrode 28C of each pixel Px-2. For example, the thickness of the intermediate layer 28B may represent the height from the upper surface of the pixel electrode 28A to the lower surface of the opposite electrode 28C of each pixel Px-2. In other embodiments, the thickness of the intermediate layer 28B of the pixel Px-2 arranged closest to the center line of one pixel group may decrease away from the center line of the pixel group. For example, when the center line of the pixel group passes through the center of the pixel Px-2 arranged at the center of the pixel group, the thickness of the intermediate layer 28B is the greatest in the pixel Px-2 than in the other pixels Px-2.

In the above case, the thicknesses of the intermediate layers 28B of adjacent pixels Px-2 among six pixels Px-2 arranged in one pixel group may be different from each other. For example, the second thickness W2 of the intermediate layer 28B of the pixel Px-2 arranged in the second area A2 and the third thickness W3 of the intermediate layer 28B of the pixel Px-2 arranged in the third area A3, which are adjacent to each other, may be different from each other. Also, the first thickness W1 of the intermediate layer 28B of the pixel Px-2 arranged in the first area A1 and the second thickness W2 of the intermediate layer 28B of the pixel Px-2 arranged in the second area A2, which are adjacent to each other, may be different from each other.

Each pixel Px-2 described above may include a pixel electrode 28A, an organic emission layer 28B-2, an auxiliary layer, and an opposite electrode 28C. In this case, the pixel electrode 28A may be arranged to correspond to each pixel Px-2, and the organic emission layer 28B-2 and the opposite electrode 28C may be arranged over the entire surface of the substrate 21 of the display apparatus 20-2. In this case, the plurality of pixels Px-2 may share the organic emission layer 28B-2 and the opposite electrode 28C with each other. Also, at least two pixels Px-2 adjacent to each other among the plurality of pixels Px-2 may share the auxiliary layer with each other. For example, in this case, the auxiliary layer may be arranged across at least two pixels Px-2 adjacent to each other among the plurality of pixels Px-2 and the upper surface of the pixel definition layer 29 arranged between at least two pixels Px-2 adjacent to each other among the plurality of pixels Px-2. For example, with reference to FIG. 7, the pixel Px-2 arranged in the third area A3 and the pixel Px-2 arranged in the second area A2 may share at least one of the upper auxiliary layers 28B-3 with each other.

At least one selected from the upper auxiliary layer 28B-3 and the lower auxiliary layer 28B-1 described above may be provided in plurality. For example, a plurality of upper auxiliary layers 28B-3 may be provided, and only one lower auxiliary layer 28B-1 may be provided. In other embodiments, only one upper auxiliary layer 28B-3 may be provided, and a plurality of lower auxiliary layers 28B-1 may be provided. In other embodiments, both of the upper auxiliary layer 28B-3 and the lower auxiliary layers 28B-1 may be provided in plurality. Hereinafter, for convenience of description, a more detailed description will be given mainly of a case where a plurality of lower auxiliary layers 28B-1 are provided.

The lower auxiliary layer 28B-1 may include at least two lower auxiliary layers 28B-1 arranged to be stacked on each other. Hereinafter, for convenience of description, a more detailed description will be given mainly of a case where three lower auxiliary layers 28B-1 are provided. For example, the lower auxiliary layer 28B-1 may include a first lower auxiliary layer 28B-1A, a second lower auxiliary layer 28B-1B, and a third lower auxiliary layer 28B-1C. In this case, the first lower auxiliary layer 28B-1A, the second lower auxiliary layer 28B-1B, and the third lower auxiliary layer 28B-1C may include (e.g., be) the same material or different materials. For example, all of the first lower auxiliary layer 28B-1A, the second lower auxiliary layer 28B-1B, and the third lower auxiliary layer 28B-1C may include a hole injection layer and/or a hole transport layer. In other embodiments, one selected from the first lower auxiliary layer 28B-1A, the second lower auxiliary layer 28B-1B, and the third lower auxiliary layer 28B-1C may include a hole injection layer, and the others (e.g., the remaining two) of the first lower auxiliary layer 28B-1A, the second lower auxiliary layer 28B-1B, and the third lower auxiliary layer 28B-1C may include a hole transport layer. However, hereinafter, for convenience of description, a more detailed description will be given mainly of a case where all of the first lower auxiliary layer 28B-1A, the second lower auxiliary layer 28B-1B, and the third lower auxiliary layer 28B-1C include (e.g., be) the same material.

The first to third lower auxiliary layers 28B-1A to 28B-1C may be arranged in different areas. For example, one selected from the first to third lower auxiliary layers 28B-1A to 28B-1C may at least partially overlap another selected from the first to third lower auxiliary layers 28B-1A to 28B-1C in the plan view. For example, with reference to FIG. 7, the first lower auxiliary layer 28B-1A may be arranged to cover the pixel Px-2 arranged in the first area A1 arranged on the left side, the pixel Px-2 arranged in the second area A2, and the pixels Px-2 arranged in two third areas A3. In this case, the pixel Px-2 of the first area A1, the pixel Px-2 of the second area A2, and the pixels Px-2 arranged in two third areas A3, which are adjacent to each other, may share the first lower auxiliary layer 28B-1A. With reference to FIG. 7, the second lower auxiliary layer 28B-1B may be arranged to cover the pixel Px-2 arranged in the second area A2 arranged on the left side, the pixels Px-2 arranged in two third areas A3, and the pixel Px-2 arranged in the second area A2 arranged on the right side. With reference to FIG. 7, the third lower auxiliary layer 28B-1C may be arranged to cover the pixels arranged in two third areas A3, the pixel Px-2 arranged in the second area A2 arranged on the right side, and the pixel Px-2 arranged in the first area A1 arranged on the right side. In this case, the adjacent pixels Px-2 may share each of the second lower auxiliary layer 28B-1B and the third lower auxiliary layer 28B-1C similarly to the first lower auxiliary layer 28B-1A.

In the above case, only the first lower auxiliary layer 28B-1A may be arranged in one of the pixels Px-2 arranged in two first areas A1, and only the third lower auxiliary layer 28B-1C may be arranged in the other of the pixels Px-2 arranged in the two first areas A1. Also, the first lower auxiliary layer 28B-1A and the second lower auxiliary layer 28B-1B may be arranged in one of the pixels Px-2 arranged in two second areas A2, and the second lower auxiliary layer 28B-1B and the third lower auxiliary layer 28B-1C may be sequentially stacked in the other of the pixels Px-2 arranged in the two second areas A2. The first lower auxiliary layer 28B-1A, the second lower auxiliary layer 28B-1B, and the third lower auxiliary layer 28B-1C may be sequentially stacked in all of the pixels Px-2 arranged in two third areas A3. When the first to third lower auxiliary layers 28B-1A to 28B-1C are arranged as above, the thicknesses of the lower auxiliary layers 28B-1 arranged in the respective pixels Px-2 may be different from each other.

At least one end of the first lower auxiliary layer 28B-1A, the second lower auxiliary layer 28B-1B, and the third lower auxiliary layer 28B-1C described above may be arranged over the pixel definition layer 29. For example, at least one end of the first lower auxiliary layer 28B-1A, the second lower auxiliary layer 28B-1B, and the third lower auxiliary layer 28B-1C may be arranged between the pixels adjacent to each other. For example, in a plan view, at least one end of each of the first to third lower auxiliary layers 28B-1A to 28B-1C may overlap the pixel definition layer 29.

The organic emission layer 28B-2, the upper auxiliary layer 28B-3, and the opposite electrode 28C may be sequentially stacked over the lower auxiliary layer 28B-1 described above. Also, the thin film encapsulation layer E may be arranged over the opposite electrode 28C.

Moreover, the thin film encapsulation layer E may include a plurality of inorganic layers or may include an inorganic layer and an organic layer.

The organic layer of the thin film encapsulation layer E may include (e.g., be) a polymer-based material. The polymer-based material may include (e.g., be) polyethyleneterephthalate, polyethylenenaphthalate, polycarbonate, polyimide, polyethylenesulfonate, polyoxymethylene, polyarylate, hexamethyldisiloxane, acrylic resin (e.g., polymethylmethacrylate and/or polyacrylic acid), or any combination thereof.

The inorganic layer of the thin film encapsulation layer E may include (e.g., be) one or more inorganic insulating materials selected from among aluminum oxide, titanium oxide, tantalum oxide, hafnium oxide, zinc oxide, silicon oxide, silicon nitride, and silicon oxynitride.

The top layer of the thin film encapsulation layer E exposed to the outside may be formed as an inorganic layer to prevent or block moisture penetration into the organic light emitting device.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic encapsulation layer, a first organic encapsulation layer, and a second inorganic encapsulation layer sequentially (e.g., sequentially stacked) from the top of the organic light emitting device (OLED) 28.

As another example, the thin film encapsulation layer E may include a first inorganic encapsulation layer, a first organic encapsulation layer, a second inorganic encapsulation layer, a second organic encapsulation layer, and a third inorganic encapsulation layer sequentially (e.g., sequentially stacked) from the top of the organic light emitting device (OLED) 28.

As another example, the thin film encapsulation layer E may include a first inorganic encapsulation layer, a first organic encapsulation layer, a second inorganic encapsulation layer, a second organic encapsulation layer, a third inorganic encapsulation layer, a third organic encapsulation layer, and a fourth inorganic layer sequentially (e.g., sequentially stacked) from the top of the organic light emitting device (OLED) 28.

A metal halide layer including (e.g., being) LiF may be additionally included between the organic light emitting device (OLED) 28 and the first inorganic encapsulation layer (e.g., the first inorganic encapsulation layer of the thin film encapsulation layer E). The metal halide layer may prevent the organic light emitting device (OLED) 28 from being damaged, or may reduce the occurrence or extent of such damage, when the first inorganic encapsulation layer is formed by sputtering.

The first organic encapsulation layer may have a smaller area than the second inorganic encapsulation layer, and the second organic encapsulation layer may also have a smaller area than the third inorganic encapsulation layer.

When a plurality of inorganic layers are provided as above, the inorganic layers may be deposited to directly contact each other in an edge area of the display apparatus 20-2 and the organic layer may not be exposed to the outside.

Thus, the display apparatus 20-2 may emit light of different wavelengths to the outside while emitting the same color.

Moreover, the display apparatus 20-2 described above may operate in various suitable ways. For example, the display apparatus 20-2 may emit light of the pixels arranged in at least one selected from the first area A1, the second area A2, and the third area A3 arranged in one pixel group.

For example, the display apparatus 20-2 may emit light having one wavelength to the outside by emitting light of the pixel Px-2 arranged only in the first area A1, the second area A2, or the third area A3.

In other embodiments, the display apparatus 20-2 may emit light having at least two wavelengths by emitting light of the pixels Px-2 arranged in at least two selected from the first area A1, the second area A2, and the third area A3.

In other embodiments, the display apparatus 20-2 may emit lights of different wavelengths at different times by emitting lights of the pixels Px-2 respectively arranged in the first area A1, the second area A2, and the third area A3, at respective times.

Thus, the display apparatus 20-2 may freely emit light of various suitable wavelengths, thereby providing light having various suitable effects to the user.

Figure 8:
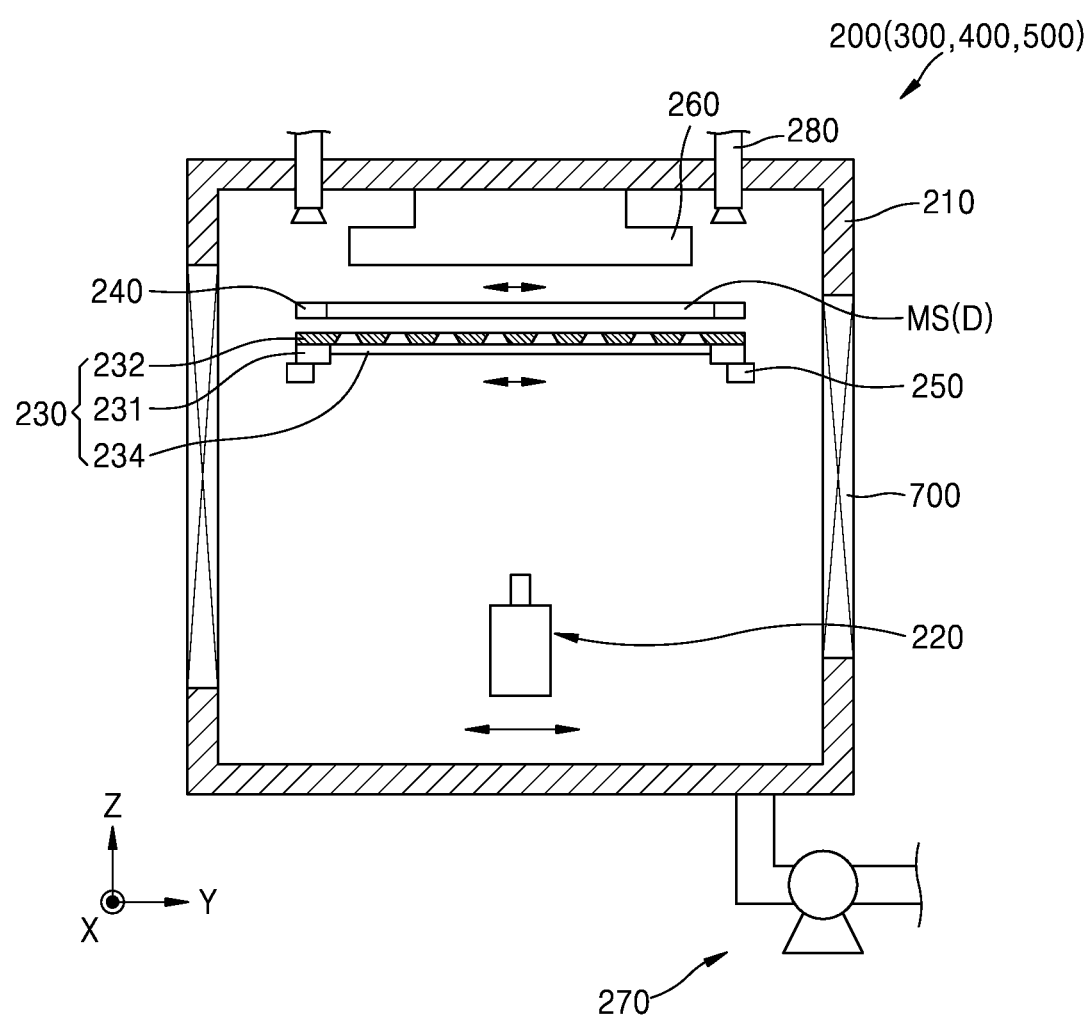
FIG. 8 is a cross-sectional view illustrating a first deposition unit illustrated in FIG. 1.

FIG. 8 is a cross-sectional view illustrating a first deposition unit illustrated in FIG. 1.

Referring to FIG. 8, the first deposition unit 200 may include a first chamber 210, a first deposition source 220, a first mask assembly 230, a first substrate support unit 240, a first mask support unit 250, a first magnetic force generator 260, a first pressure adjuster 270, and a first vision unit 280.

The first chamber 210 may include a space formed therein, and a side thereof may be formed to be open such that a process substrate MS may be withdrawn or received therethrough. In this case, an opening/closing unit 700 including a gate valve or the like may be arranged at an open portion of the first chamber 210 to selectively open or close. The process substrate MS described above may be formed in various suitable types (e.g., kinds). For example, the process substrate MS may include one deposition area. In other embodiments, the process substrate MS may include at least two deposition areas. In this case, the at least two deposition areas may be arranged apart from each other. In the deposition area described above, the pixel electrode and/or the organic emission layer may have been formed over the substrate described above. In other embodiments, the process substrate MS may represent the substrate of the display apparatus described above. In other embodiments, the process substrate MS may represent a state in which a mother substrate is divided into at least two after the above various layers are formed over the mother substrate. In other embodiments, the process substrate MS may represent the display substrate D described above.

The first deposition source 220 may receive a deposition material for forming at least one of the auxiliary layers described above. In this case, the first deposition source 220 may vaporize and/or sublimate the deposition material by applying energy (e.g., thermal energy, light energy, vibration energy, and/or the like) thereto.

The first deposition source 220 described above may be replaceable. In this case, the first deposition source 220 may be replaced with a new first deposition source 220 when the received deposition material is exhausted. Also, the first deposition source 220 may be fixed inside the first chamber 210 or may be arranged to move linearly.

The first mask assembly 230 may include a first mask frame 231, a (1-1)th mask sheet 232, a (1-2)th mask sheet, and a first support stick 234.

The first mask frame 231 may have an opening portion formed at the center thereof. In this case, the first mask frame 231 may be formed in the shape of a window frame or the like. In other embodiments, the first mask frame 231 may have an opening portion formed at the center thereof, and a separate frame dividing the opening portion in a grid shape may be arranged. For example, the opening in the first mask frame 231 may be divided into a plurality of openings by the separate frame. Hereinafter, for convenience of description, a more detailed description will be given mainly of a case where the first mask frame 231 has one opening portion formed at the center thereof.

The (1-1)th mask sheet 232 may be arranged on one surface of the first mask frame 231 and fixed to the first mask frame 231 through welding and/or the like in a state of being tensioned in at least one selected from a first direction and a second direction. In this case, a groove may be formed in the first mask frame 231 to receive the (1-1)th mask sheet 232. The (1-1)th mask sheet 232 may be formed in a rectangular shape and may be arranged on one side of the first mask frame 231. Also, the (1-1)th mask sheet 232 may be formed in a slit shape.

The (1-1)th mask sheet 232 may include a plurality of (1-1)th opening portions 232A. In this case, the plurality of (1-1)th opening portions 232A may be arranged apart (e.g., may be spaced apart in a plan view) from each other in the first direction and/or the second direction. For example, each (1-1)th opening portion 232A may be formed in (e.g., may have) various suitable shapes. For example, in an embodiment, the (1-1)th opening portion 232A may have a diamond shape in which vertexes are arranged in the tensile direction of the (1-1)th mask sheet 232. In other embodiments, the (1-1)th opening portion 232A may have a rectangular shape. In this case, the long side of the (1-1)th opening portion 232A may be arranged in the lengthwise direction of the (1-1)th mask sheet 232 or in a direction normal (e.g., perpendicular) to the lengthwise direction of the (1-1)th mask sheet 232. In other embodiments, the (1-1)th opening portion 232A may have a circular shape. However, hereinafter, for convenience of description, a more detailed description will be given mainly of a case where the (1-1)th opening portion 232A has a rectangular shape.

The (1-2)th mask sheet may include a (1-2)th opening portion. In this case, the (1-2)th opening portion may have a different size (e.g., planar area) than the (1-1)th opening portion 232A. In this case, the (1-2)th mask sheet may be arranged adjacent to the (1-1)th mask sheet 232.

The (1-2)th opening portion described above may be arranged to correspond to at least some of the plurality of pixels Px-2 arranged at the process substrate MS (or the display substrate D). For example, in the plan view, at least two opening portions of the pixel definition layer 29 may be arranged inside the (1-2)th opening portion. This will be described below in more detail.

The first mask frame 231 described above may include a check hole 231A for checking the degree of deposition of the deposition material. In this case, the check hole 231A may be formed in a different shape than the (1-1)th opening portion 232A and the (1-2)th opening portion. Hereinafter, for convenience of description, a more detailed description will be given mainly of a case where the check hole 231A is arranged in the first mask frame 231.

The first support stick 234 may be arranged at the first mask frame 231 to support not only the first mask frame 231 but also the (1-1)th mask sheet 232 and the (1-2)th mask sheet. In this case, the first support stick 234 may be arranged at the first mask frame 231 in a grid shape to define a display area of one display apparatus. For example, the first support stick 234 may define a plurality of display areas by dividing a central opening portion of the first mask frame 231 into a plurality of areas.

The first substrate support unit 240 may support the process substrate MS. In this case, the first substrate support unit 240 may support the process substrate MS by mounting the process substrate MS or may support the process substrate MS by adsorbing or coupling (e.g., attaching) one surface of the process substrate MS thereto. For example, the first substrate support unit 240 may include a frame, a bar, and/or the like fixed inside the first chamber 210. In other embodiments, the first substrate support unit 240 may include a clamp for holding the process substrate MS. In other embodiments, the first substrate support unit 240 may include an adhesive chuck or an electrostatic chuck. In this case, the first substrate support unit 240 may be integrally formed with the first magnetic force generator 260. In other embodiments, the first substrate support unit 240 may include a shuttle for transferring the process substrate MS from the outside of the first chamber 210 to the inside of the first chamber 210. However, hereinafter, for convenience of description, a more detailed description will be given mainly of a case where the first substrate support unit 240 includes a shuttle.

The first mask support unit 250 may support the first mask assembly 230. In this case, because the first mask support unit 250 may be the same as or similar to the first substrate support unit 240 described above, redundant descriptions thereof may not be provided below for convenience of description. Also, hereinafter, a more detailed description will be given mainly of a case where the first mask support unit 250 includes a frame fixed inside the first chamber 210 and the first mask assembly 230 is mounted and supported on the frame.

The first magnetic force generator 260 may be arranged in the first chamber 210 to adhere the first mask frame 231 to the process substrate MS. In this case, the first magnetic force generator 260 may include an electromagnet.

The first pressure adjuster 270 may be coupled (e.g., connected) to the first chamber 210 to adjust the internal pressure of the first chamber 210. In this case, the first pressure adjuster 270 may include a pipe coupled (e.g., connected) to the first chamber 210 and a pump arranged at the pipe.

The first vision unit 280 may be arranged at the first chamber 210. In this case, the first vision unit 280 may be arranged to be inserted into the first chamber 210 or may be arranged outside the first chamber 210. In some embodiments, when the first vision unit 280 is arranged outside the first chamber 210, a transmission window may be separately provided at (e.g., in) the first chamber 210. The first vision unit 280 may include a camera for obtaining an image.

Moreover, as for the operation of the first deposition unit 200 described above, the first deposition unit 200 may form at least one of the auxiliary layers over the process substrate MS.

For example, the process substrate MS and the first mask assembly 230 may be loaded into the first chamber 210. In this case, the process substrate MS may include one deposition area arranged at one surface thereof or may include a plurality of deposition areas arranged apart (e.g., spaced apart in a plan view) from each other. The deposition area may become a display apparatus when a plurality of layers are arranged over the process substrate MS. In an embodiment, before the auxiliary layer is formed by the first deposition unit 200, the pixel electrode 28A described in FIG. 7 may be formed in the deposition area. In other embodiments, before the auxiliary layer is formed by the first deposition unit 200, the organic emission layer 28B-2 described in FIG. 7 may be formed in the deposition area.

Moreover, when the process substrate MS and the first mask assembly 230 are respectively mounted on the first substrate support unit 240 and the first mask support unit 250, the positions of the process substrate MS and the first mask assembly 230 may be obtained through the first vision unit 280 and, based on this, the positions of the process substrate MS and the first mask assembly 230 may be aligned.

When the above process is completed, the deposition material may be supplied to the process substrate MS from the first deposition source 220. In this case, the deposition material may be deposited over the process substrate MS through the (1-1)th opening portion 232A. The above process may be performed at a portion of the process substrate MS, and the deposition material may be deposited over the entire surface of the process substrate MS by changing the position of the process substrate MS and/or changing the position of the first mask assembly 230. In this case, the process substrate MS may include deposition areas in which the deposition material is deposited in a certain pattern and which are spaced apart from each other. When deposition is performed on the deposition areas, the first deposition unit 200 may perform deposition a plurality of times. In some embodiments, the first deposition unit 200 may form a different thickness of the auxiliary layer in each portion of the deposition area by depositing the deposition material in the deposition area while changing the position of the first mask assembly 230.

When the above process is completed in the display apparatus manufacturing apparatus, the process substrate MS may be carried out from the first chamber 210 and transferred to another display apparatus manufacturing apparatus to form an organic emission layer, another auxiliary layer, an opposite electrode, a thin film encapsulation layer, and/or the like over the auxiliary layer. In other embodiments, when the above process is completed, the process substrate MS may be carried out from the first chamber 210 and transferred to another display apparatus manufacturing apparatus to form an opposite electrode, a thin film encapsulation layer, and/or the like over the auxiliary layer.

Thus, the first deposition unit 200 may freely adjust the thickness of the intermediate layer of the pixel Px-2 by forming the auxiliary layer at least two times at the corresponding portion of the process substrate MS of at least one pixel Px-2. Also, the manufacturing time and/or the manufacturing cost may be reduced because the first deposition unit 200 may not need to utilize (e.g., use) separate equipment or utilize (e.g., use) a plurality of first mask assemblies 230 in order to adjust the thickness of the auxiliary layer over one process substrate MS.

Figure 9:
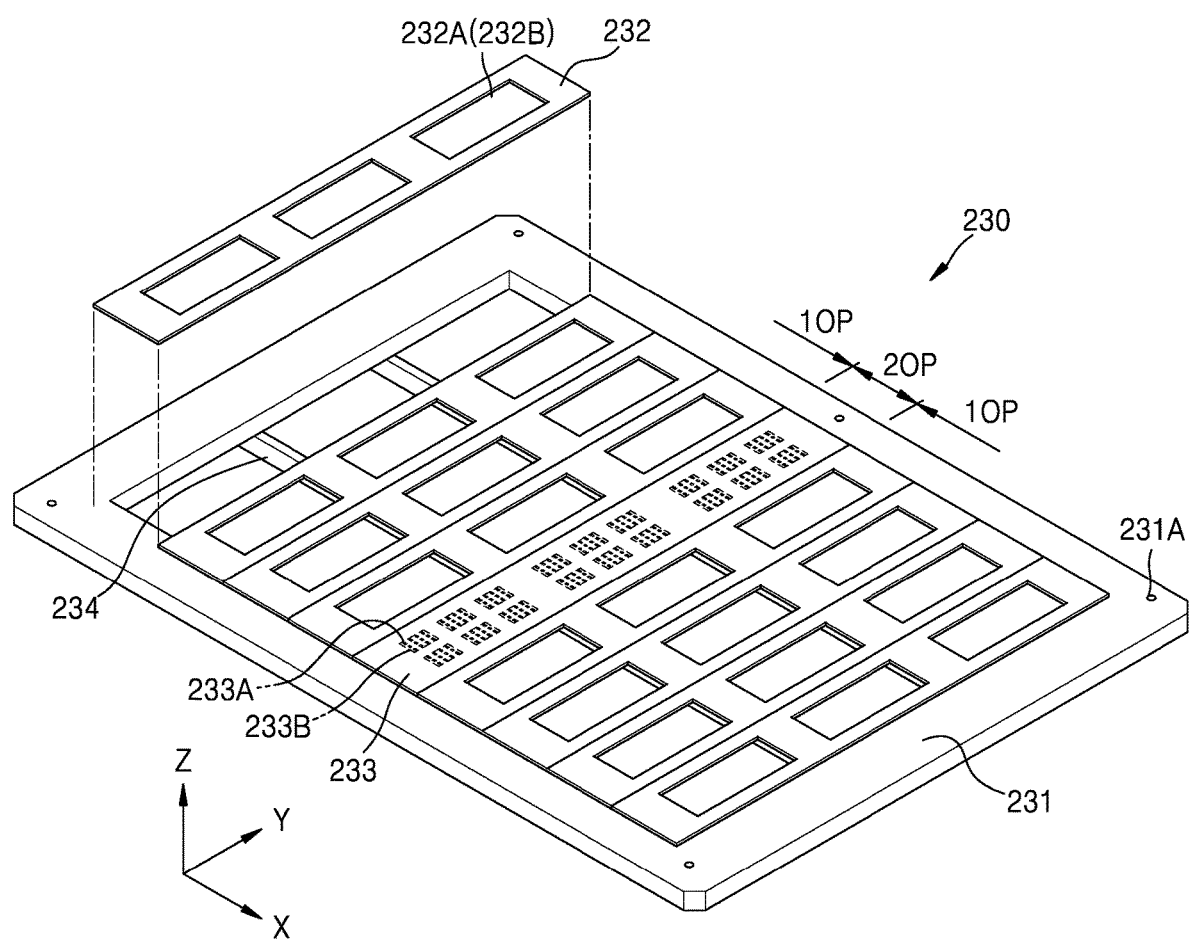
FIG. 9 is a perspective view illustrating a first mask assembly illustrated in FIG. 8.
Figure 10:
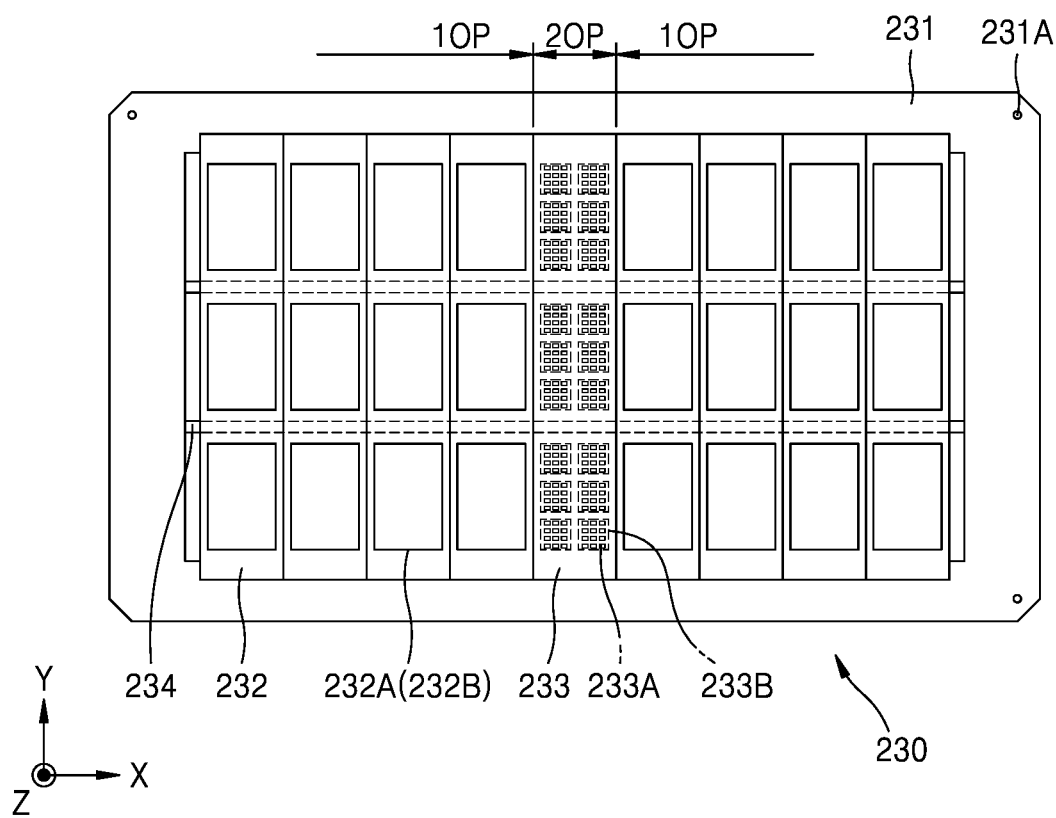
FIG. 10 is a plan view illustrating the first mask assembly illustrated in FIG. 9.

FIG. 9 is a perspective view illustrating a first mask assembly illustrated in FIG. 8. FIG. 10 is a plan view illustrating the first mask assembly illustrated in FIG. 9.

Referring to FIGS. 9 and 10, the first mask assembly 230 may include a first mask frame 231, a (1-1)th mask sheet 232, a (1-2)th mask sheet 233, and a first support stick 234. The first mask frame 231 may include an opening area therein. In this case, the opening area may be arranged at a central portion of the first mask frame 231.

The (1-1)th mask sheet 232 and the (1-2)th mask sheet 233 may be arranged adjacent to each other. In this case, at least one selected from the (1-1)th mask sheet 232 and the (1-2)th mask sheet 233 may be provided in plurality. In the above case, the (1-1)th mask sheet 232 and the (1-2)th mask sheet 233 may be arranged in different areas of the first mask frame 231. For example, the (1-1)th mask sheet 232 may be arranged in a first opening area 1OP, and the (1-2)th mask sheet 233 may be arranged in a second opening area 2OP. In the above case, the first opening area 1OP and the second opening area 2OP may be arranged adjacent to each other, and the number and position of first opening areas 1OP and second opening areas 2OP are not limited to those illustrated in FIG. 9 and they may be arranged at various suitable positions. For example, the second opening area 2OP may be arranged at the edge (e.g., the left edge and/or the right edge) of the first mask frame 231 or may be arranged at the upper or lower portion of the first mask frame 231. In this case, the first opening area 1OP may be arranged at a central portion of the first mask frame 231. In other embodiments, the second opening area 2OP may be arranged at the upper right, upper left, lower right, or lower left portion of the first mask frame 231. In this case, the first opening area 1OP may be arranged at another portion of the opening area of the first mask frame 231 at which the second opening area 2OP is not arranged. However, hereinafter, for convenience of description, a more detailed description will be given mainly of a case where the second opening area 2OP is arranged between the first opening areas 1OP, and where the second opening area 2OP is arranged at a center portion of the first mask frame 231.

The (1-1)th mask sheet 232 may be arranged to cover the first opening area 1OP. Also, the (1-2)th mask sheet 233 may be arranged to cover the second opening area 2OP. In this case, the (1-1)th mask sheet 232 may include (1-1)th opening portions 232A arranged apart (e.g., spaced apart in the plan view) from each other, and the (1-2)th mask sheet 233 may include (1-2)th opening portions 233A arranged apart (e.g., spaced apart in the plan view) from each other. In this case, the area of the planar shape of the (1-1)th opening portion 232A may be different from the area of the planar shape of the (1-2)th opening portion 233A. For example, the area of the planar shape of the (1-1)th opening portion 232A may be greater than the area of the planar shape of the (1-2)th opening portion 233A. For example, the (1-1)th opening portion 232A may have a planar shape corresponding to the first plane area 1PA illustrated in FIG. 2. The (1-2)th opening portion 233A may have a planar shape corresponding to some of the plurality of pixels arranged in the second plane area 2PA illustrated in FIG. 2. For example, as illustrated in FIG. 7, when the (1-2)th mask sheet 233 is arranged to face (e.g., overlap in the plan view) the process substrate MS, the planar shape of the (1-2)th opening portion 233A may be formed such that two or more pixels may be included in the planar shape of the (1-2)th opening portion 233A. In some embodiments, the planar shape, the planar area, the number of, and/or the arrangement of the (1-1)th opening portions 232A in the (1-1)th mask sheet 232 may be respectively different from the planar shape, the planar area, the number of, and/or the arrangement of the (1-2)th opening portions 233A in the (1-2)th mask sheet 233.

The (1-1)th mask sheet 232 described above may include a (1-1)th deposition area 232B corresponding to the first plane area 1PA of FIG. 2. In this case, one (1-1)th deposition area 232B may correspond to one first plane area 1PA. The (1-2)th mask sheet 233 may include a (1-2)th deposition area 233B corresponding to the second plane area 2PA of FIG. 2. In this case, a plurality of (1-2)th opening portions 233A may be arranged in the (1-2)th deposition area 233B.

The first support stick 234 may be arranged at the first mask frame 231 to support each mask sheet. In this case, the first support stick 234 may be arranged in one direction and fixed to the first mask frame 231 through welding or the like. In some embodiments, the first support stick 234 may be under the first mask frame 231, and the mask sheets (e.g., the (1-1)th mask sheet 232 and the (1-2)th mask sheet 233) may be arranged on top of the first mask frame 231. The first support stick 234 may be arranged in various suitable directions. For example, the first support stick 234 may be arranged in the lengthwise direction of the (1-1)th mask sheet 232. In this case, the first support stick 234 may cover the gap between adjacent mask sheets and also (e.g., simultaneously) support the side surface of each mask sheet. In other embodiments, the first support stick 234 may be arranged in a direction normal (e.g., perpendicular) to the lengthwise direction of the (1-1)th mask sheet 232. Hereinafter, for convenience of description, a more detailed description will be given mainly of a case where the first support stick 234 is arranged in a direction normal (e.g., perpendicular) to the lengthwise direction of the (1-1)th mask sheet 232.

The first mask assembly 230 described above may be utilized (e.g., used) to form the lower auxiliary layer.

Moreover, hereinafter, a more detailed description will be given of a case where each layer is formed in the second plane area 2PA of the second area 2A of the process substrate MS through the first mask assembly 230.

Figure 11:
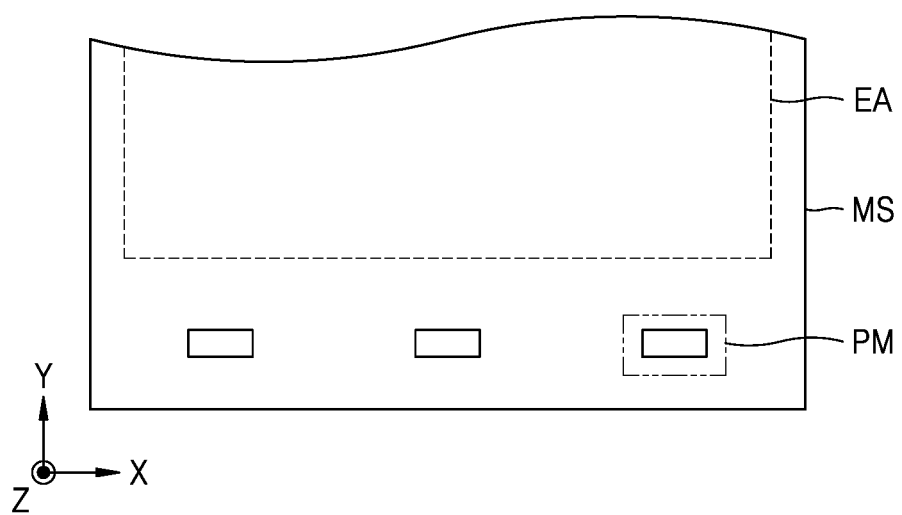
FIG. 11 is a plan view illustrating a portion of the process substrate illustrated in FIG. 2.

FIG. 11 is a plan view illustrating a portion of the process substrate illustrated in FIG. 2.

Referring to FIG. 11, a deposition check portion PM may be arranged on the process substrate MS. In this case, when the process substrate MS includes a plurality of deposition areas EA, the deposition check portion PM may be arranged between the deposition areas EA of the process substrate MS. In other embodiments, when the process substrate MS includes one deposition area EA, the deposition check portion PM may be arranged at a portion of the process substrate MS outside the deposition area EA (e.g., at (e.g., adjacent to) a side of the deposition area EA).

Figure 12:
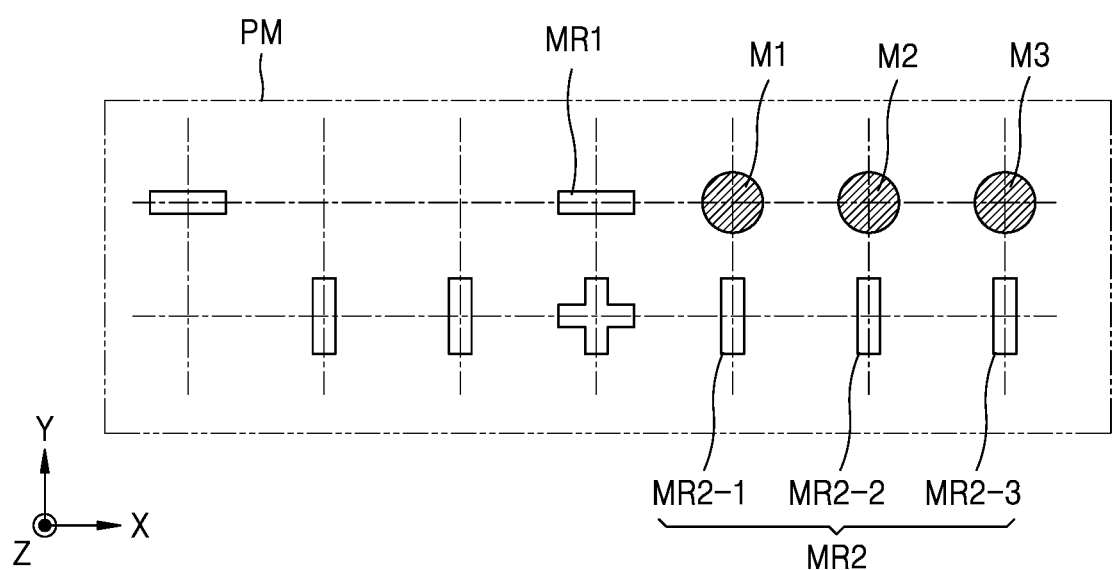
FIG. 12 is a plan view illustrating an embodiment of a deposition check portion of a process substrate according to embodiments.
Figure 13:
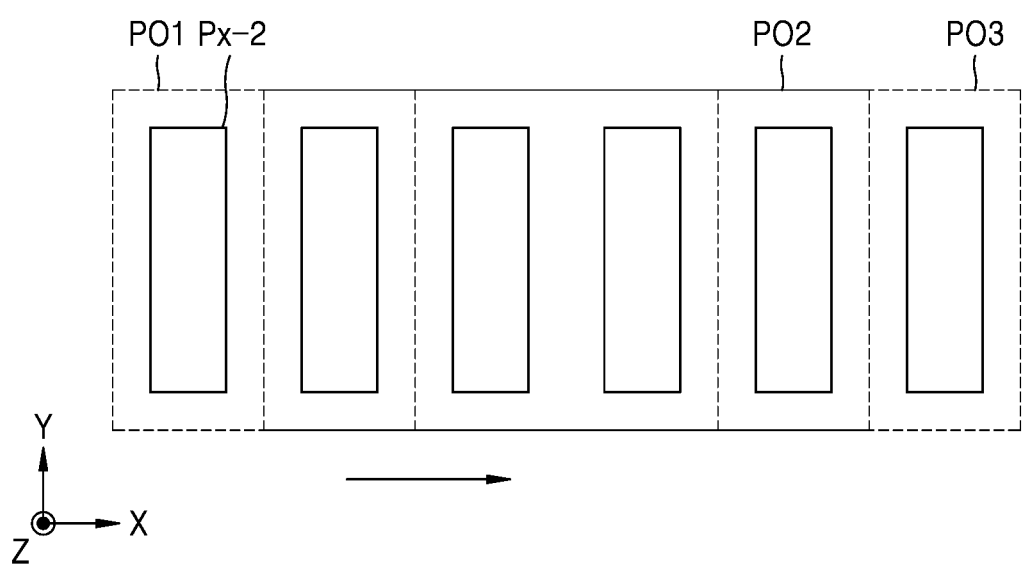
FIG. 13 is a plan view illustrating a deposition method according to an embodiment.

FIG. 12 is a plan view illustrating an embodiment of a deposition check portion of a process substrate according to embodiments. FIG. 13 is a plan view illustrating a deposition method according to an embodiment.

Referring to FIGS. 12 and 13, various suitable patterns may be arranged in the deposition check portion PM. For example, the deposition check portion PM may include a first direction pattern MR1 arranged in the first direction and a second direction pattern MR2 arranged in the second direction. For example, the first direction pattern MR1 may extend in the first direction, and the second direction pattern MR2 may extend in the second direction. In this case, the second direction pattern MR2 may include a (2-1)th direction pattern MR2-1, a (2-2)th direction pattern MR2-2, and a (2-3)th direction pattern MR2-3. The (2-1)th to (2-3)th direction patterns MR2-1 to MR2-3 may be arranged apart from each other in the first direction. For example, the (2-1)th to (2-3)th direction patterns MR2-1 to MR2-3 may be spaced apart in a plan view from each other and may be arranged with each other along the first direction. In this case, the first direction and the second direction may be perpendicular to each other.

In the above case, the deposition material passing through the check hole 231A may be deposited on the deposition check portion PM. For example, when the deposition material passes through the check hole 231A, a first deposition material pattern M1 may be arranged at a first point where an extension line of the first direction pattern MR1 and an extension line of the (2-1)th direction pattern MR2-1 cross or intersect with each other. Also, when the first mask assembly 230 is moved once in the first direction and then deposition is performed, a second deposition material pattern M2 may be arranged at a second point. Thereafter, when the first mask assembly 230 is moved once again in the first direction and then deposition is performed, a third deposition material pattern M3 may be arranged at a third point. In this case, the check hole 231A may be arranged at the first mask frame 231 on the most downstream side with respect to the movement direction of the first mask assembly 230.

When deposition is performed while the first mask assembly 230 is moved as above, the position of the (1-2)th opening portion 233A may be initially arranged at α first position PO1 as illustrated in FIG. 13. In this case, the (1-2)th opening portion 233A may be arranged to correspond to four pixels Px-2 arranged in the first to third areas A1 to A3 on the left side illustrated in FIG. 7. For example, when the (1-2)th opening portion 233A is at the first position PO1, the (1-2)th opening portion 233A may correspond to four pixels Px-2 arranged in the first area A1 on the left side, the second area A2 on the left side, and the two third areas A3. In this case, the deposition material that has passed through the (1-2)th opening portion 233A may be deposited on a portion of the process substrate MS corresponding to the (1-2)th opening portion 233A at the first position PO1. Thereafter, when the first mask assembly 230 is moved once, the (1-2)th opening portion 233A may be arranged at a second position PO2. In this case, the (1-2)th opening portion 233A may be arranged to correspond to the pixels Px-2 arranged in the second area A2 and the third area A3 on the left side illustrated in FIG. 7 and the second area A2 on the right side illustrated in FIG. 7. For example, when the (1-2)th opening portion 233A is at the second position PO2, the (1-2)th opening portion 233A may correspond to four pixels Px2 arranged in the second area A2 on the left side, the two third areas A3, and the second area A2 on the right side. In this case, the deposition material that has passed through the (1-2)th opening portion 233A may be deposited on the corresponding pixel Px-2. Also, when the first mask assembly 230 is moved again, the (1-2)th opening portion 233A may move from the second position PO2 to a third position PO3. In this case, the (1-2)th opening portion 233A at the third position PO3 may be arranged to correspond to the pixels Px-2 arranged in two third areas A3, the second area A2 on the right side, and the first area A1 on the right side illustrated in FIG. 7.

When the first mask assembly 230 is moved as above, the pattern of the deposition material arranged over the process substrate MS may be compared with the first direction pattern MR1 and the second direction pattern MR2 through the check hole 231A to evaluate whether the movement of the first mask assembly 230 is accurately performed.

For example, the first deposition material pattern M1, the second deposition material pattern M2, and the third deposition material pattern M3 may be formed at the points where the first direction pattern MR1 and the second direction pattern MR2 cross or intersect with each other, and the accuracy of the movement of the first mask assembly 230 may be checked by utilizing (e.g., using) the first vision unit 280 to determine whether the first deposition material pattern M1, the second deposition material pattern M2, and the third deposition material pattern M3 have been formed at accurate points.

Moreover, although the above description has been given mainly of the case of fixing the process substrate MS and moving the first mask assembly 230, the present embodiments are not limited thereto.

For example, the above operation may also be performed while fixing the first mask assembly 230 and moving the process substrate MS. In this case, the deposition process may be performed while moving the process substrate MS in a direction opposite to the movement direction of the first mask assembly 230 described above.

Figure 14:
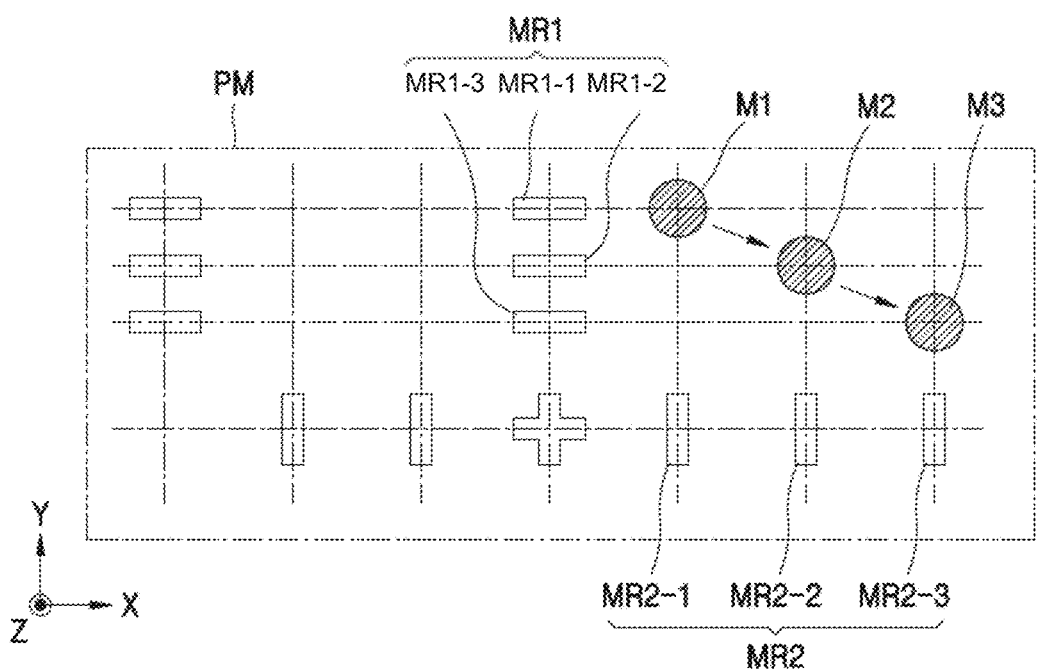
FIG. 14 is a plan view illustrating another embodiment of a deposition check portion of a process substrate according to embodiments.
Figure 15:
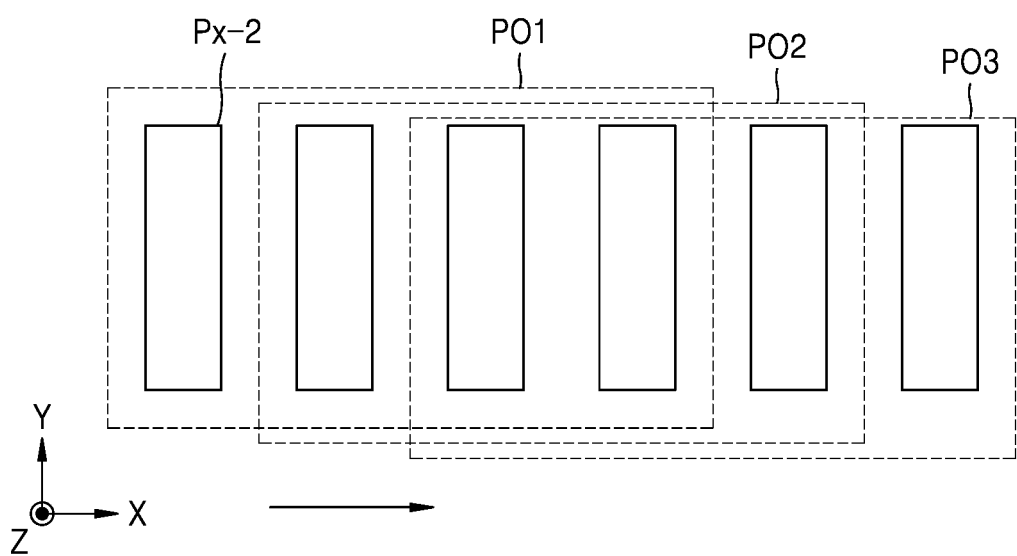
FIG. 15 is a plan view illustrating a deposition method according to other embodiments.

FIG. 14 is a plan view illustrating another embodiment of a deposition check portion of a process substrate according to embodiments. FIG. 15 is a plan view illustrating a deposition method according to other embodiments.

Referring to FIGS. 14 and 15, the deposition check portion PM may include a first direction pattern MR1 and a second direction pattern MR2. In this case, because the second direction pattern MR2 is the same as that described in FIG. 12, redundant descriptions thereof may not be provided for conciseness.

The first direction pattern MR1 may include a (1-1)th direction pattern MR1-1, a (1-2)th direction pattern MR1-2, and a (1-3)th direction pattern MR1-3. In this case, the (1-1)th direction pattern MR1-1, the (1-2)th direction pattern MR1-2, and the (1-3)th direction pattern MR1-3 may be arranged apart from each other in the second direction. For example, the (1-1)th to (1-3)th direction patterns MR1-1 to MR1-3 may be spaced apart from each other in a plan view and may be arranged with each other along the second direction.

Moreover, in the case of depositing the deposition material over the process substrate MS by utilizing (e.g., using) the first mask assembly 230 as above, the deposition material may be deposited over the process substrate while moving the first mask assembly 230 and/or the process substrate MS. Hereinafter, for convenience of description, a more detailed description will be given mainly of the case of depositing the deposition material over the process substrate MS while moving the first mask assembly 230.

When deposition is performed after aligning the first mask assembly 230 and the process substrate MS with each other, the deposition material that has passed through the check hole 231A may be deposited on the deposition check portion PM to form a first deposition material pattern M1 at a first point where an extension line of the (1-1)th direction pattern MR1-1 and an extension line of the (2-1)th direction pattern MR2-1 cross or intersect with each other. In this case, the (1-2)th opening portion 233A may be arranged at a first position PO1. In this case, the (1-2)th opening portion 233A may be arranged to correspond to four pixels Px-2 of one pixel group arranged in the first to third areas A1 to A3 on the left side illustrated in FIG. 7. In some embodiments, the formation of the first deposition material pattern M1 at the first point may indicate that the (1-2)th opening portion 233A was correctly aligned at the first position PO1 when the deposition was performed, and the formation of the first deposition material pattern M1 at a point other than at the first point may indicate that the (1-2)th opening portion 233A was not aligned at the first position PO1 when the deposition was performed.

When deposition is performed after moving the first mask assembly 230, the deposition material that has passed through the check hole 231A may be deposited on the deposition check portion PM to form a second deposition material pattern M2 at a second point where an extension line of the (1-2)th direction pattern MR1-2 and an extension line of the (2-2)th direction pattern MR2-2 cross or intersect with each other. In this case, the (1-2)th opening portion 233A may be arranged at a second position PO2. In this case, the (1-2)th opening portion 233A may be arranged to correspond to the pixels Px-2 of one pixel group arranged in the second area A2 and the third area A3 on the left side illustrated in FIG. 7 and the second area A2 on the right side illustrated in FIG. 7. In some embodiments, the formation of the second deposition material pattern M2 at the second point may indicate that the (1-2)th opening portion 233A was correctly aligned at the second position PO2 when the deposition was performed, and the formation of the second deposition material pattern M2 at a point other than at the second point may indicate that the (1-2)th opening portion 233A was not aligned at the second position PO2 when the deposition was performed.

When deposition is again performed after moving the first mask assembly 230, the deposition material that has passed through the check hole 231A may be deposited on the deposition check portion PM to form a third deposition material pattern M3 at a third point where an extension line of the (1-3)th direction pattern MR1-3 and an extension line of the (2-3)th direction pattern MR2-3 cross or intersect with each other. In this case, the (1-2)th opening portion 233A may be arranged at the third position PO3. In this case, the (1-2)th opening portion 233A may be arranged to correspond to the pixels Px-2 of one pixel group arranged in two third areas A3, the second area A2 on the right side, and the first area A1 on the right side illustrated in FIG. 7. In some embodiments, the formation of the third deposition material pattern M3 at the third point may indicate that the (1-2)th opening portion 233A was correctly aligned at the third position PO3 when the deposition was performed, and the formation of the third deposition material pattern M3 at a point other than at the third point may indicate that the (1-2)th opening portion 233A was not aligned at the third position PO3 when the deposition was performed.

When the deposition is performed as above, the first mask assembly 230 may move in the first direction and the second direction. For example, the first mask assembly 230 may be moved in the direction of moving from the first deposition material pattern M1 to the second deposition material pattern M2. Also, the first mask assembly 230 may be moved in the direction of moving from the second deposition material pattern M2 to the third deposition material pattern M3.

When the first mask assembly 230 is moved as above, the (1-2)th opening portion 233A may not deviate from the range of the pixel arranged in each area. For example, the first mask assembly 230 may be moved such that the plane of the opening portion of the pixel definition layer arranged in each pixel is completely inside the (1-2)th opening portion 233A in the plan view.

When the first mask assembly 230 is moved as above, the first mask assembly 230 may not move only in the first direction but may move in the second direction while moving in the first direction. In this case, as illustrated in FIG. 14, the first deposition material pattern M1, the second deposition material pattern M2, and the third deposition material pattern M3 may not move in the first direction or the second direction but may move in a direction inclined with respect to the first direction and the second direction. Also, in this case, when the (1-2)th opening portion 233A is arranged at each of the first position PO1, the second position PO2, and the third position PO3, a line segment connecting each position and the center of the (1-2)th opening portion 233A may be parallel or may not be perpendicular to a line segment connecting the centers of the pixels Px-2. For example, a line segment connecting the centers of the pixels Px-2 may be parallel to the first direction or the second direction, and any straight line where the center of the (1-2)th opening portion 233A is moved may be diagonally arranged with respect to the first direction or the second direction. In this case, the position of the center of the first lower auxiliary layer 28B-1A formed when the (1-2)th opening portion 233A is arranged at the first position PO1, the position of the center of the second lower auxiliary layer 28B-1B formed when the (1-2)th opening portion 233A is arranged at the second position PO2, and the position of the center of the third lower auxiliary layer 28B-1C formed when the (1-2)th opening portion 233A is arranged at the third position PO3 may be different from each other so as to correspond to the position of the center of the (1-2)th opening portion 233A.

Thus, by precisely moving the first mask assembly 230 and/or the process substrate MS, the auxiliary layer may be accurately arranged in each pixel when the auxiliary layer is formed. Also, the thickness of the intermediate layer of each pixel may be precisely controlled by accurately overlapping at least two auxiliary layers in the pixel.

Figure 16A:
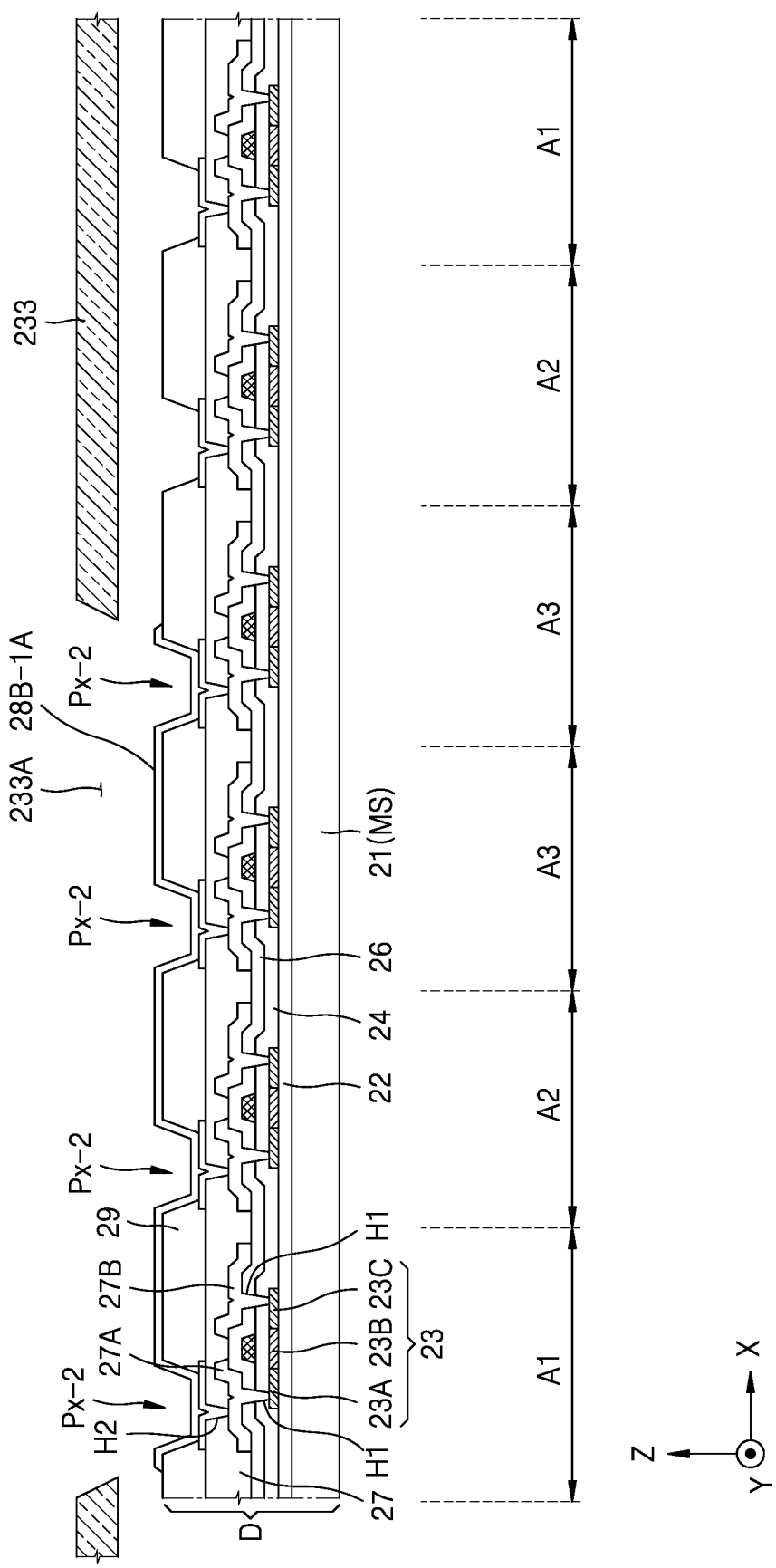
FIGS. 16A-16C are cross-sectional views illustrating a process of depositing a deposition material on a process substrate through the deposition method illustrated in FIG. 13 or 15.
Figure 16B:
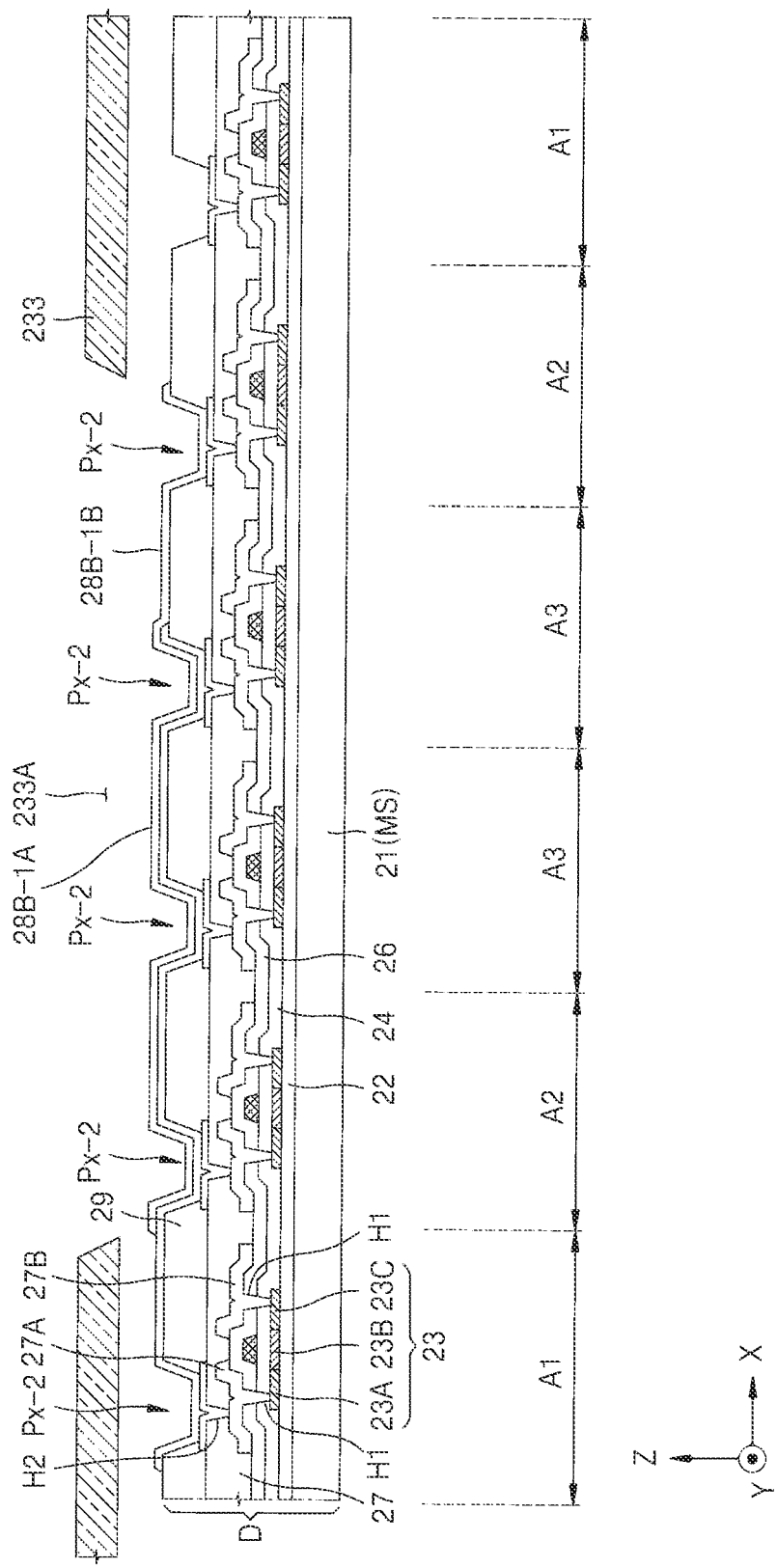
Figure 16C:
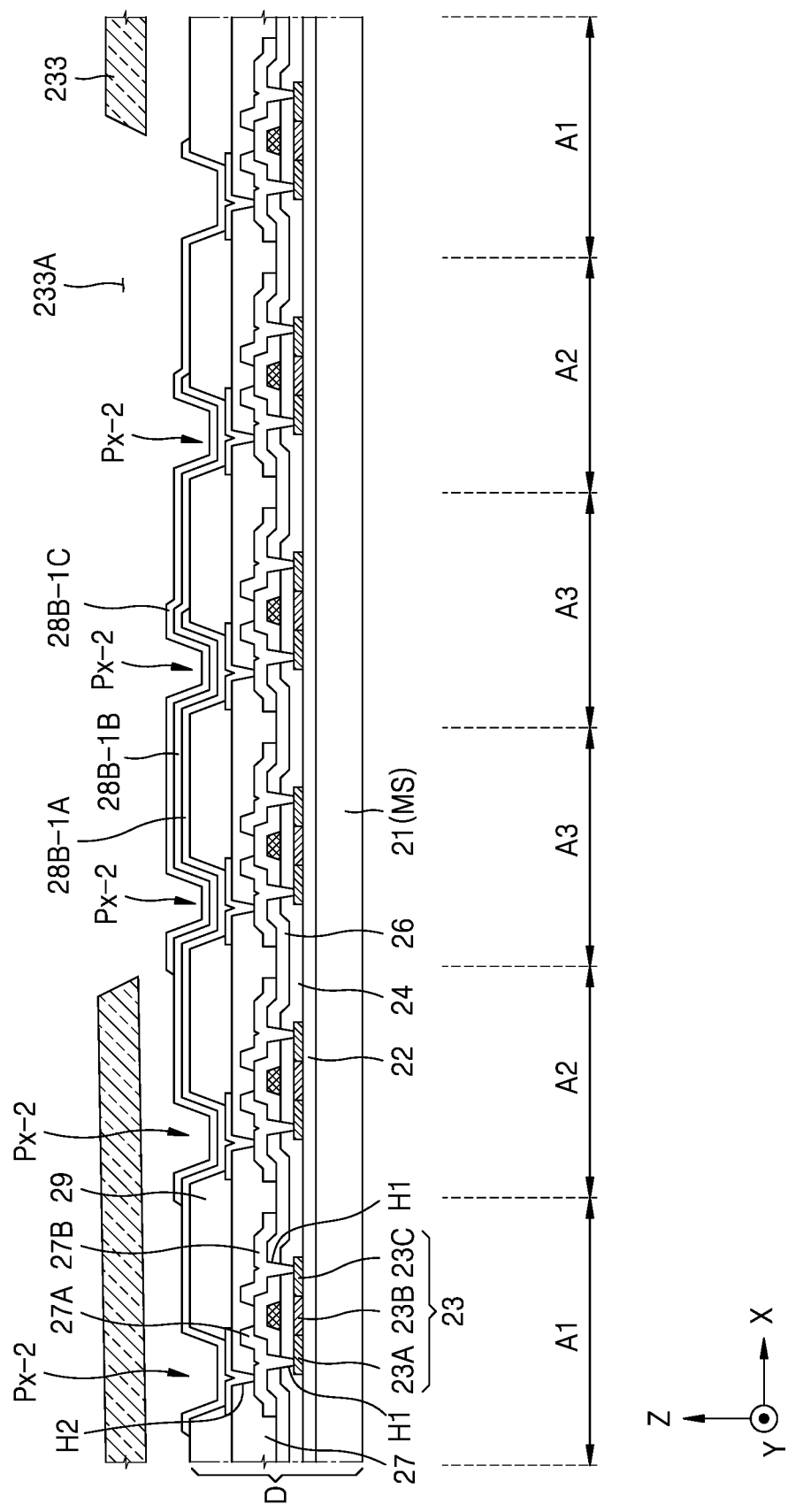

FIGS. 16A to 16C are cross-sectional views illustrating a process of depositing a deposition material on a process substrate through the deposition method illustrated in FIG. 13 or 15.

Referring to FIG. 16A, a first lower auxiliary layer 28B-1A may be formed over a display substrate D. In this case, the display substrate D may include a substrate 21, a pixel definition layer 29, each layer arranged between the substrate 21 and the pixel definition layer 29, and a pixel electrode 28A.

In the above case, the display substrate D may be arranged in the first deposition unit 200 illustrated in FIG. 8, and then a deposition material may be deposited over the display substrate D. In this case, one or more display substrates D may be provided in a process substrate MS. For example, the display substrate D may refer to the process substrate MS itself or a portion of the process substrate MS. For example, when the display substrate D is a portion of the process substrate MS, the display substrate D may include a deposition area of the process substrate MS.

A mask assembly may be arranged to face (e.g., overlap) the display substrate D, and then a deposition material may be supplied to the display substrate D through a deposition source.

The deposition material may be deposited on the display substrate D through a (1-2)th opening portion 233A of a (1-2)th mask sheet 233. In this case, the deposition material may be deposited over the display substrate D arranged in one first area A1, one second area A2, and two third areas A3 included in one pixel group. When the deposition is performed as above, the deposition material may be deposited only in some of a plurality of pixels included in one pixel group.

Referring to FIG. 16B, a second lower auxiliary layer 28B-1B may be formed over a first lower auxiliary layer 28B-1A formed as in FIG. 16A. In this case, the second lower auxiliary layer 28B-1B may not be arranged over the entire first lower auxiliary layer 28B-1A. For example, the second lower auxiliary layer 28B-1B may be arranged to partially overlap the first lower auxiliary layer 28B-1A in the plan view as illustrated in FIG. 16B.

In order to form the second lower auxiliary layer 28B-1B as above, the mask frame may be moved by a certain distance in the first direction. In this case, the degree of movement of the mask frame may be N times the width of at least one pixel in the first direction (where N is a natural number). However, hereinafter, for convenience of description, a more detailed description will be given mainly of the case of moving the mask frame by the width of one pixel in the first direction.

When the deposition material is deposited on the display substrate D after the mask assembly is moved as above, the deposition material may be deposited over the display substrate D of two second areas A2 and the two third areas A3 excluding the left first area A1 and the right first area A1 of FIG. 16B. In this case, the second lower auxiliary layer 28B-1B may be arranged over the first lower auxiliary layer 28B-1A in the pixels arranged in the left second area A2 and two third areas A3. In some embodiments, the second lower auxiliary layer 28B-1B may also be arranged over the pixel arranged in the right second area A2.

Referring to FIG. 16C, after the second lower auxiliary layer 28B-1B is formed as above, a third lower auxiliary layer 28B-1C may be formed over the second lower auxiliary layer 28B-1B. In this case, the mask assembly may be moved again in the first direction from the position of FIG. 16B.

In this case, the (1-2)th opening portion 233A may be arranged to correspond to two third areas A3, the right second area A2, and the right first area A1.

When the mask assembly is arranged as above, the deposition material may be supplied from the deposition source. In this case, the deposition material may be blocked by the (1-2)th mask sheet 233 in the first area A1 and the second area A2 arranged on the left side, and the deposition material that has passed through the (1-2)th opening portion 233A may be deposited over the display substrate D in two third areas A3, the right second area A2, and the right first area A1.

When the third lower auxiliary layer 28B-1C is formed as above, the first lower auxiliary layer 28B-1A, the second lower auxiliary layer 28B-1B, and the third lower auxiliary layer 28B-1C may be sequentially arranged over the pixel electrode 28A in two third areas A3. Also, the second lower auxiliary layer 28B-1B and the third lower auxiliary layer 28B-1C may be sequentially arranged over the pixel electrode 28A in the right second area A2, and the third lower auxiliary layer 28B-1C may be arranged over the pixel electrode 28A in the right first area A1.

However, the above process is not limited thereto. For example, the deposition material may be deposited on the display substrate D by moving the mask assembly by 2N times the width of the pixel instead of moving the mask assembly as above. In other embodiments, the number of pixels corresponding to the (1-2)th opening portion 233A may be smaller or greater than the number of pixels illustrated in FIGS. 16A to 16C. In this case, the number of pixels corresponding to the (1-2)th opening portion 233A may be at least two. In this case, the movement distance of the mask assembly may be variously and suitably adjusted such as N times or 2N times the width of the pixel.

When the deposition material is deposited on the display substrate D while moving the mask assembly as described above, the same deposition material may be deposited by different thicknesses in the respective pixels of the display substrate D. For example, when the deposition material is the auxiliary layer as above, because the thicknesses of the intermediate layers 28B of the respective pixels are different from each other, light of different wavelengths may be emitted in the same light irradiation unit.

Figure 17:
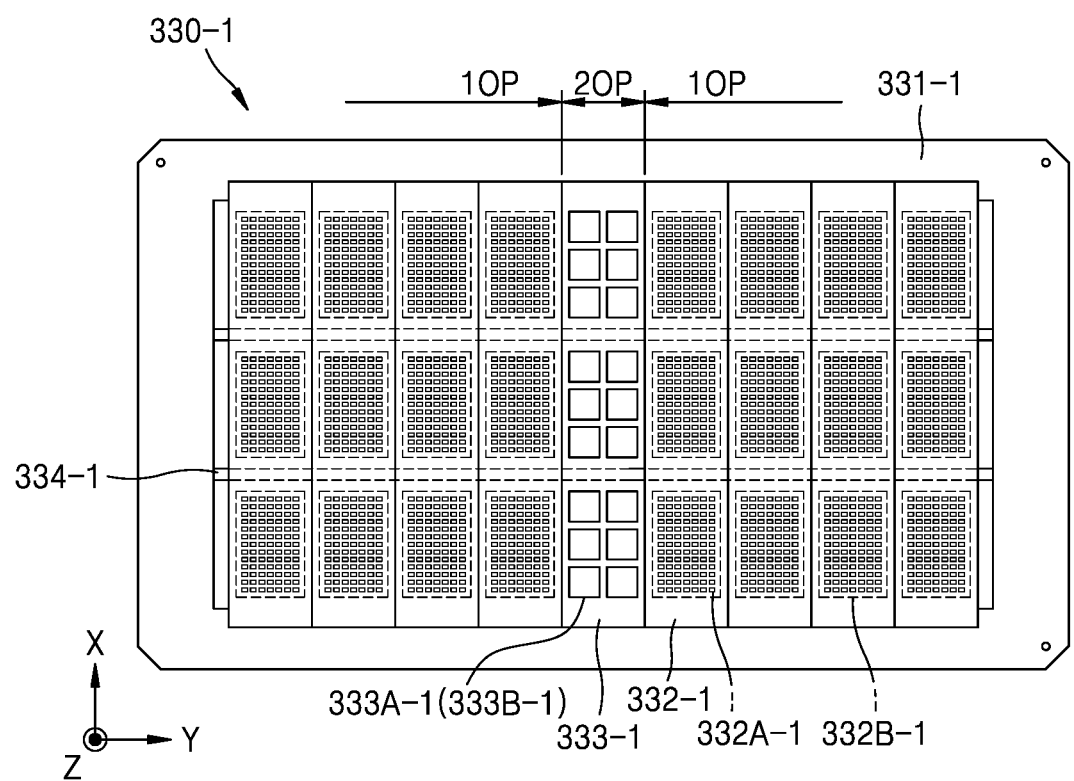
FIG. 17 is a plan view illustrating a (2-1)th mask assembly of a (2-1)th deposition unit illustrated in FIG. 1.

FIG. 17 is a plan view illustrating a (2-1)th mask assembly of a (2-1)th deposition unit 300-1 illustrated in FIG. 1.

Referring to FIG. 17, a (2-1)th mask assembly 330-1 may include a (2-1)th mask frame 331-1, a (1-1)th emission layer mask sheet 332-1, a (1-2)th emission layer mask sheet 333-1, and a (2-1)th support stick 334-1.

A central portion of the (2-1)th mask frame 331-1 may include an opening area, the (1-1)th emission layer mask sheet 332-1 may be arranged in (e.g., arranged on or to overlap) a first opening area 1OP of the opening area, and the (1-2)th emission layer mask sheet 333-1 may be arranged in (e.g., arranged on or to overlap) a second opening area 2OP of the opening area.

The (1-1)th emission layer mask sheet 332-1 may include a (1-1)th emission layer opening portion 332A-1. In this case, a plurality of (1-1)th emission layer opening portions 332A-1 may be arranged apart from each other in a (1-1)th emission layer deposition area 332B-1. Also, the (1-1)th emission layer mask sheet 332-1 may include a plurality of (1-1)th emission layer deposition areas 332B-1, and the plurality of (1-1)th emission layer deposition areas 332B-1 may be arranged apart from each other in the lengthwise direction of the (1-1)th emission layer mask sheet 332-1. In this case, each (1-1)th emission layer deposition area 332B-1 may be an area corresponding to the first plane area 1PA of FIG. 2.

The (1-2)th emission layer mask sheet 333-1 may include a (1-2)th emission layer opening portion 333A-1. In this case, the (1-2)th emission layer opening portion 333A-1 may be formed to correspond to a (1-2)th emission layer deposition area 333B-1. For example, one (1-2)th emission layer deposition area 333B-1 may include one (1-2)th emission layer opening portion 333A-1. In this case, because the (1-2)th emission layer mask sheet 333-1 includes a plurality of (1-2)th emission layer deposition areas 333B-1, a plurality of (1-2)th emission layer opening portions 333A-1 may be arranged apart from each other in the (1-2)th emission layer mask sheet 333-1. In this case, each (1-2)th emission layer opening portion 333A-1 may have a shape corresponding to the emission area DA illustrated in FIG. 6, and the deposition material that has passed through the (1-2)th emission layer opening portion 333A-1 may cover the entire emission area DA illustrated in FIG. 6.

In the above case, the size of the planar shape of the (1-2)th emission layer opening portion 333A-1 may be greater than the size of the planar shape of the (1-1)th emission layer opening portion 332A-1.

The (2-1)th support stick 334-1 may be arranged in the opening area of the (2-1)th mask frame 331-1 to divide the opening area into two or more areas. In this case, the (2-1)th support stick 334-1 may be arranged the same as or similarly to the first support stick 234 as described above.

By utilizing (e.g., using) the (2-1)th mask assembly 330-1 described above, a lower auxiliary layer may be formed over the process substrate MS, and then a first organic emission layer may be formed over the lower auxiliary layer. In this case, a plurality of first organic emission layers may be arranged apart from each other in the first plane area 1PA of the first area 1A of the process substrate MS of FIG. 2 and may be formed to cover the entire second plane area 2PA in the second plane area 2PA of the second area 2A of the process substrate MS of FIG. 2.

Figure 18:
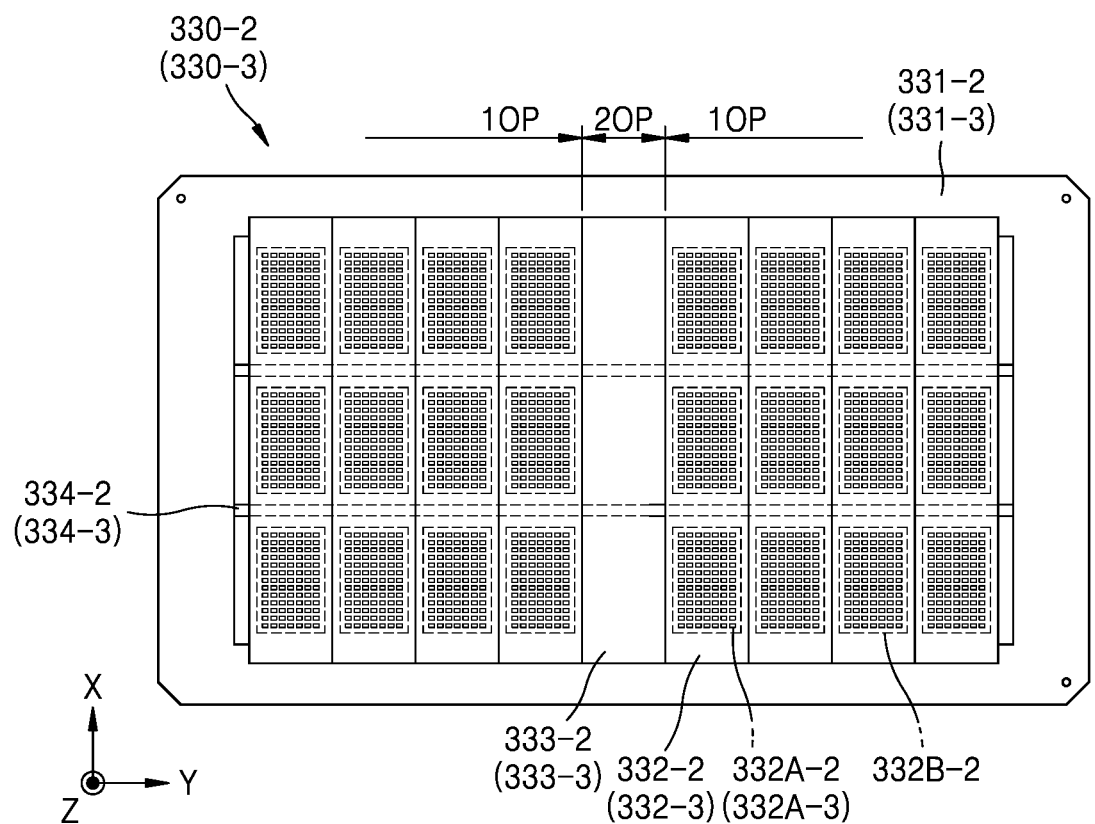
FIG. 18 is a plan view illustrating a (2-2)th mask assembly of a (2-2)th deposition unit or a (2-3)th mask assembly of a (2-3)th deposition unit illustrated in FIG. 1.

FIG. 18 is a plan view illustrating a (2-2)th mask assembly of a (2-2)th deposition unit or a (2-3)th mask assembly of a (2-3)th deposition unit illustrated in FIG. 1.

Referring to FIG. 18, a (2-2)th mask assembly 330-2 and a (2-3)th mask assembly 330-3 may be the same as or similar to each other. Hereinafter, for convenience of description, a more detailed description will be given mainly of the (2-2)th mask assembly 330-2.

The (2-2)th mask assembly 330-2 may include a (2-2)th mask frame 331-2, a (2-1)th emission layer mask sheet 332-2, a (2-2)th emission layer mask sheet 333-2, and a (2-2)th support stick 334-2. In this case, because the (2-2)th mask frame 331-2 is the same as or similar to the first mask frame 231 described in FIGS. 9 and 10, redundant descriptions thereof may not be provided for conciseness.

A central portion of the (2-2)th mask frame 331-2 may include an opening area, the (2-1)th emission layer mask sheet 332-2 may be arranged in a first opening area 1OP of the opening area, and the (2-2)th emission layer mask sheet 333-2 may be arranged in a second opening area 2OP of the opening area.

The (2-1)th emission layer mask sheet 332-2 may include a (2-1)th emission layer opening portion 332A-2. In this case, a plurality of (2-1)th emission layer opening portions 332A-2 may be provided, and the plurality of (2-1)th emission layer opening portions 332A-2 may be arranged in a (2-1)th emission layer deposition area 332B-2 in a certain pattern with each other.

The (2-2)th emission layer mask sheet 333-2 may not include an opening portion such that the deposition material may not pass therethrough. In this case, the (2-2)th emission layer mask sheet 333-2 may be formed in a plate shape and arranged in the second opening area 2OP of the (2-2)th mask frame 331-2.

In the above case, the (2-2)th support stick 334-2 may be arranged at the (2-2)th mask frame 331-2 to divide the (2-2)th opening area (e.g., the opening area of the (2-2)th mask frame 331-2) into two or more opening areas. In this case, because the arrangement method of the (2-2)th support stick 334-2 is the same as or similar to that described in FIGS. 9 and 10, redundant descriptions thereof may not be provided for conciseness.

Moreover, like the (2-2)th mask assembly 330-2, the (2-3)th mask assembly 330-3 may include a (2-3)th mask frame 331-3, a (3-1)th emission layer mask sheet 332-3, a (3-2)th emission layer mask sheet 333-3, and a (2-3)th support stick 334-3. In this case, the (2-3)th mask frame 331-3 may include a (2-3)th opening area, and the (3-1)th emission layer mask sheet 332-3 may include a (3-1)th emission layer opening portion 332A-3.

In the above case, the (2-3)th mask frame 331-3 and the (2-3)th support stick 334-3 may be the same as or similar to the (2-2)th mask frame 331-2 and the (2-2)th support stick 334-2 described above. Also, the (3-1)th emission layer mask sheet 332-3 and the (3-2)th emission layer mask sheet 333-3 may be similar to the (2-1)th emission layer mask sheet 332-2 and the (2-2)th emission layer mask sheet 333-2. In this case, the position of the (3-1)th emission layer opening portion 332A-3 may be different from the position of the (2-1)th emission layer opening portion 332A-2. For example, when the (3-1)th emission layer mask sheet 332-3 and the (2-1)th emission layer mask sheet 332-2 overlap each other, the (3-1)th emission layer opening portion 332A-3 and the (2-1)th emission layer opening portion 332A-2 may not overlap each other in the plan view.

In the case of utilizing (e.g., using) the (2-2)th mask assembly 330-2 and the (2-3)th mask assembly 330-3 described above, a second organic emission layer and a third organic emission layer may be formed in the first area 1A of the process substrate MS of FIG. 2, whereas a second organic emission layer and a third organic emission layer may not be formed in the second area 2A of the process substrate MS of FIG. 2. In this case, over the process substrate MS that has passed through the (2-1)th to (2-3)th deposition units 300-1 to 300-3, the first organic emission layer, the second organic emission layer, and the third organic emission layer may be arranged over each first plane area 1PA in the first area 1A of the process substrate MS, whereas only the first organic emission layer may be arranged over the second plane area 2PA of the second area 2A of the process substrate MS. In this case, the first organic emission layer, the second organic emission layer, and the third organic emission layer arranged in the first area 1A may be arranged apart from each other over the first plane area 1PA.

Figure 19:
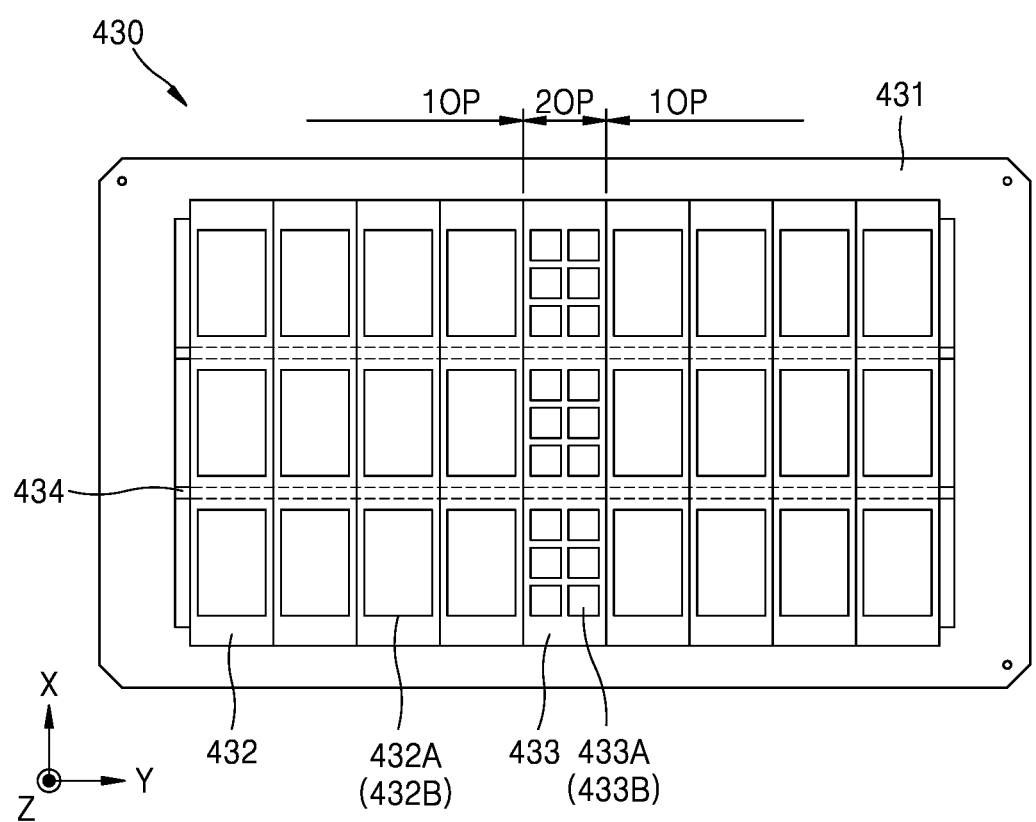
FIG. 19 is a plan view illustrating a third mask assembly of a third deposition unit illustrated in FIG. 1.

FIG. 19 is a plan view illustrating a third mask assembly of a third deposition unit illustrated in FIG. 1.

Referring to FIG. 19, a third mask assembly 430 may include a third mask frame 431, a (3-1)th mask sheet 432, a (3-2)th mask sheet 433, and a third support stick 434. In this case, the third mask frame 431 may be formed the same as or similarly to the first mask frame 231 illustrated in FIG. 9.

A central portion of the third mask frame 431 may include an opening area, the (3-1)th mask sheet 432 may be arranged in a first opening area 1OP of the opening area, and the (3-2)th mask sheet 433 may be arranged in a second opening area 2OP of the opening area.

The (3-1)th mask sheet 432 may include (3-1)th opening portions 432A arranged apart from each other. In this case, the (3-1)th opening portion 432A may have a shape corresponding to the first plane area 1PA illustrated in FIG. 2. In this case, the (3-1)th opening portion 432A may be formed to be the same as or similar to the entire (3-1)th deposition area 432B.

The (3-2)th mask sheet 433 may include (3-2)th opening portions 433A arranged apart from each other. In this case, the size of the planar shape of the (3-2)th opening portion 433A may be smaller than the size of the planar shape of the (3-1)th opening portion 432A. In this case, the (3-2)th opening portion 433A may have a size corresponding to the second plane area 2PA illustrated in FIG. 2.

The third mask assembly 430 described above may be utilized (e.g., used) in the third deposition unit 400 illustrated in FIG. 1. In this case, an upper auxiliary layer may be formed to cover the entire first plane area 1PA and the entire second plane area 2PA of FIG. 2.

In the above case, a plurality of upper auxiliary layers may be provided. In this case, the upper auxiliary layers may include (e.g., be) different materials, and a plurality of third deposition units 400 may be provided to form different upper auxiliary layers in the third deposition units 400. In this case, the third mask assembly 430 may be separately provided in each third deposition unit 400. In other embodiments, a plurality of upper auxiliary layers may be separately formed in one third deposition unit 400. In this case, one third mask assembly 430 may be provided in the third deposition unit 400 and may be continuously utilized (e.g., used), and the type (e.g., kind) of the deposition material received in the deposition source of the third deposition unit 400 may be replaced or the deposition source itself may be replaced.

Figure 20:
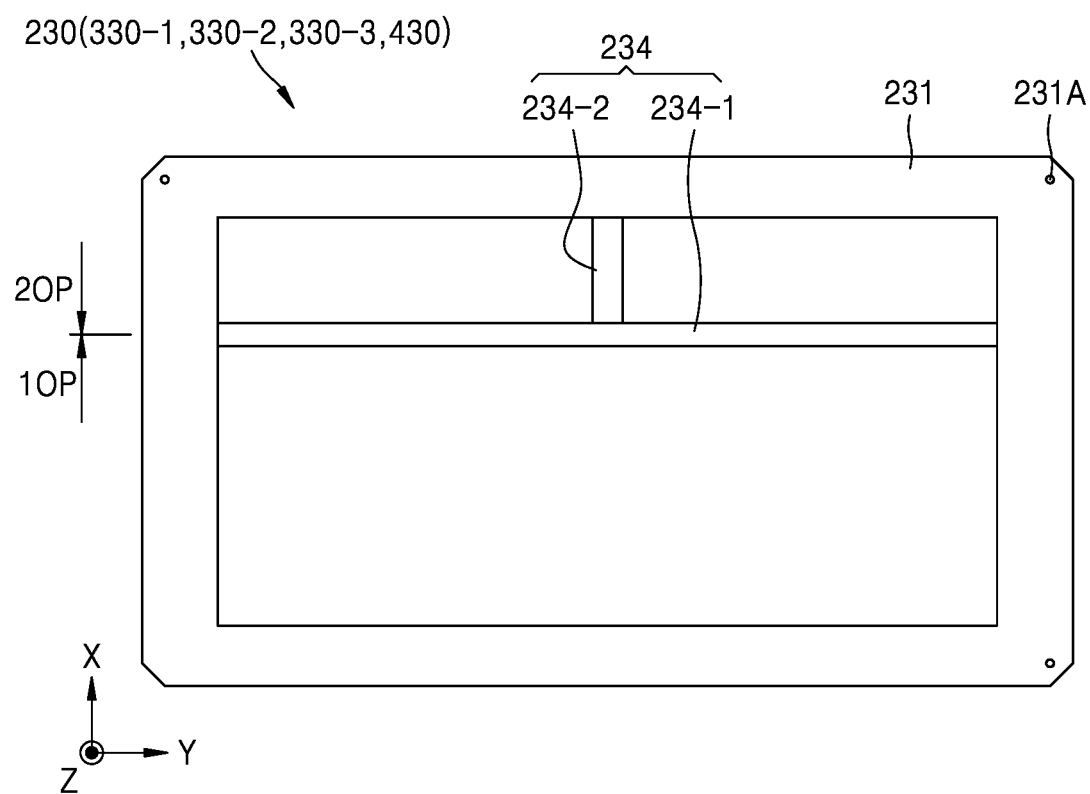
FIG. 20 is a plan view illustrating a portion of a mask assembly of a display apparatus manufacturing apparatus according to other embodiments.

FIG. 20 is a plan view illustrating a portion of a mask assembly of a display apparatus manufacturing apparatus according to other embodiments.

Referring to FIG. 20, an opening area of a mask frame included in each mask assembly of the display apparatus manufacturing apparatus may be divided into two or more opening areas by a support stick. In this case, because methods of dividing the opening area of each of the first mask frame 231, the (2-1)th mask frame 331-1, the (2-2)th mask frame 331-2, the (2-3)th mask frame 331-3, and the third mask frames 431 described above are the same as or similar to each other, a more detailed description will hereinafter be given mainly of a method of dividing the opening areas of the first mask frame 231.

The opening area of the first mask frame 231 may be divided into a plurality of opening areas by the first support stick 234. In this case, the first support stick 234 may include a first stick 234-1 arranged in a first direction (e.g., one selected from the X axis direction and the Y axis direction in FIG. 20) and a second stick 234-2 arranged in a second direction (e.g., the other selected from the X axis direction and the Y axis direction in FIG. 20).

In the above case, the first stick 234-1 may be longer than the second stick 234-2. For example, the first sticks 234-1 may be arranged in (e.g., extend along) the long-side direction of the first mask frame 231. In this case, the first stick 234-1 may divide the opening area into two opening areas. Also, the second stick 234-2 may be arranged in (e.g., extend along) the second direction (e.g., the short-side direction of the first mask frame 231) in a portion having a small area in the opening area divided by the first stick 234-1. In this case, the opening area may be divided into a first opening area 1OP and a second opening area 2OP. In this case, the area of the first opening area 1OP may be greater than the area of the second opening area 2OP.

In the above case, the (1-1)th mask sheet 232 may be arranged in the first opening area 1OP, and the (1-2)th mask sheet 233 may be arranged in the second opening area 2OP. For example, the (1-1)th mask sheet 232 may be arranged such that the lengthwise direction of the (1-1)th mask sheet 232 is the same as the second direction. Also, the (1-2)th mask sheet 233 may be arranged such that the lengthwise direction of the (1-2)th mask sheet 233 is the same as the first direction. In the above case, the ends of the (1-1)th mask sheet 232 may be respectively fixed to the first mask frame 231 and the first stick 234-1, and the ends of the (1-2)th mask sheet 233 may be fixed to the second stick 234-2 and the first mask frame 231.

In the above case, the second stick 234-2 may be coupled (e.g., connected) to a central portion of the first stick 234-1 in the lengthwise direction thereof. In this case, the (1-1)th mask sheet 232 may be fixed to the first mask frame 231 and the first stick 234-1 in a tensioned state, and thus the first stick 234-1 may be deformed. In this case, the second stick 234-2 may be coupled (e.g., connected) to the first stick 234-1 to reduce the deformation of the first stick 234-1.

The first stick 234-1 and the second stick 234-2 described above are not limited thereto and may be arranged in various suitable directions to divide the first opening area 1OP into various suitable areas.

Thus, various suitable display apparatuses may be manufactured over one process substrate by efficiently dividing the opening area of each mask frame in each mask assembly.

Figure 21A:
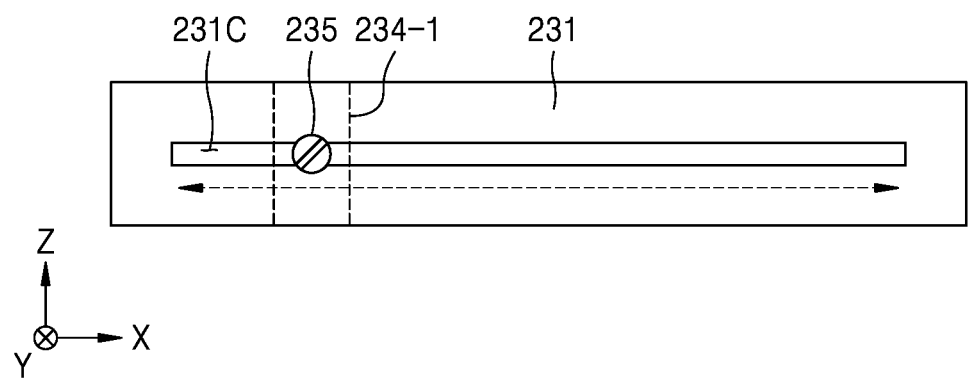
FIGS. 21A-21C are side views illustrating embodiments of the connection relationship between a mask frame and a first stick illustrated in FIG. 20.
Figure 21B:
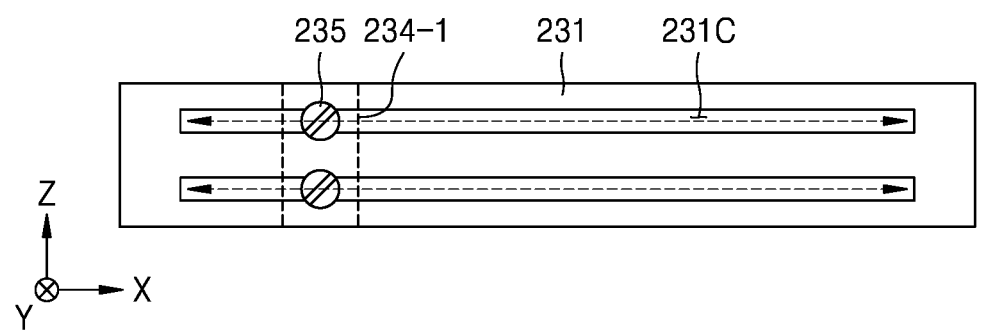
Figure 21C:
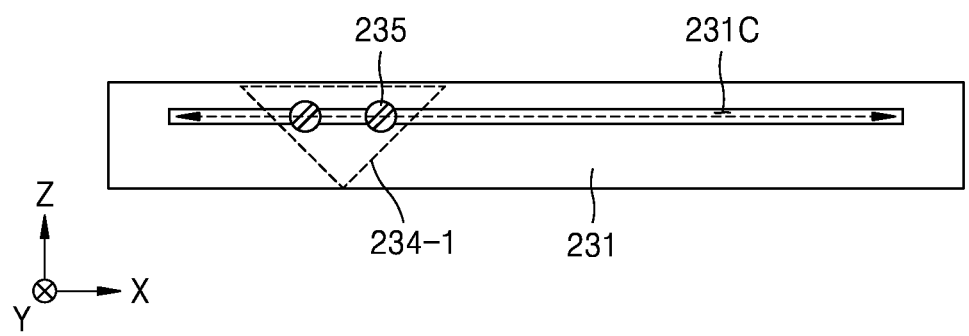

FIGS. 21A to 21C are side views illustrating embodiments of the connection relationship between a first mask frame and a first stick illustrated in FIG. 20.

Referring to FIGS. 21A to 21C, the first mask frame 231 and the first stick 234-1 illustrated in FIG. 20 may be coupled (e.g., connected) in various suitable ways.

For example, as illustrated in FIG. 21A, a first coupling unit 231C may be arranged at the side surface of the first mask frame 231. In this case, the first coupling unit 231C may be formed in the shape of a long hole. In this case, a first coupling member 235 may be inserted into the first coupling unit 231C. The first coupling member 235 may include a bolt, a pin, and/or the like. In this case, the first coupling member 235 is not limited thereto and may include any device and any structure that may be inserted into the first coupling unit 231C to couple (e.g., connect) the first mask frame 231 to the first stick 234-1.

A plurality of first coupling units 231C may be provided as illustrated in FIG. 21B. In this case, a plurality of first coupling members 235 may be provided, and each first coupling member 235 may be inserted into each first coupling unit 231C to fix the first mask frame 231 and the first stick 234-1.

Moreover, the first coupling unit 231C may be formed as illustrated in FIG. 21C. In this case, the first stick 234-1 may have a triangular cross-section normal (e.g., perpendicular) to the lengthwise direction thereof. In this case, the first coupling unit 231C may be arranged at an upper portion of the side surface of the first mask frame 231 to be coupled to a wide portion of the cross-section of the first stick 234-1. In this case, the first stick 234-1 may not block the movement path of the deposition material during the deposition process.

FIGS. 22A to 22D are side views illustrating embodiments of the connection relationship between the first stick and a second stick illustrated in FIG. 20.

Referring to FIGS. 22A to 22D, the first stick 234-1 and the second stick 234-2 may be formed the same as or similarly to the method of coupling (e.g., connecting) the first stick 234-1 to the first mask frame 231.

Figure 22A:
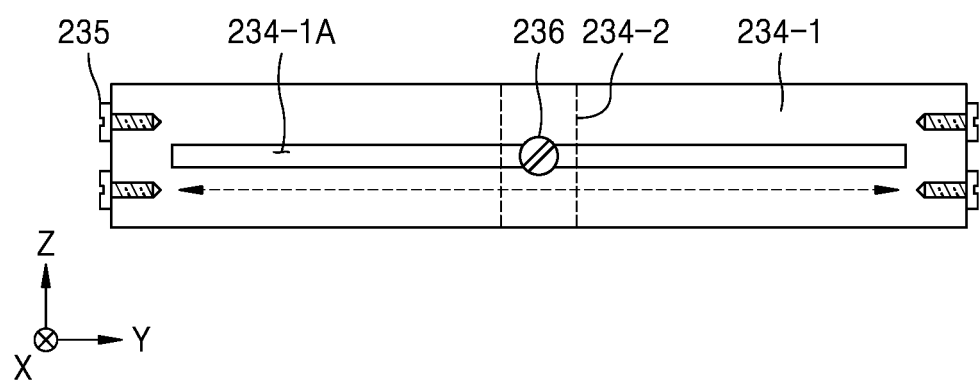
FIGS. 22A-22D are side views illustrating embodiments of the connection relationship between the first stick and a second stick illustrated in FIG. 20.
Figure 22B:
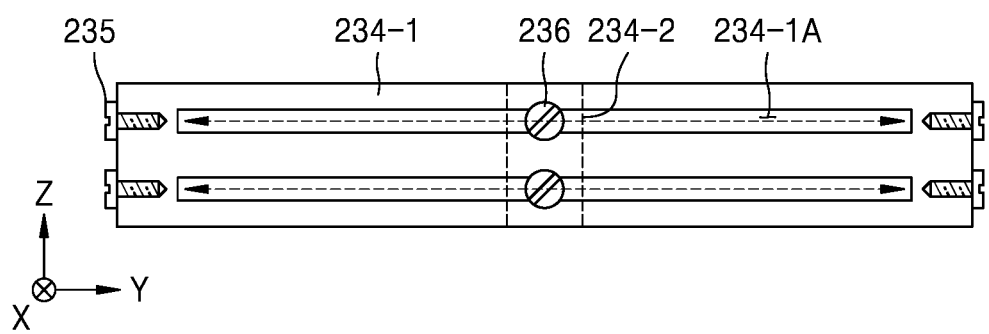
Figure 22C:
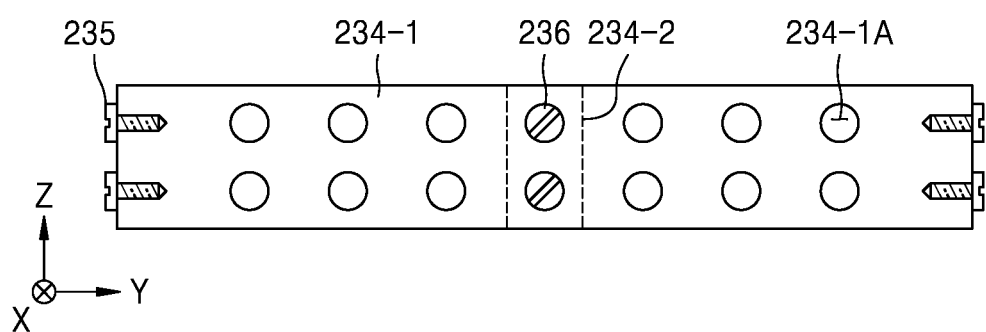
Figure 22D:
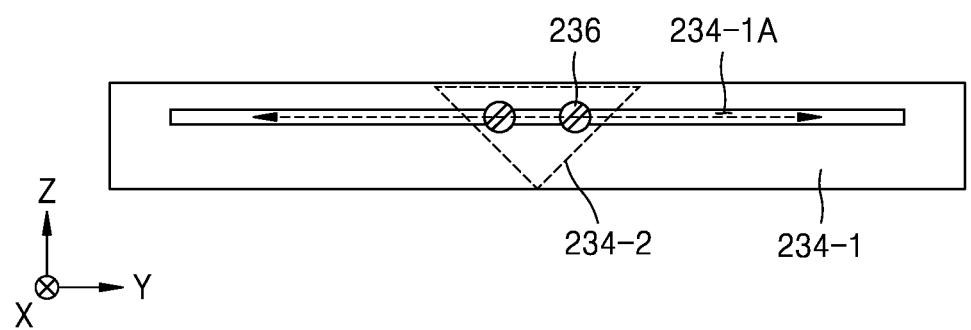

For example, a second coupling unit 234-1A may be arranged at (e.g., in) the first stick 234-1 and the first mask frame 231. In this case, the second coupling unit 234-1A may be a slot-shaped hole as illustrated in FIG. 22A. Also, a plurality of second coupling units 234-1A may be provided as illustrated in FIG. 22B. Also, the second coupling unit 234-1A may be hole-shaped as illustrated in FIG. 22C. In this case, the second coupling unit 234-1A may include a plurality of holes spaced apart from each other. As illustrated in FIG. 22D, the second coupling unit 234-1A may include slot-shaped holes at an upper portion of the first stick 234-1 and an upper portion of the side surface of the first mask frame 231. In this case, the second stick 234-2 may have a triangular cross-section normal (e.g., perpendicular) to the lengthwise direction thereof.

A second coupling member 236 may be inserted into the second coupling unit 234-1A to fix the first stick 234-1 and the second stick 234-2, or to fix the first mask frame 231 and the second stick 234-2. In this case, the second coupling member 236 may be formed to be the same as or similar to the first coupling member 235.

Figure 23:
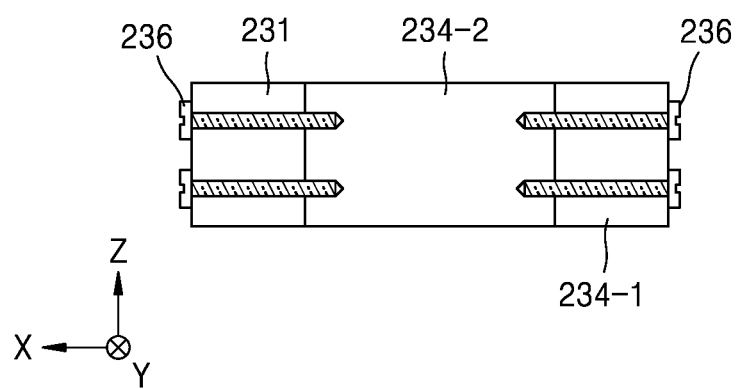
FIG. 23 is a cross-sectional view illustrating the connection relationship between the first stick and the second stick and between the second stick and the mask frame illustrated in FIG. 20.

FIG. 23 is a cross-sectional view illustrating the connection relationship between the first stick and the second stick and between the second stick and the first mask frame illustrated in FIG. 20.

Referring to FIG. 23, the first stick 234-1 and the second stick 234-2 may be coupled (e.g., connected) through the second coupling member 236 as described above. In this case, the second coupling unit 234-1A illustrated in FIGS. 22A to 22D may be formed at the first stick 234-1. Also, the second stick 234-2 and the first mask frame 231 may be coupled (e.g., connected) through the second coupling member 236. In this case, the second coupling unit 234-1A illustrated in FIGS. 22A to 22D may be formed at the first mask frame 231.

In the above case, the second coupling member 236 may be inserted into the second coupling unit 234-1A to couple (e.g., connect) the first stick 234-1 to the second stick 234-2 and to firmly couple (e.g., connect) the second stick 234-2 to the first mask frame 231.

Figure 24:
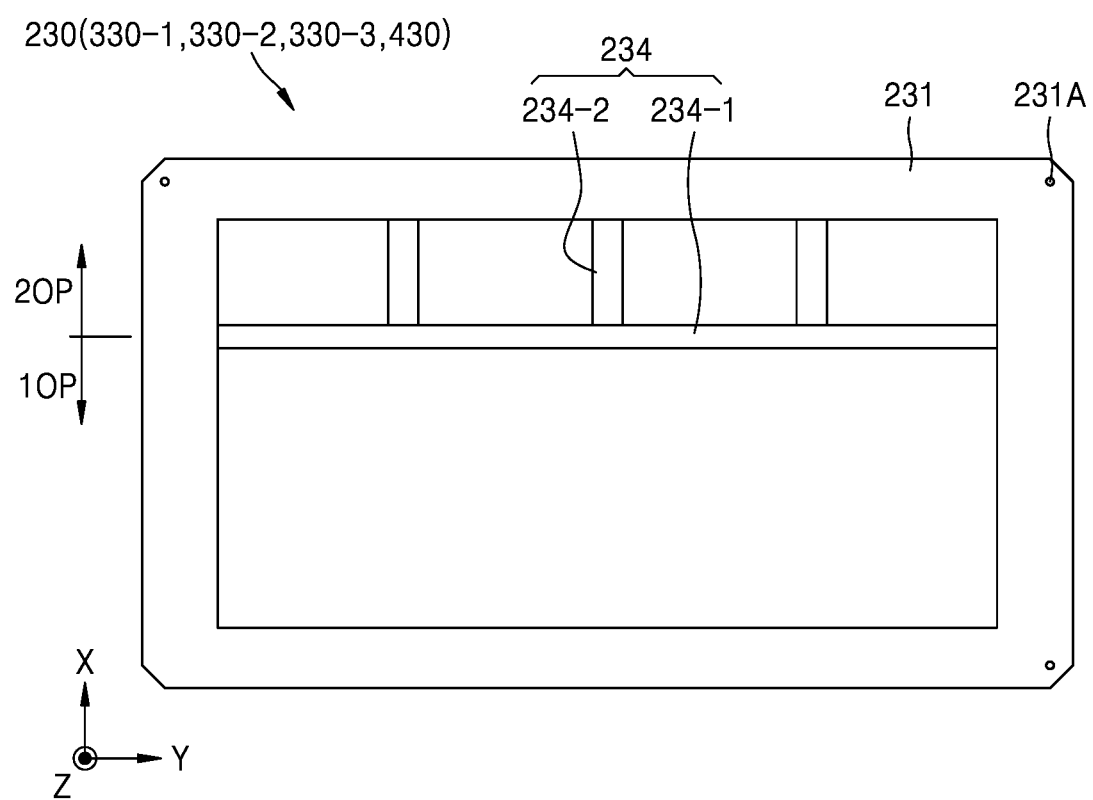
FIG. 24 is a plan view illustrating a portion of a mask assembly of a display apparatus manufacturing apparatus according to other embodiments.

FIG. 24 is a plan view illustrating a portion of a mask assembly of a display apparatus manufacturing apparatus according to other embodiments.

Referring to FIG. 24, an opening area of a mask frame included in each mask assembly of the display apparatus manufacturing apparatus may be divided into two or more opening areas by a support stick. In this case, because methods of dividing the opening area of each of the first mask frame 231, the (2-1)th mask frame 331-1, the (2-2)th mask frame 331-2, the (2-3)th mask frame 331-3, and the third mask frame 431 described above are the same as or similar to each other, a more detailed description will hereinafter be given mainly of a method of dividing the opening areas of the first mask frame 231.

The first mask assembly 230 may include a first mask frame 231, a (1-1)th mask sheet, a (1-2)th mask sheet, and a first support stick 234. In this case, because the first mask frame 231, the (1-1)th mask sheet, and the (1-2)th mask sheet are the same as or similar to those described above, redundant descriptions thereof may not be provided for conciseness.

The first support stick 234 may include a first stick 234-1 and a second stick 234-2. In this case, the first stick 234-1 may be arranged in (e.g., extend along) the opening area in the first direction (e.g., Y axis direction). In some embodiments, a plurality of first sticks 234-1 may be provided, and the plurality of first sticks 234-1 may be arranged apart from each other in the second direction (e.g., X axis direction). For example, the plurality of first sticks 234-1 may be spaced apart from each other in the plan view and may be arranged with each other along the second direction.

The second stick 234-2 may be arranged between the first stick 234-1 and the first mask frame 231 in the second direction. In this case, the second stick 234-2 may define the second opening area 2OP together with the first mask frame 231 and the first stick 234-1. In the above case, a plurality of second sticks 234-2 may be provided, and the plurality of second sticks 234-2 may be arranged apart from each other in the first direction. For example, the plurality of second sticks 234-2 may extend along the second direction, may be spaced apart from each other in the plan view, and may be arranged with each other along the first direction.

In the above case, the second stick 234-2 may support the first stick 234-1 by being coupled (e.g., connected) to the first stick 234-1 at various suitable positions.

With respect to the first stick 234-1 and the second stick 234-2 described above, the ends of the (1-1)th mask sheet 232 and/or the (1-2)th mask sheet 233 may be fixed. In this case, the (1-1)th mask sheet 232 and/or the (1-2)th mask sheet 233 may be arranged at the first stick 234-1 and/or the second stick 234-2 through welding and/or the like.

In the above case, the (1-1)th mask sheet 232 may be arranged in one selected from the first opening area 1OP and the second opening area 2OP. Also, the (1-2)th mask sheet 233 may be arranged in the other selected from the first opening area 1OP and the second opening area 2OP. In this case, because the respective mask sheets include different opening portions, different types (e.g., kinds) of display apparatuses may be manufactured in the respective areas of the process substrate MS.

Figure 25:
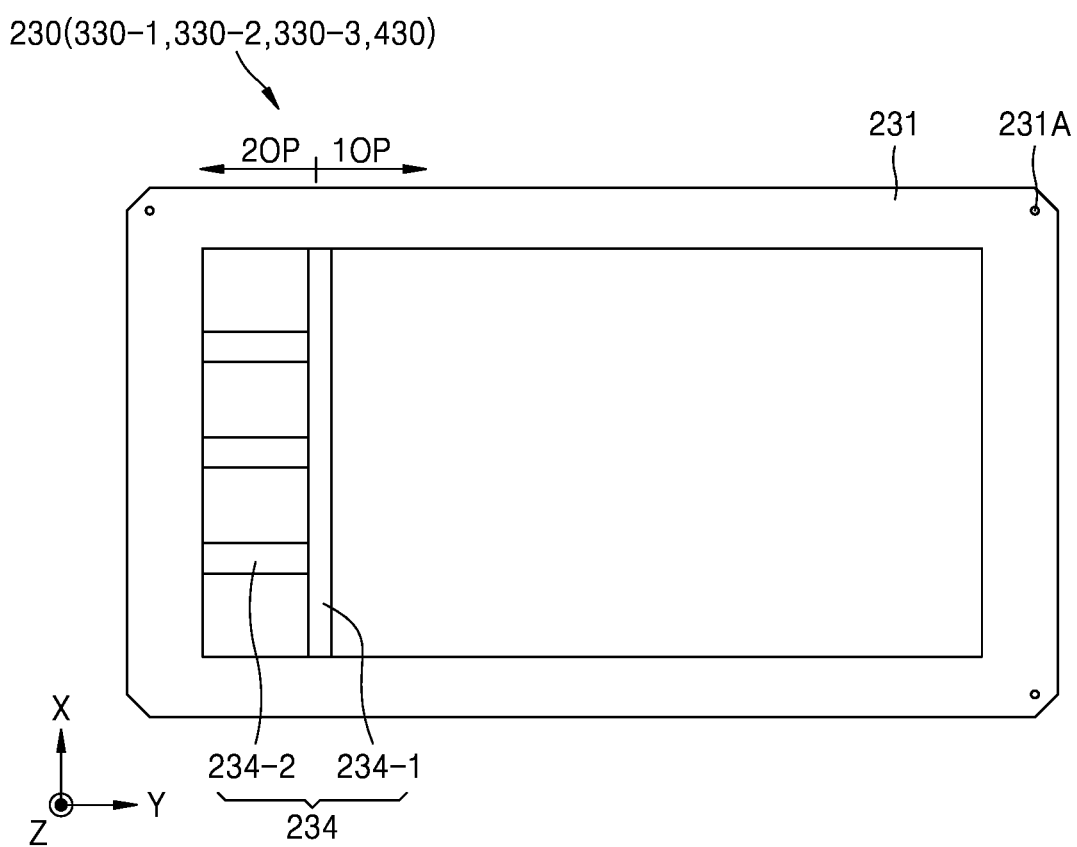
FIG. 25 is a plan view illustrating a portion of a mask assembly of a display apparatus manufacturing apparatus according to other embodiments.

FIG. 25 is a plan view illustrating a portion of a mask assembly of a display apparatus manufacturing apparatus according to other embodiments.

Referring to FIG. 25, an opening area of a mask frame included in each mask assembly of the display apparatus manufacturing apparatus may be divided into two or more opening areas by a support stick. In this case, because methods of dividing the opening area of each of the first mask frame 231, the (2-1)th mask frame 331-1, the (2-2)th mask frame 331-2, the (2-3)th mask frame 331-3, and the third mask frame 431 described above are the same as or similar to each other, a more detailed description will hereinafter be given mainly of a method of dividing the opening areas of the first mask frame 231.

The first mask assembly 230 may include a first mask frame 231, a (1-1)th mask sheet, a (1-2)th mask sheet, and a first support stick 234. In this case, because the first mask frame 231, the (1-1)th mask sheet, and the (1-2)th mask sheet are the same as or similar to those described above, redundant descriptions thereof may not be provided for conciseness.

The first support stick 234 may include a first stick 234-1 and a second stick 234-2. In this case, the first stick 234-1 may be formed to be similar to that described in FIG. 24. The first stick 234-1 may be arranged in the second direction.

The second sticks 234-2 may be arranged in the first direction and may be provided in plurality. In this case, when there are an odd number of three or more second sticks 234-2, with respect to the second stick 234-2 arranged at a center portion of the short side of the first mask frame 231 among the plurality of second sticks 234-2, the others of the plurality of second sticks 234-2 may be arranged to be symmetrical to each other (e.g., reflectively symmetrical with respect to the second stick 234-2 arranged at the center portion of the short side of the first mask frame 231).

In the above case, the second stick 234-2 may reduce the deformation of a center portion of the first stick 234-1 and may also support the first stick 234-1 with respect to the entire lengthwise direction of the first stick 234-1.

With respect to the first stick 234-1 and the second stick 234-2 described above, the ends of the (1-1)th mask sheet 232 and/or the (1-2)th mask sheet 233 may be fixed. In this case, the (1-1)th mask sheet 232 and/or the (1-2)th mask sheet 233 may be arranged at the first stick 234-1 and/or the second stick 234-2 through welding and/or the like.

In the above case, the (1-1)th mask sheet 232 may be arranged in one selected from the first opening area 1OP and the second opening area 2OP. Also, the (1-2)th mask sheet 233 may be arranged in the other selected from the first opening area 1OP and the second opening area 2OP. In this case, because the respective mask sheets include different opening portions (e.g., cover or overlap different opening portions), different types (e.g., kinds) of display apparatuses may be manufactured in the respective areas of the process substrate MS.

Figure 26:
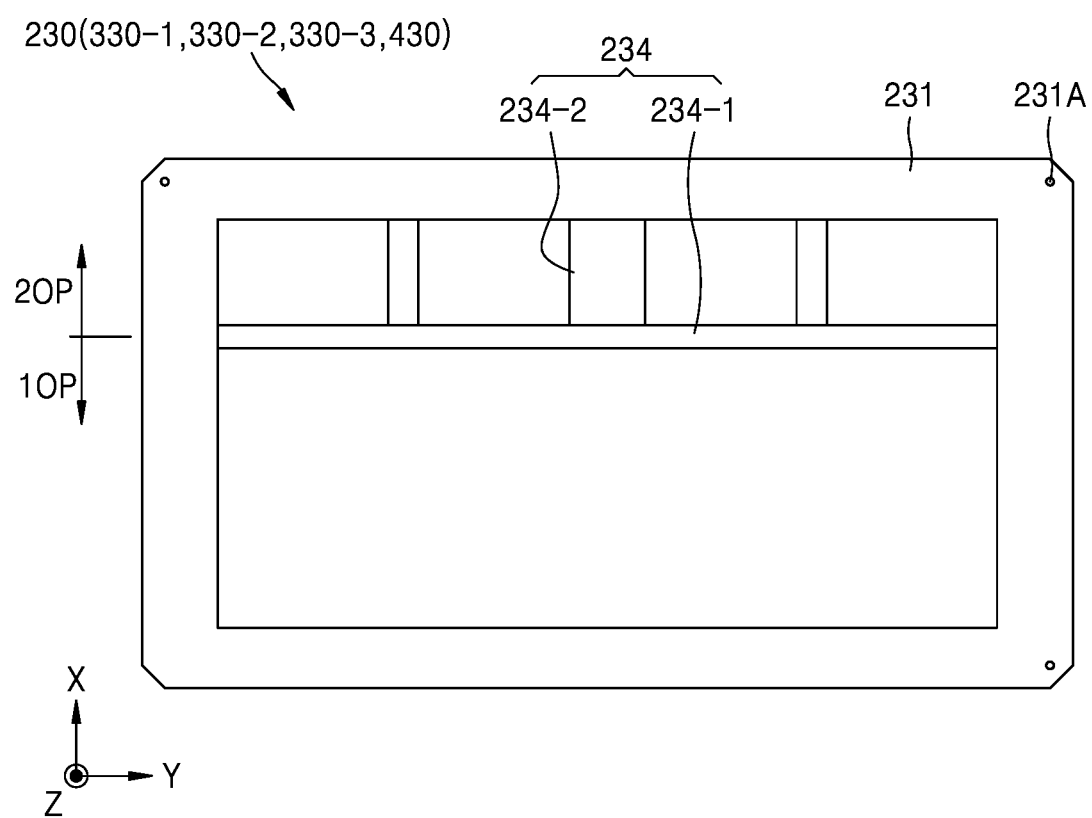
FIG. 26 is a plan view illustrating a portion of a mask assembly of a display apparatus manufacturing apparatus according to other embodiments.

FIG. 26 is a plan view illustrating a portion of a mask assembly of a display apparatus manufacturing apparatus according to other embodiments.

Referring to FIG. 26, an opening area of a mask frame included in each mask assembly of the display apparatus manufacturing apparatus may be divided into two or more opening areas by a support stick. In this case, because methods of dividing the opening area of each of the first mask frame 231, the (2-1)th mask frame 331-1, the (2-2)th mask frame 331-2, the (2-3)th mask frame 331-3, and the third mask frame 431 described above are the same as or similar to each other, a more detailed description will hereinafter be given mainly of a method of dividing the opening areas of the first mask frame 231.

The first mask assembly 230 may include a first mask frame 231, a (1-1)th mask sheet, a (1-2)th mask sheet, and a first support stick 234. In this case, because the first mask frame 231, the (1-1)th mask sheet, and the (1-2)th mask sheet are the same as or similar to those described above, redundant descriptions thereof may not be provided for conciseness.

The first support stick 234 may include a first stick 234-1 and a second stick 234-2. In this case, the first stick 234-1 may be formed to be the same as or similar to that described in FIG. 24.

A plurality of second sticks 234-2 may be provided. In this case, when there are an odd number of three or more second sticks 234-2, the width of the second stick 234-2 arranged at the center of the long side of the first mask frame 231 among the plurality of second sticks 234-2 may be greater than the width of the others of the plurality of second sticks 234-2. Also, with respect to the second stick 234-2 arranged at a center portion of the long side of the first mask frame 231 among the plurality of second sticks 234-2, the others of the plurality of second sticks 234-2 may be arranged to be symmetrical to each other.

In the above case, the second stick 234-2 may reduce the deformation of a center portion of the first stick 234-1 and may also support the first stick 234-1 with respect to the entire lengthwise direction of the first stick 234-1.

With respect to the first stick 234-1 and the second stick 234-2 described above, the ends of the (1-1)th mask sheet 232 and/or the (1-2)th mask sheet 233 may be fixed. In this case, the (1-1)th mask sheet 232 and/or the (1-2)th mask sheet 233 may be arranged at the first stick 234-1 and/or the second stick 234-2 through welding and/or the like.

In the above case, the (1-1)th mask sheet 232 may be arranged in one selected from the first opening area 1OP and the second opening area 2OP. Also, the (1-2)th mask sheet 233 may be arranged in the other selected from the first opening area 1OP and the second opening area 2OP. In this case, because the respective mask sheets include different opening portions, different types (e.g., kinds) of display apparatuses may be manufactured in the respective areas of the process substrate MS.

Figure 27A:
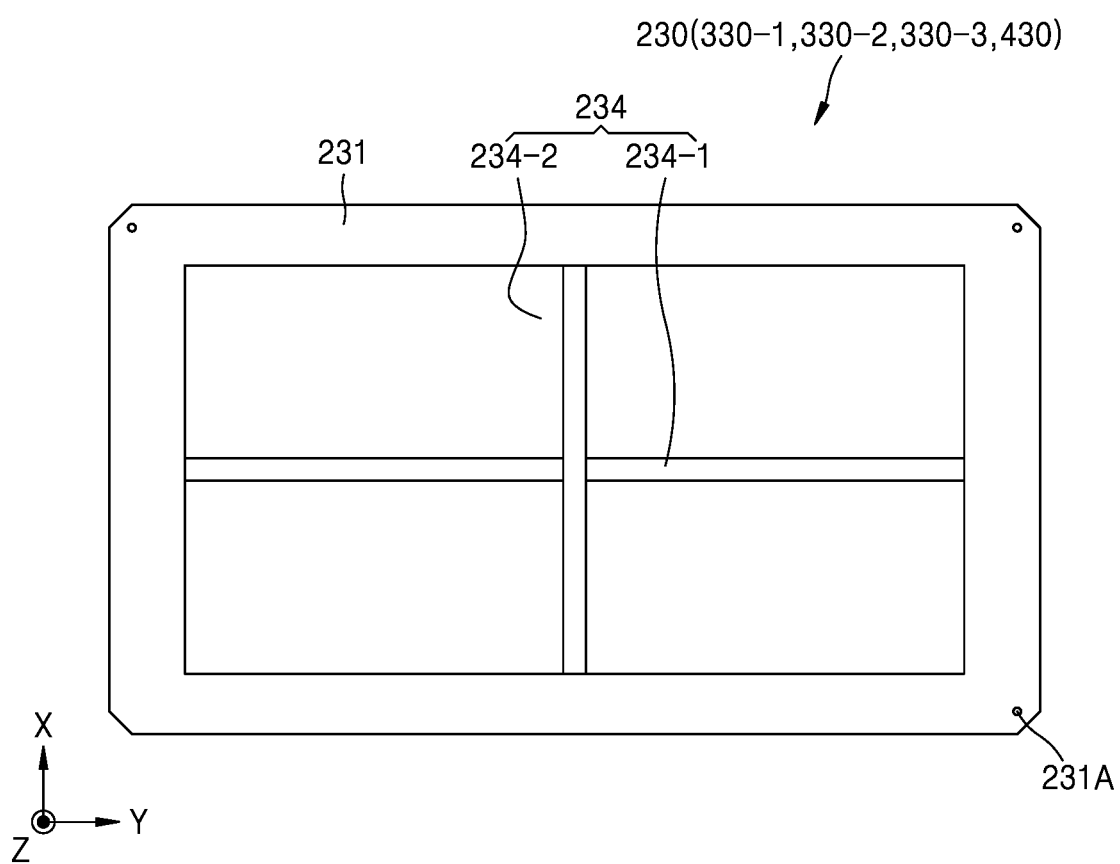
FIG. 27A is a plan view illustrating a portion of a mask assembly of a display apparatus manufacturing apparatus according to other embodiments.
Figure 27B:
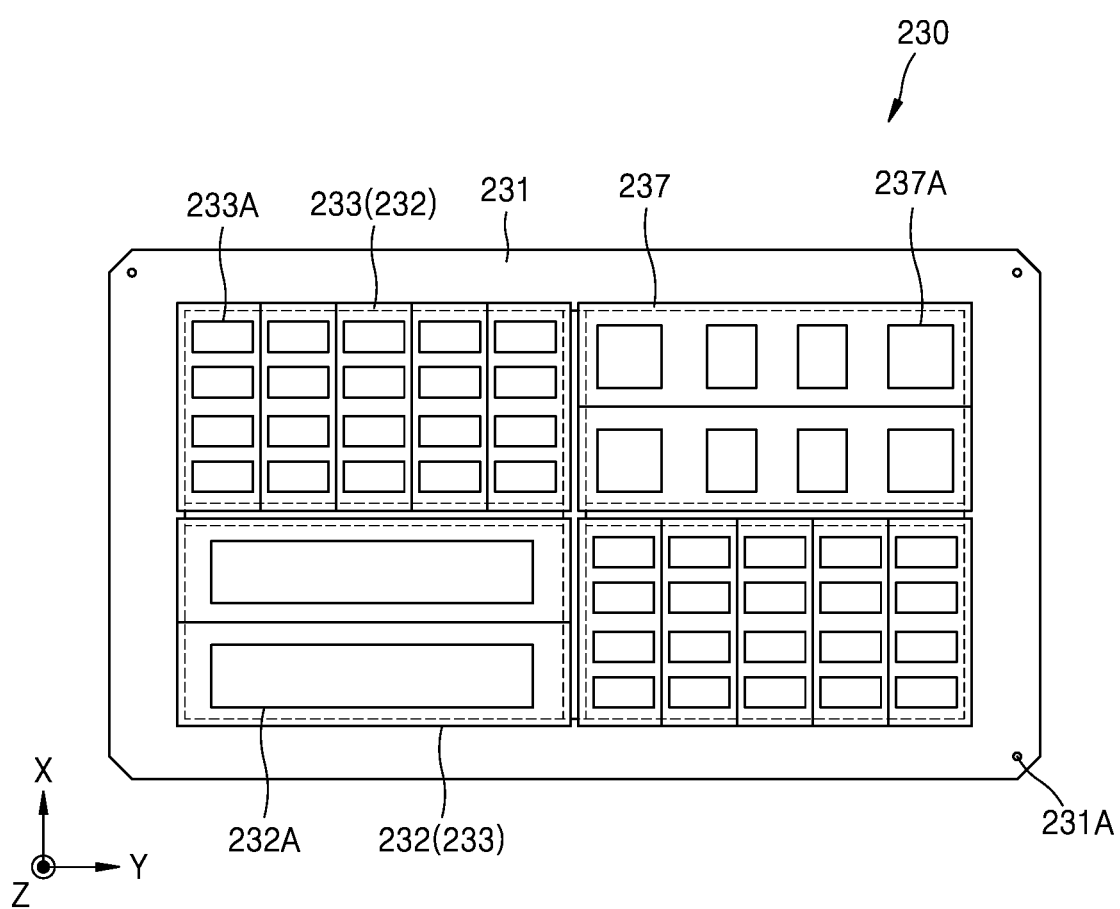
FIG. 27B is a plan view illustrating a portion of the mask assembly illustrated in FIG. 27A.

FIG. 27A is a plan view illustrating a portion of a mask assembly of a display apparatus manufacturing apparatus according to other embodiments. FIG. 27B is a plan view illustrating a portion of the mask assembly illustrated in FIG. 27A.

Referring to FIGS. 27A and 27B, an opening area of a mask frame included in each mask assembly of the display apparatus manufacturing apparatus may be divided into two or more opening areas by a support stick. In this case, because methods of dividing the opening area of each of the first mask frame 231, the (2-1)th mask frame 331-1, the (2-2)th mask frame 331-2, the (2-3)th mask frame 331-3, and the third mask frame 431 described above are the same as or similar to each other, a more detailed description will hereinafter be given mainly of a method of dividing the opening areas of the first mask frame 231.

The first mask assembly 230 may include a first mask frame 231, a (1-1)th mask sheet 232, a (1-2)th mask sheet 233, a (1-3)th mask sheet 237, and a first support stick 234. In this case, because the first mask frame 231 is the same as or similar to that described above, redundant descriptions thereof may not be provided for conciseness.

The (1-1)th mask sheet 232 may include a (1-1)th opening portion 232A. In this case, the (1-1)th mask sheet 232 may be formed as one to cover one area of the opening area. In this case, the (1-1)th mask sheet 232 may be arranged over the first mask frame 231 in a tensioned state in at least one selected from the first direction and the second direction. The (1-1)th mask sheet 232 may be fixed to the first mask frame 231 and the second stick 234-2 in a tensioned state or may be fixed to the first mask frame 231 and the first stick 234-1 in a tensioned state.

The (1-2)th mask sheet 233 may include a (1-2)th opening portion 233A. In this case, the (1-2)th mask sheet 233 may be arranged in another area of the opening area. In this case, the (1-2)th mask sheet 233 may be arranged in the second direction. In this case, a plurality of (1-2)th mask sheets 233 may be arranged in the first direction. For example, each of the (1-2)th mask sheets 233 may extend in the second direction, and the (1-2)th mask sheets 233 may be arranged with each other in the first direction. In the above case, each (1-2)th mask sheet 233 may be fixed to the first mask frame 231 and the first stick 234-1, or may be fixed to the first mask frame 231 and the second stick 234-2.

The (1-3)th mask sheet 237 may be arranged at the first mask frame 231. In this case, the (1-3)th mask sheet 237 may be formed differently from the (1-1)th mask sheet 232 and the (1-2)th mask sheet 233. The (1-3)th mask sheet 237 described above may include a (1-3)th opening portion 237A. In this case, a plurality of (1-3)th opening portions 237A may be provided, and the area of the planar shape of one selected from the plurality of (1-3)th opening portions 237A may be different from the area of the planar shape of another selected from the plurality of (1-3)th opening portions 237A.

At least one selected from the planar shape of the (1-1)th opening portion 232A, the planar shape of the (1-2)th opening portion 233A, and the planar shape of the (1-3)th opening portion 237A described above is not limited thereto and may be formed in various suitable shapes. For example, at least one selected from the planar shape of the (1-1)th opening portion 232A, the planar shape of the (1-2)th opening portion 233A, and the planar shape of the (1-3)th opening portion 237A may have circular, polygonal, and elliptical shapes.

In the above case, all of the (1-1)th opening portion 232A, the (1-2)th opening portion 233A, and the (1-3)th opening portion 237A may correspond to an area of the process substrate MS to form a display area of each display apparatus by deposition on the process substrate MS. For example, one (1-1)th opening portion 232A, one (1-2)th opening portion 233A, and one (1-3)th opening portion 237A may correspond to a display area of each display apparatus.

In the above case, display apparatuses of various suitable shapes and sizes may be manufactured by one process substrate MS.

In the above case, each of the (1-1)th opening portion 232A, the (1-2)th opening portion 233A, and the (1-3)th opening portion 237A may be utilized (e.g., used) to manufacture the display apparatus illustrated in FIG. 3 or the display apparatus illustrated in FIG. 6, as described above. In this case, as described above, depending on the type (e.g., kind) of the display apparatus, the organic emission layer may be formed in a pattern shape in the display area of the display apparatus or may be formed to cover the entire display area with one color.

Figure 28:
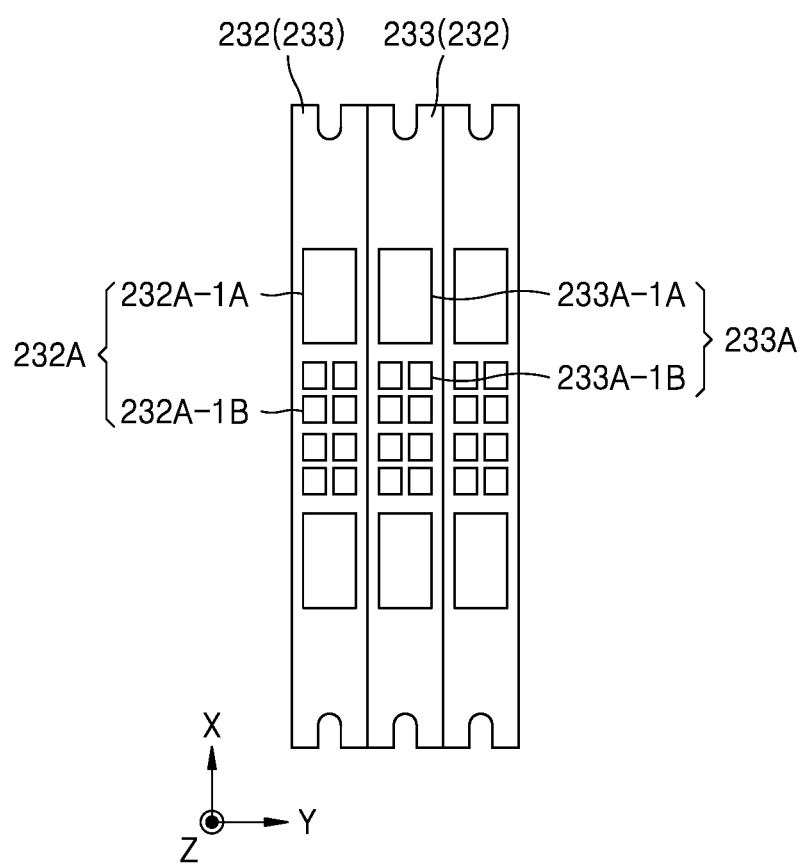
FIG. 28 is a plan view illustrating a portion of a first mask sheet of a display apparatus manufacturing apparatus according to other embodiments.

FIG. 28 is a plan view illustrating a portion of a first mask sheet of a display apparatus manufacturing apparatus according to other embodiments.

Referring to FIG. 28, the (1-1)th mask sheet 232 and the (1-2)th mask sheet 233 may be formed to be the same as each other. For example, a plurality of (1-1)th opening portions 232A of the (1-1)th mask sheet 232 are provided, and one of the plurality of (1-1)th opening portions 232A may have a different shape than another of the plurality of (1-1)th opening portions 232A.

The (1-2)th mask sheet 233 may include a (1-2)th opening portion 233A. In this case, a plurality of (1-2)th opening portions 233A may be provided, and some of the plurality of (1-2)th opening portions 233A may have a different shape than others of the plurality of (1-2)th opening portions 233A, like the (1-1)th opening portion 232A. In this case, the arrangement of (1-1)th opening portions 232A and the arrangement of (1-2)th opening portions 233A may be the same as each other.

In the above case, a (1-1A)th opening portion 232A-1A among the (1-1)th opening portions 232A and a (1-2A)th opening portion 233A-1A of the (1-2)th opening portions 233A, each of which has a larger planar area, and a (1-1B)th opening portion 232A-1B among the (1-2)th opening portions 233A and a (1-2B)th opening portion 233A-1B among the (1-2)th opening portions 233A, each of which has a smaller planar area, may be alternately arranged in the (1-1)th mask sheet 232 and the (1-2)th mask sheet 233. For example, the (1-1A)th opening portion 232A-1A and the (1-2A)th opening portion 233A-1A may be larger in planar area than the (1-1B)th opening portion 232A-1B and the (1-2B)th opening portion 233A-1B, respectively.

As described above, each of the opening portions described above may be utilized (e.g., used) to form the lower auxiliary layer of the display apparatus illustrated in FIG. 3 or the display apparatus illustrated in FIG. 6. In this case, as described above, depending on the type (e.g., kind) of the display apparatus, the organic emission layer may be formed in a pattern shape in the display area of the display apparatus or may be formed to cover the entire display area with one color.

Figure 29:
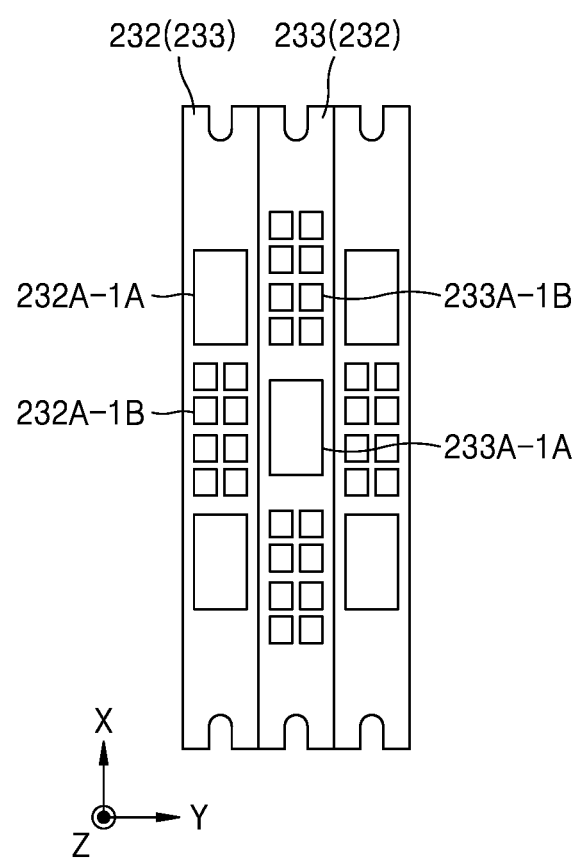
FIG. 29 is a plan view illustrating a portion of a first mask sheet of a display apparatus manufacturing apparatus according to other embodiments.

FIG. 29 is a plan view illustrating a portion of a first mask sheet of a display apparatus manufacturing apparatus according to other embodiments.

Referring to FIG. 29, the (1-1)th mask sheet 232 and the (1-2)th mask sheet 233 may include opening portions having different planar shapes as described in FIG. 28.

For example, the (1-1)th mask sheet 232 may include a (1-1A)th opening portion 232A-1A and a (1-1B)th opening portion 232A-1B. In this case, the (1-1A)th opening portion 232A-1A may have a different size than the (1-1B)th opening portion 232A-1B. In this case, a plurality of (1-1B)th opening portions 232A-1B may form a group, and the group may be arranged to alternate with the (1-1A)th opening portion 232A-1A. In this case, one group formed by a plurality of (1-1B)th opening portions 232A-1B may be arranged in an area similar to the planar shape of the (1-1A)th opening portion 232A-1A.

In the above case, a (1-2A)th opening portion 233A-1A may be arranged next the plurality of (1-1B)th opening portions 232A-1B. On the other hand, a (1-2B)th opening portion 233A-1B may be arranged next the (1-1A)th opening portion 232A-1A.

As described above, each of the opening portions described above may be utilized (e.g., used) to form the lower auxiliary layer of the display apparatus illustrated in FIG. 3 or the display apparatus illustrated in FIG. 6. In this case, as described above, depending on the type (e.g., kind) of the display apparatus, the organic emission layer may be formed in a pattern shape in the display area of the display apparatus or may be formed to cover the entire display area with one color.

Figure 30:
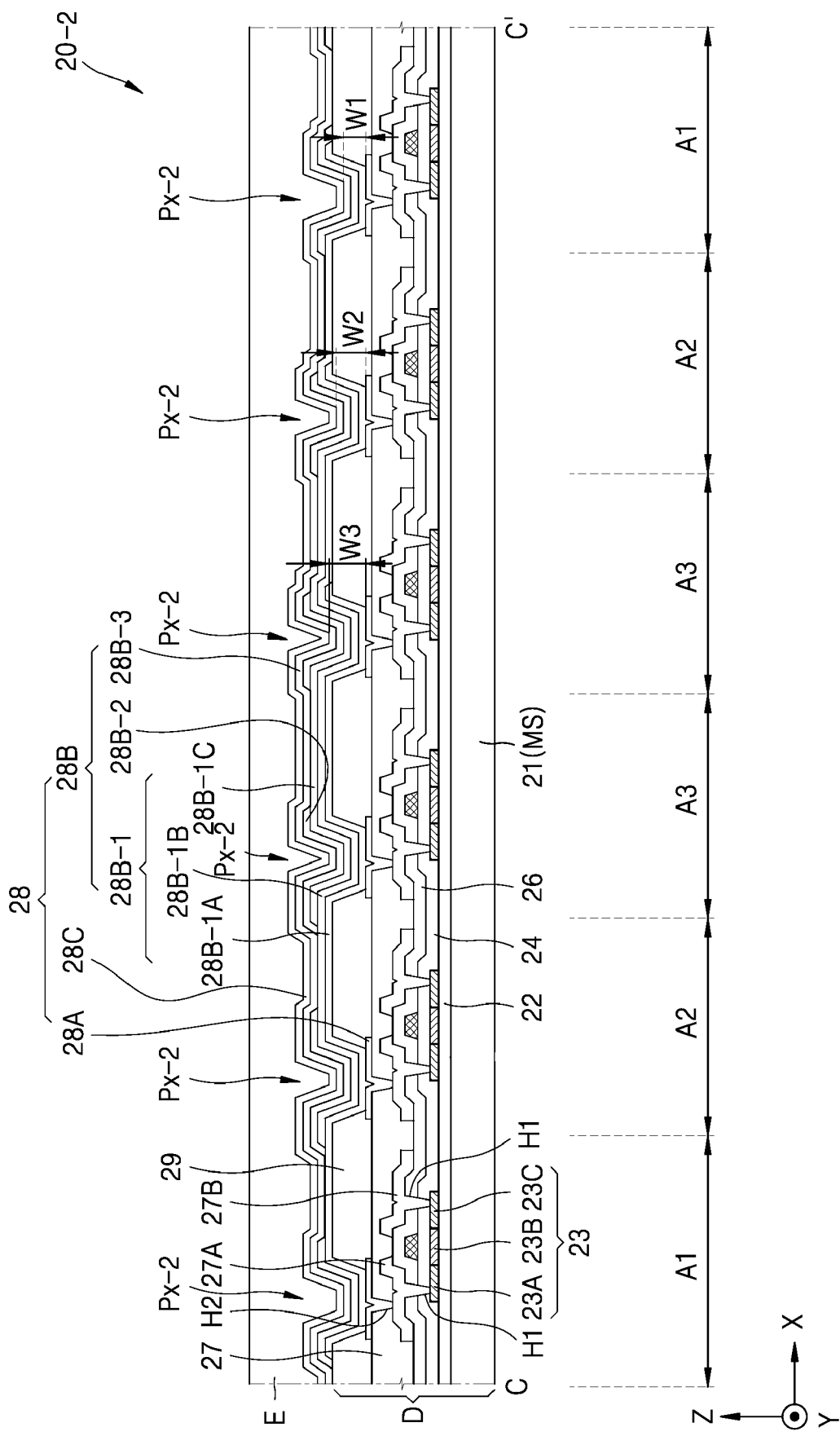
FIG. 30 is a cross-sectional view illustrating another embodiment of the display apparatus of the light irradiation apparatus illustrated in FIG. 5.

FIG. 30 is a cross-sectional view illustrating another embodiment of the display apparatus of the light irradiation apparatus illustrated in FIG. 5.

Referring to FIG. 30, a display apparatus 20-2 may include a substrate 21, a buffer layer 22, an active layer 23, a gate insulating layer 24, an interlayer insulating layer 26, a source electrode 27A, a drain electrode 27B, a passivation layer 27, an organic light emitting device 28, a pixel definition layer 29, and a thin film encapsulation layer E. In this case, because the buffer layer 22, the active layer 23, the gate insulating layer 24, the interlayer insulating layer 26, the source electrode 27A, the drain electrode 27B, the passivation layer 27, the pixel definition layer 29, and the thin film encapsulation layer E are the same as or similar to those described in FIG. 7, redundant descriptions thereof may not be provided for conciseness.

The organic light emitting device 28 may include a pixel electrode 28A, an intermediate layer 28B, and an opposite electrode 28C. In this case, because the pixel electrode 28A and the opposite electrode 28C are the same as or similar to those described in FIG. 7, redundant descriptions thereof may not be provided for conciseness.

The intermediate layer 28B may include an organic emission layer 28B-2 and an auxiliary layer. In this case, the auxiliary layer may include at least one selected from a lower auxiliary layer 28B-1 and an upper auxiliary layer 28B-3. However, hereinafter, for convenience of description, a more detailed description will be given mainly of a case where the auxiliary layer includes a lower auxiliary layer 28B-1 and an upper auxiliary layer 28B-3.

The lower auxiliary layer 28B-1 described above may include a first lower auxiliary layer 28B-1A, a second lower auxiliary layer 28B-1B, and a third lower auxiliary layer 28B-1C. In this case, the first lower auxiliary layer 28B-1A, the second lower auxiliary layer 28B-1B, and the third lower auxiliary layer 28B-1C may be the same as or similar to those described in FIG. 7.

The organic emission layer 28B-2 may be arranged to correspond to the pixel arranged in each area. For example, a plurality of organic emission layers 28B-2 may be provided to be apart from each other. In this case, each organic emission layer 28B-2 may be arranged to correspond to each pixel Px-2. In this case, the organic emission layers 28B-2 may be arranged apart from each other at one surface of the display substrate D and may be arranged in a certain pattern.

In order to form the organic emission layer 28B-2 described above, the (2-1)th emission layer opening portion 332A-2 illustrated in FIG. 18 may be arranged at the (2-1)th emission layer mask sheet 332-2. The deposition material that has passed through the (2-1)th emission layer opening portion 332A-2 may be deposited on the process substrate MS to correspond to each pixel Px-2 to form the organic emission layer 28B-2.

The upper auxiliary layer 28B-3 may be arranged over the organic emission layer 28B-2. In this case, the upper auxiliary layer 28B-3 may be integrally formed and arranged over all the pixels Px-2. The upper auxiliary layer 28B-3 may include at least one selected from an electron injection layer and an electron transport layer.

In the above case, the thickness of the intermediate layer 28B of each pixel Px-2 may be adjusted with the thickness of the lower auxiliary layer 28B-1 arranged in each pixel Px-2. In this case, because a method of adjusting the thickness of the lower auxiliary layer 28B-1 is the same as or similar to that illustrated in FIGS. 16A to 16C, redundant descriptions thereof may not be provided for conciseness.

Thus, the display apparatus 20-2 may emit light of different wavelengths to the outside while emitting the same color.

Moreover, the display apparatus 20-2 described above may operate in various suitable ways. For example, the display apparatus 20-2 may emit light of the pixels Px-2 arranged in at least one selected from the first area A1, the second area A2, and the third area A3 arranged in one pixel group.

For example, the display apparatus 20-2 may emit light having one wavelength to the outside by emitting light of the pixel Px-2 arranged only in the first area A1, the second area A2, or the third area A3.

In other embodiments, the display apparatus 20-2 may emit light having at least two wavelengths by emitting light of the pixels Px-2 arranged in at least two of the first area A1, the second area A2, and the third area A3.

In other embodiments, the display apparatus 20-2 may emit lights of different wavelengths at different times by emitting lights of the pixels Px-2 respectively arranged in the first area A1, the second area A2, and the third area A3, at the respective times.

Thus, the display apparatus 20-2 may emit (e.g., freely emit) light of various suitable wavelengths, thereby providing light having various suitable effects to the user.

Moreover, although it has been described above that the display apparatus 20-2 includes a thin film encapsulation layer E, the present embodiments are not limited thereto. For example, the display apparatus 20-2 may include a separate encapsulation substrate facing (e.g., overlapping) the substrate 21, and a sealing unit arranged between the substrate 21 and the encapsulation substrate to couple (e.g., attach) the substrate 21 to the encapsulation substrate to protect the organic light emitting device 28 therein from the outside.

Figure 31:
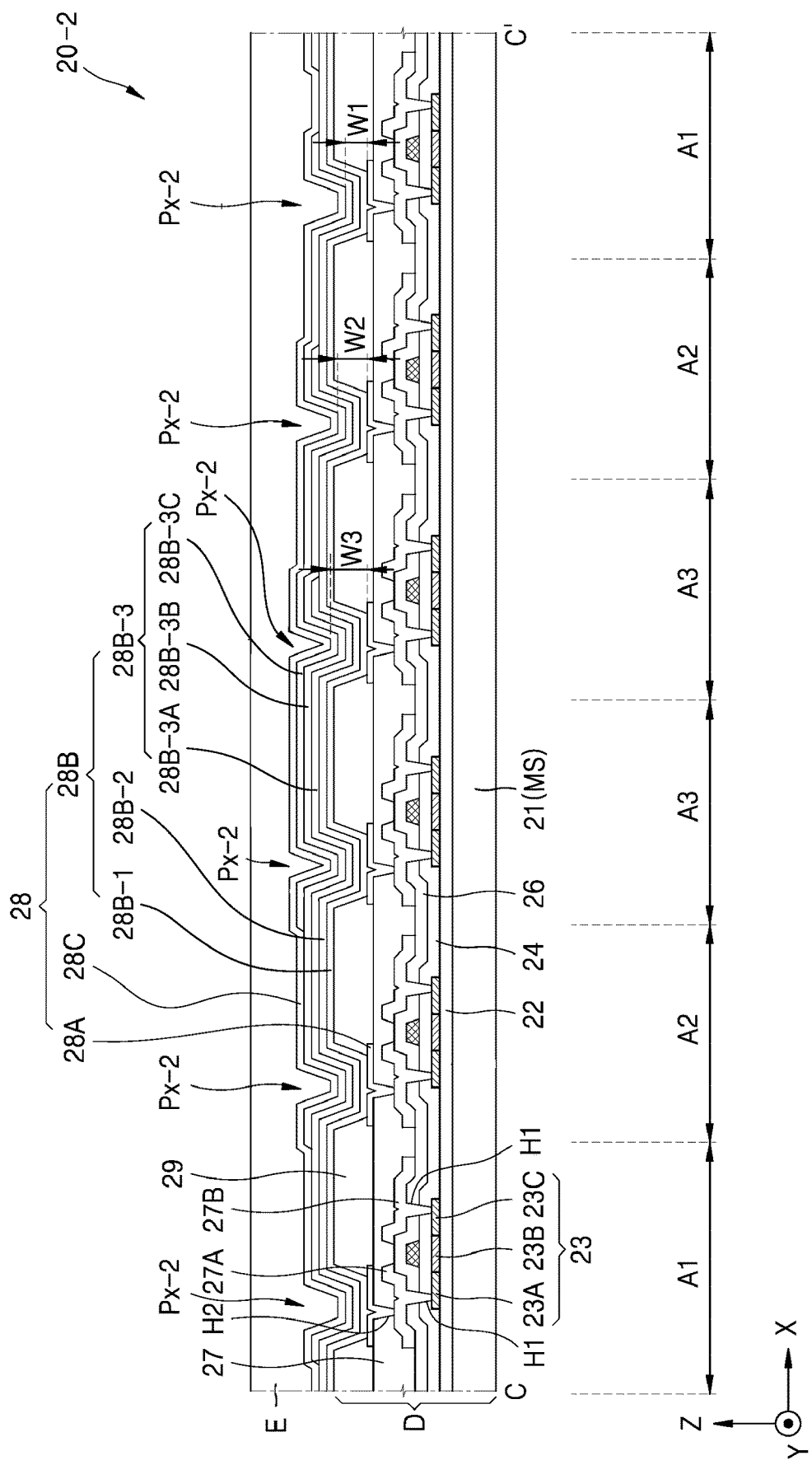
FIG. 31 is a cross-sectional view illustrating another embodiment of the display apparatus of the light irradiation apparatus illustrated in FIG. 5.

FIG. 31 is a cross-sectional view illustrating another embodiment of the display apparatus of the light irradiation apparatus illustrated in FIG. 5.

Referring to FIG. 31, a display apparatus 20-2 may include a substrate 21, a buffer layer 22, an active layer 23, a gate insulating layer 24, an interlayer insulating layer 26, a source electrode 27A, a drain electrode 27B, a passivation layer 27, an organic light emitting device 28, a pixel definition layer 29, and a thin film encapsulation layer E. In this case, because the buffer layer 22, the active layer 23, the gate insulating layer 24, the interlayer insulating layer 26, the source electrode 27A, the drain electrode 27B, the passivation layer 27, the pixel definition layer 29, and the thin film encapsulation layer E are the same as or similar to those described in FIG. 7, redundant descriptions thereof may not be provided for conciseness.

The organic light emitting device 28 may include a pixel electrode 28A, an intermediate layer 28B, and an opposite electrode 28C. In this case, because the pixel electrode 28A and the opposite electrode 28C are the same as or similar to those described in FIG. 7, redundant descriptions thereof may not be provided for conciseness.

The intermediate layer 28B may include an organic emission layer 28B-2 and an auxiliary layer. In this case, the auxiliary layer may include at least one selected from a lower auxiliary layer 28B-1 and an upper auxiliary layer 28B-3. However, hereinafter, for convenience of description, a more detailed description will be given mainly of a case where the auxiliary layer includes a lower auxiliary layer 28B-1 and an upper auxiliary layer 28B-3.

The lower auxiliary layer 28B-1 may be arranged in all the pixels Px-2. In this case, the lower auxiliary layer 28B-1 may include at least one selected from a hole injection layer and a hole transport layer. When the lower auxiliary layer 28B-1 includes both the hole injection layer and the hole transport layer, the hole injection layer and the hole transport layer may be sequentially stacked over the pixel electrode 28A and the pixel definition layer 29. In this case, the hole injection layer and the hole transport layer may be shared by all the pixels Px-2. Hereinafter, for convenience of description, a more detailed description will be given mainly of a case where the lower auxiliary layer 28B-1 includes the hole transport layer.

The organic emission layer 28B-2 may be arranged over the lower auxiliary layer 28B-1. In this case, the organic emission layer 28B-2 may be integrally arranged over all the pixels Px-2 as illustrated in FIG. 31. In other embodiments, the organic emission layers 28B-2 may be arranged apart from each other to correspond to the respective pixels Px-2 as illustrated in FIG. 30. However, hereinafter, for convenience of description, a more detailed description will be given mainly of a case where the organic emission layer 28B-2 is integrally formed to be shared by all the pixels Px-2.

The upper auxiliary layer 28B-3 may be arranged over the organic emission layer 28B-2. In this case, the upper auxiliary layer 28B-3 may include a first upper auxiliary layer 28B-3A, a second upper auxiliary layer 28B-3B, and a third upper auxiliary layer 28B-3C. In this case, each of the first upper auxiliary layer 28B-3A, the second upper auxiliary layer 28B-3B, and the third upper auxiliary layer 28B-3C may include at least one selected from an electron injection layer and an electron transport layer. For example, the first upper auxiliary layer 28B-3A, the second upper auxiliary layer 28B-3B, and the third upper auxiliary layer 28B-3C may include (e.g., be) the same material or different materials.

The first upper auxiliary layer 28B-3A, the second upper auxiliary layer 28B-3B, and the third upper auxiliary layer 28B-3C may be stacked differently over the pixel Px-2 arranged in each area. For example, in the case of the pixel Px-2 arranged in the first area A1 arranged on the left side of FIG. 31, only the first upper auxiliary layer 28B-3A may be arranged over the organic emission layer 28B-2. In the case of the pixel Px-2 arranged in the second area A2 arranged on the left side of FIG. 31, the first upper auxiliary layer 28B-3A and the second upper auxiliary layer 28B-3B may be sequentially arranged over the organic emission layer 28B-2. In the case of each of the pixels Px-2 arranged in two third areas A3 arranged at the center of FIG. 31, the first upper auxiliary layer 28B-3A, the second upper auxiliary layer 28B-3B, and the third upper auxiliary layer 28B-3C may be sequentially arranged over the organic emission layer 28B-2. In the case of the pixel Px-2 arranged in the second area A2 arranged on the right side of FIG. 31, the second upper auxiliary layer 28B-3B and the third upper auxiliary layer 28B-3C may be arranged over the organic emission layer 28B-2. In the case of the pixel Px-2 arranged in the first area A1 arranged on the right side of FIG. 31, only the third upper auxiliary layer 28B-3C may be arranged over the organic emission layer 28B-2.

In the above case, the thickness of the intermediate layer 28B may be determined according to the number of upper auxiliary layers 28B-3 arranged over the organic emission layer 28B-2. For example, when the number of upper auxiliary layers 28B-3 arranged over the organic emission layer 28B-2 of each pixel Px-2 is greater than the number of upper auxiliary layers 28B-3 arranged over the organic emission layer 28B-2 of another pixel Px-2, the thickness of the intermediate layer 28B of the pixel Px-2 having the greater number of upper auxiliary layers 28B-3 may be greater than the thickness of the intermediate layer 28B of other pixel Px-2.

The arrangement and number of upper auxiliary layers 28B-3 described above may be similar to the arrangement and number of lower auxiliary layers 28B-1 described in FIG. 7. For example, the first upper auxiliary layer 28B-3A and the second upper auxiliary layer 28B-3B may not completely overlap each other in the plan view, and the second upper auxiliary layer 28B-3B and the third upper auxiliary layer 28B-3C may not completely overlap each other in the plan view. In this case, a method of forming the upper auxiliary layer 28B-3 illustrated in FIG. 31 may be similar to the method of forming the lower auxiliary layer 28B-1 illustrated in FIGS. 16A to 16C. For example, in the case of forming the upper auxiliary layer 28B-3 illustrated in FIG. 31, the first mask assembly 230 illustrated in FIGS. 9 and 10 may be utilized (e.g., used) as the third mask assembly 430.

In the above case, because there are at least two pixels Px-2 having different thicknesses of the intermediate layer 28B, the display apparatus 20-2 may emit light of different wavelengths while emitting the same color.

Moreover, the display apparatus 20-2 described above may operate in various suitable ways. For example, the display apparatus 20-2 may emit light of the pixels arranged in at least one selected from the first area A1, the second area A2, and the third area A3 arranged in one pixel group.

For example, the display apparatus 20-2 may emit light having one wavelength to the outside by emitting light of the pixel Px-2 arranged only in the first area A1, the second area A2, or the third area A3.

In other embodiments, the display apparatus 20-2 may emit light having at least two wavelengths by emitting light of the pixels Px-2 arranged in at least two of the first area A1, the second area A2, and the third area A3.

In other embodiments, the display apparatus 20-2 may emit lights of different wavelengths at different times by emitting lights of the pixels Px-2 respectively arranged in the first area A1, the second area A2, and the third area A3, at the respective times.

Thus, the display apparatus 20-2 may emit (e.g., freely emit) light of various suitable wavelengths, thereby providing light having various suitable effects to the user.

Moreover, although it has been described above that the display apparatus 20-2 includes a thin film encapsulation layer E, the present embodiments are not limited thereto. For example, the display apparatus 20-2 may include a separate encapsulation substrate facing (e.g., overlapping) the substrate 21, and a sealing unit arranged between the substrate 21 and the encapsulation substrate to couple (e.g., attach) the substrate 21 to the encapsulation substrate to protect the organic light emitting device 28 therein from the outside.

By the display apparatus manufacturing apparatus and method according to the embodiments, display apparatuses having various suitable purposes may be rapidly and accurately manufactured.

By the display apparatus manufacturing apparatus and method according to the embodiments, display apparatuses may be rapidly manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various suitable changes in form and details may be made therein without departing from the spirit and scope as defined by the following claims and equivalents thereof.

What is claimed is:

1. A mask assembly comprising:
   a mask frame having an opening area;
   a first mask sheet arranged to cover a first opening area of the opening area and having a first opening portion;
   a second mask sheet arranged to cover a second opening area of the opening area and having a plurality of second opening portions; and
   a stick arranged at the mask frame to divide the second opening area into a plurality of third opening areas,
   wherein the first opening portion is different in size than one second opening portion of the plurality of second opening portions, and
   wherein:
      the stick comprises a first stick extending in a first direction and a second stick extending in a second direction and coupled to the first stick, and the first stick comprises a coupling unit into which a coupling member coupling with an end of the second stick is inserted; or
      the mask frame comprises a frame coupling unit into which a coupling member coupling with an end of the stick is inserted.

2. The mask assembly of claim 1, wherein the stick comprises the first stick extending in the first direction; and the second stick extending in the second direction and coupled to the first stick, and
   wherein:
      the first stick comprises the coupling unit into which the coupling member coupling with the end of the second stick is inserted; or
      the mask frame comprises the frame coupling unit into which the coupling member coupling with an end of the first stick or the second stick is inserted.

3. The mask assembly of claim 2, wherein the second stick comprises a plurality of second sticks, and
   one second stick of the plurality of second sticks is different in width than another second stick of the plurality of second sticks.

4. The mask assembly of claim 2, wherein the second stick comprises a plurality of second sticks, and
   the plurality of second sticks are arranged to be symmetrical to each other with respect to one second stick of the plurality of second sticks.

5. The mask assembly of claim 2, wherein the first stick comprises the coupling unit into which the coupling member coupling with the end of the second stick is inserted.

6. The mask assembly of claim 1, wherein the mask frame comprises the frame coupling unit into which the coupling member coupling with the end of the stick is inserted.

7. The mask assembly of claim 1, wherein a cross-sectional shape of the stick normal to a lengthwise direction of the stick is triangular.

8. The mask assembly of claim 1, wherein the second mask sheet further has a first opening portion, and the first opening portions respectively of the first and second mask sheets are arranged at same positions of the first and second mask sheets.

9. A display apparatus manufacturing apparatus comprising:
   the mask assembly of claim 1; and
   a deposition source arranged to face the mask assembly to supply a deposition material to a display substrate.

10. A mask assembly comprising:
    a mask frame having an opening area;
    a first mask sheet arranged to cover a first opening area of the opening area and having a plurality of first opening portions defining all of the opening portions in the first mask sheet; and
    a second mask sheet arranged to cover a second opening area of the opening area and having one or more opening portions defining all of the opening portion(s) in the second mask sheet,
    a layout of the all of the opening portions in the first mask sheet being different from a layout of the all of the opening portion(s) in the second mask sheet, and
    each of the one or more opening portions in the second mask sheet being different in size from each of the plurality of first opening portions in the first mask sheet.

11. A mask assembly comprising:
    a mask frame having an opening area; and
    a plurality of mask sheets arranged to cover the opening area, two mask sheets of the plurality of mask sheets being directly attached to the mask frame and arranged to respectively cover two portions of a single opening in the mask frame,
    wherein each of the plurality of mask sheets has a first opening portion, and the first opening portions of adjacent mask sheets of the plurality of mask sheets are arranged at different positions of the adjacent mask sheets, and wherein one mask sheet of the plurality of mask sheets further has a second opening portion, and the first opening portion of the one mask sheet is different in size than the second opening portion of the one mask sheet.

12. A display apparatus manufacturing method comprising:

arranging a display substrate and a mask assembly;

aligning the display substrate and the mask assembly; and depositing a deposition material through a first opening portion of the mask assembly onto a first plane area arranged in a first area of the display substrate and through a second opening portion of the mask assembly onto a second plane area arranged in a second area of the display substrate, or depositing the deposition material onto the first area and not the second area, wherein the first plane area is different in area than the second plane area, and wherein the mask assembly comprises:

a mask frame;

a stick arranged at the mask frame to divide an opening area of the mask frame into a plurality of opening areas; and a mask sheet arranged at the mask frame, and wherein the method further comprises:

depositing the deposition material onto the display substrate after moving one selected from the display substrate and the mask assembly in one direction with respect to another of the display substrate and the mask assembly; or blocking the deposition material from being deposited onto the second area when the deposition material is deposited onto the first area; or forming an emission layer to emit at least two colors, in the first area, and forming an emission layer to emit a single color, in the second area.

13. The display apparatus manufacturing method of claim 12, further comprising the depositing the deposition material onto the display substrate after moving the one selected from the display substrate and the mask assembly in the one direction with respect to the other of the display substrate and the mask assembly.

14. The display apparatus manufacturing method of claim 12, further comprising the blocking the deposition material from being deposited onto the second area when the deposition material is deposited onto the first area.

15. The display apparatus manufacturing method of claim 12, further comprising the forming the emission layer to emit the at least two colors, in the first area, and forming the emission layer to emit a single color, in the second area.

16. The display apparatus manufacturing method of claim 12, wherein the mask sheet comprises a plurality of mask sheets, and one mask sheet of the plurality of mask sheets having the first opening portion is arranged to be adjacent to another one of the plurality of mask sheets having the second opening portion.

17. The display apparatus manufacturing method of claim 12, wherein the first opening portion and the second opening portion are arranged in the mask sheet.

18. The display apparatus manufacturing method of claim 12, wherein the stick comprises:

a first stick extending in a first direction; and a second stick extending in a second direction and coupled to the first stick.

19. The display apparatus manufacturing method of claim 12, wherein a cross-sectional shape of the stick normal to a lengthwise direction of the stick is triangular.

* * * * *